United States Patent
Baek et al.

(10) Patent No.: US 10,868,038 B2
(45) Date of Patent: Dec. 15, 2020

(54) MEMORY DEVICES

(71) Applicant: SAMSUNG ELECTRONICS CO., LTD., Suwon-si (KR)

(72) Inventors: Seok Cheon Baek, Hwaseong-si (KR); Young Woo Kim, Hwaseong-si (KR); Dong Sik Lee, Osan-si (KR); Min Yong Lee, Incheon (KR); Woong Seop Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/506,609

(22) Filed: Jul. 9, 2019

(65) Prior Publication Data
US 2019/0333935 A1 Oct. 31, 2019

Related U.S. Application Data

(63) Continuation of application No. 16/162,720, filed on Oct. 17, 2018, now Pat. No. 10,373,975, which is a
(Continued)

(30) Foreign Application Priority Data

Dec. 24, 2015 (KR) .................. 10-2015-0186005

(51) Int. Cl.
H01L 27/11582 (2017.01)
H01L 27/11565 (2017.01)
(Continued)

(52) U.S. Cl.
CPC ...... *H01L 27/11582* (2013.01); *H01L 23/528* (2013.01); *H01L 23/5226* (2013.01); *H01L 27/1157* (2013.01); *H01L 27/11521* (2013.01); *H01L 27/11526* (2013.01); *H01L 27/11556* (2013.01); *H01L 27/11565* (2013.01);
(Continued)

(58) Field of Classification Search
None
See application file for complete search history.

(56) References Cited

U.S. PATENT DOCUMENTS 8,836,020 B2  9/2014 Lim et al.
8,971,118 B2  3/2015 Jin et al.
(Continued)

FOREIGN PATENT DOCUMENTS

KR  2013-0005432 A  1/2013

*Primary Examiner* — Cory W Eskridge
(74) *Attorney, Agent, or Firm* — Sughrue Mion, PLLC

(57) ABSTRACT

A memory device may include multiple channel regions extending in a direction perpendicular to an upper surface of a substrate, a plurality of gate electrode layers and a plurality of insulating layers stacked on the substrate to be adjacent at least a portion of the plurality of channel regions, an interlayer insulating layer disposed on the plurality of gate electrode layers, a plurality of cell contact plugs passing through the interlayer insulating layer. Each of the plurality of cell contacts is connected to each of the plurality of gate electrode layers. A vertical insulating layer extends from the interlayer insulating layer disposed between the plurality of channel regions and the plurality of cell contact plugs and has a portion surrounded by at least one of the plurality of gate electrode layers.

17 Claims, 54 Drawing Sheets

Related U.S. Application Data continuation of application No. 15/224,238, filed on Jul. 29, 2016, now Pat. No. 10,128,263.

(51) Int. Cl.
| | |
|---|---|
| *H01L 27/1157* | (2017.01) |
| *H01L 27/11575* | (2017.01) |
| *H01L 23/522* | (2006.01) |
| *H01L 23/528* | (2006.01) |
| *H01L 27/11521* | (2017.01) |
| *H01L 27/11526* | (2017.01) |
| *H01L 27/11556* | (2017.01) |
| *H01L 27/11568* | (2017.01) |
| *H01L 27/11573* | (2017.01) |
| *H01L 29/06* | (2006.01) |

(52) U.S. Cl.
CPC .. *H01L 27/11568* (2013.01); *H01L 27/11573* (2013.01); *H01L 27/11575* (2013.01); *H01L 29/0649* (2013.01)

(56) References Cited

U.S. PATENT DOCUMENTS

| | | | |
|---|---|---|---|
| 9,985,046 B2* | 5/2018 | Lu | H01L 22/12 |
| 2009/0039407 A1 | 2/2009 | Vora | |
| 2013/0043509 A1 | 2/2013 | Cho et al. | |
| 2015/0214242 A1 | 7/2015 | Lee | |
| 2015/0263029 A1* | 9/2015 | Kim | H01L 27/11582 257/314 |
| 2017/0103993 A1* | 4/2017 | Lee | H01L 23/5226 |
| 2017/0358594 A1 | 12/2017 | Lu et al. | |

* cited by examiner

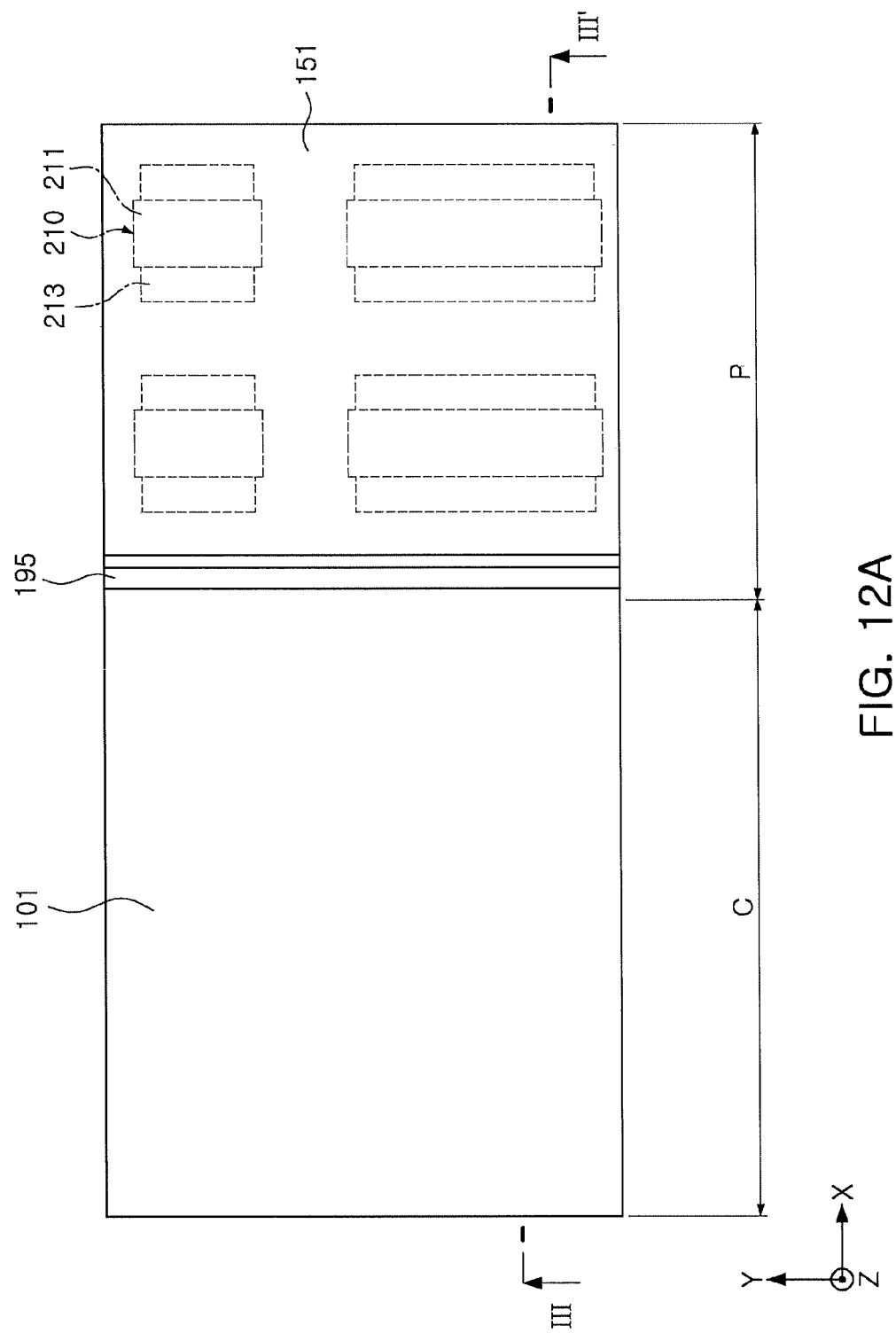

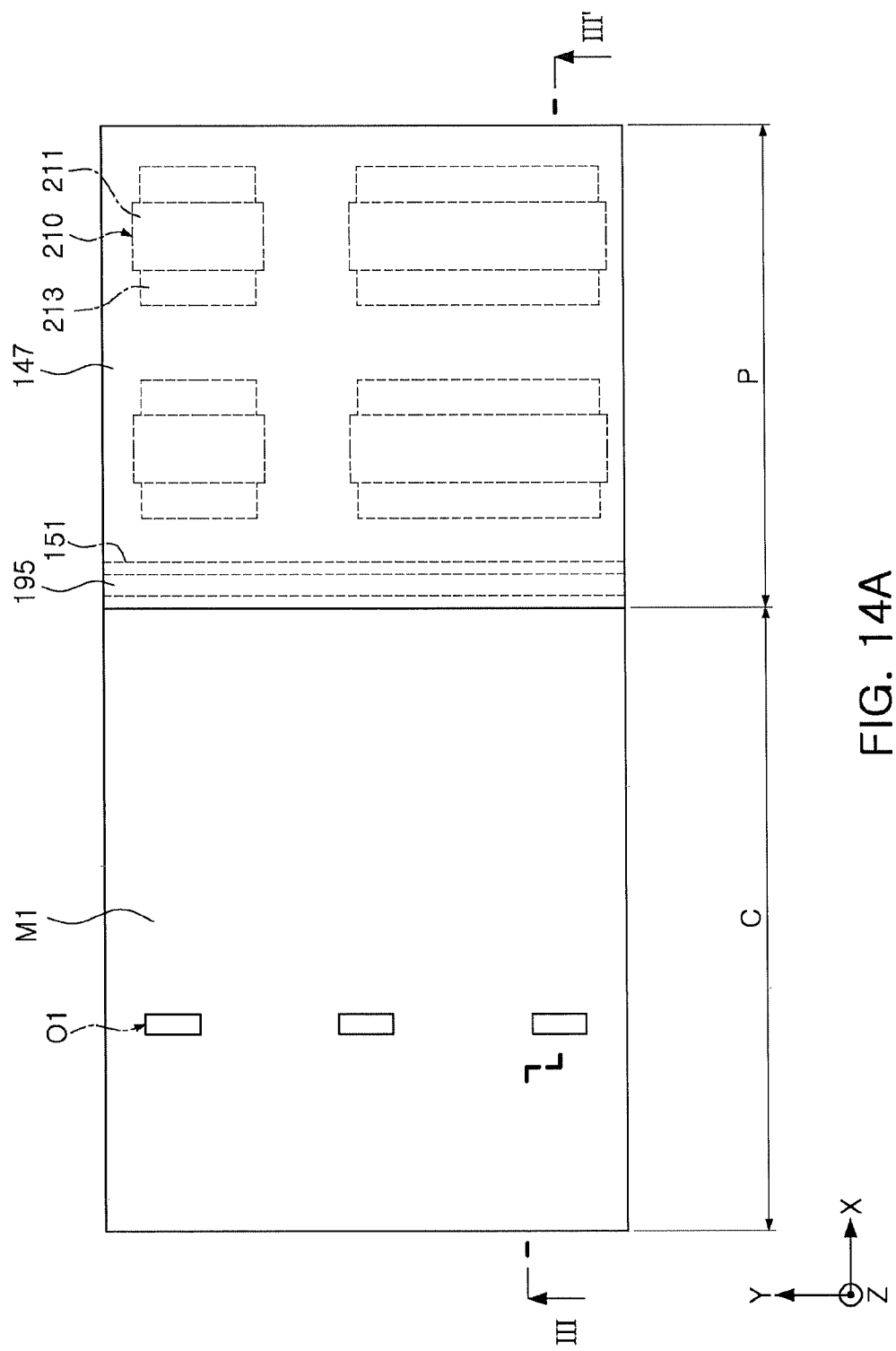

MEMORY DEVICES

CROSS-REFERENCE TO RELATED APPLICATIONS

This application is a continuation of U.S. patent application Ser. No. 16/162,720, filed Oct. 17, 2018, which is a continuation of U.S. patent application Ser. No. 15/224,238, filed Jul. 29, 2016 (now U.S. Pat. No. 10,128,263), which claims benefit of priority to Korean Patent Application No. 10-2015-0186005, filed Dec. 24, 2015 in the Korean Intellectual Property Office, the disclosures of which are hereby incorporated herein by reference in their entireties.

FIELD

The present inventive concept relates to memory devices.

BACKGROUND

Electronics are increasingly required to process high-capacity data while being gradually reduced in volume. Accordingly, an increase in a degree of integration of semiconductor memory elements used for electronics is required. As one method of increasing a degree of integration of semiconductor memory elements, a memory device having a vertical transistor structure in lieu of a conventional planar transistor structure has been proposed.

SUMMARY

An aspect of the present inventive concept may provide memory devices, which may prevent the occurrence of defects by accurately measuring a location of a pad region when the pad region connected to a contact plug is formed.

According to an aspect of the present inventive concept, memory devices may include a plurality of channel regions extending in a direction perpendicular to an upper surface of a substrate, a plurality of gate electrode layers and a plurality of insulating layers stacked on the substrate to be adjacent to at least a portion of the plurality of channel regions, an interlayer insulating layer disposed on the plurality of gate electrode layers, a plurality of cell contact plugs passing through the interlayer insulating layer, wherein each of the plurality of cell contacts is connected to each of the plurality of gate electrode layers, and a vertical insulating layer extending from the interlayer insulating layer to be disposed between the plurality of channel regions and the plurality of cell contact plugs, and having a portion surrounded by at least one of the plurality of gate electrode layers.

According to an aspect of the present inventive concept, memory devices may include a first region having a plurality of channel regions extending in a direction perpendicular to an upper surface of a substrate, a plurality of gate electrode layers disposed to be adjacent the plurality of channel regions, and gate insulating films disposed between the plurality of channel regions and the plurality of gate electrode layers, a second region disposed to be adjacent the first region, and having a plurality of cell contact plugs connected to the plurality of gate electrode layers extending in a first direction parallel to the upper surface of the substrate to have different lengths, respectively, and a vertical insulating layer disposed to be adjacent a border between the first region and the second region, and having a portion adjacent at least one of the plurality of gate electrode layers in a direction parallel to the upper surface of the substrate.

According to an aspect of the present inventive concept, memory device may include a substrate, a plurality of channel regions extending in a direction perpendicular to an upper surface of a substrate, a gate structure stacked on the substrate to be adjacent at least a portion of the plurality of channel regions, and having a plurality of gate electrode layers and a plurality of insulating layers extending in a first direction to have different lengths, respectively, a plurality of isolation insulating layers dividing the gate structure into a plurality of unit regions, and a vertical insulating layer disposed between an end of the plurality of gate electrode layers in the first direction and the plurality of channel regions to pass through an uppermost insulating layer of the plurality of insulating layers, and provided in at least a portion of the plurality of unit regions.

Some embodiments of the present inventive concept are directed to memory devices that may include a plurality of channel regions in a first region of a substrate and that extend in a direction that is perpendicular to an upper surface of a substrate, a plurality of gate electrode layers and a plurality of insulating layers stacked on the substrate, wherein the plurality of gate electrode layers are adjacent at least a portion of the plurality of channel regions, and a plurality of cell contact plugs, wherein each of the plurality of cell contacts is connected to each of the plurality of gate electrode layers. Devices may include a second region of the substrate that is adjacent the first region of the substrate, a plurality of cell contact plugs connected to the plurality of gate electrode layers that extend in a first direction that is parallel to the upper surface of the substrate, and a vertical insulating layer that is between the plurality of channel regions and the plurality of cell contact plugs and that includes a portion that is adjacent a border between the first region and the second region.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
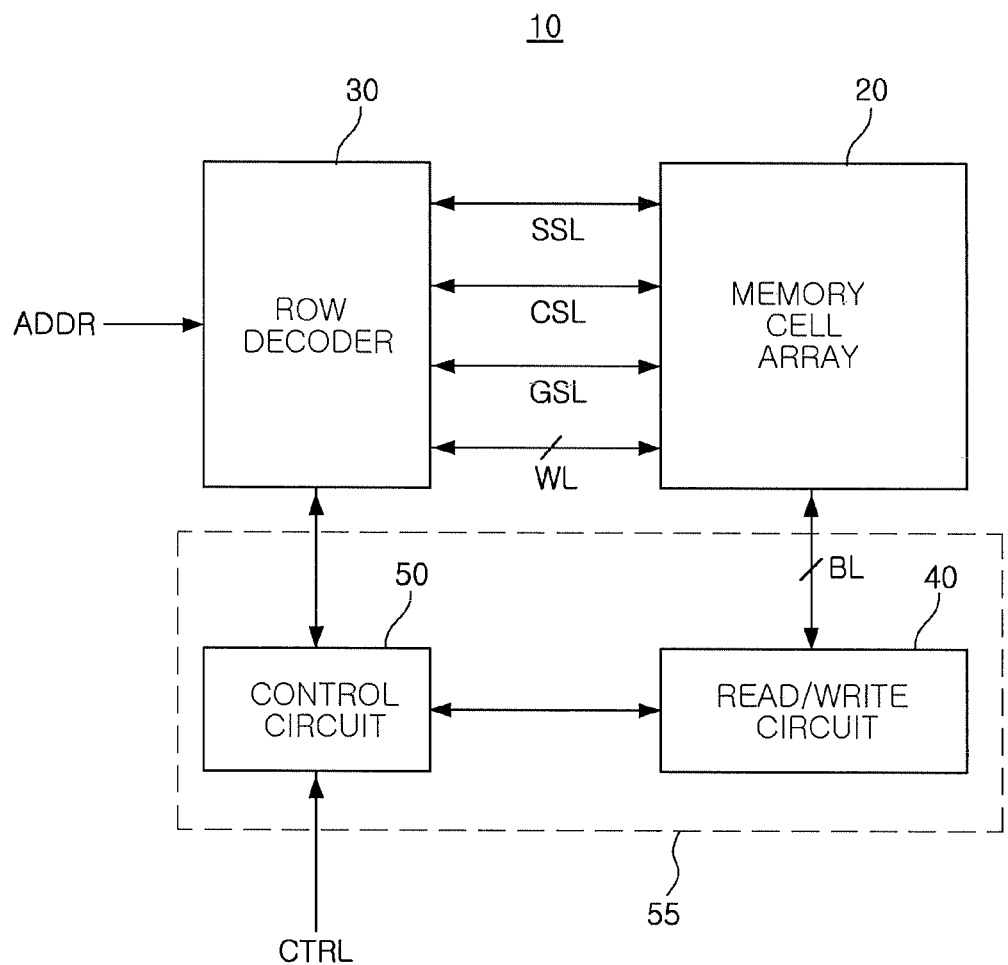
FIG. 1 is a schematic block diagram of a memory device according to some embodiments of the present inventive concept.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present inventive concept is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, and may include changes in shapes resulting from manufacturing errors. The following embodiments may also be constituted by one or a combination thereof.

The contents of the present inventive concept described below may have a variety of configurations and only a required configuration is proposed herein, but the present inventive concept is not limited thereto.

FIG. 1 is a schematic block diagram of a memory device according to some embodiments of the present inventive concept.

Referring to FIG. 1, a semiconductor device 10 according to some embodiments of the present inventive concept may include a memory cell array 20, a row decoder 30, and a core logic circuit 55. The core logic circuit 55 may include a read/write circuit 40 and a control circuit 50.

The memory cell array 20 may include a plurality of memory cells arranged in a plurality of rows and a plurality of columns. The plurality of memory cells included in the memory cell array 20 may be connected to the row decoder 30 through a word line WL, a common source line CSL, a string select line SSL, a ground select line GSL, and the like, and may be connected to the read/write circuit 40 through a bit line BL. According to an example embodiment, a plurality of memory cells arranged in an identical row may be connected to a single word line WL, and a plurality of memory cells arranged in an identical column may be connected to a single bit line BL.

The plurality of memory cells included in the memory cell array 20 may be divided into a plurality of memory blocks. Each of the memory blocks may include a plurality of word lines WLs, a plurality of string select lines SSLs, a plurality of ground select lines GSLs, a plurality of bit lines BLs, and at least one common source line CSL.

The row decoder 30 may receive address ADDR information externally, and may decode the received ADDR information to select at least a portion of the word line WL, the common source line CSL, the string select line SSL, and the ground select line GSL connected to the memory cell array 20.

The read/write circuit 40 may select at least a portion of the bit lines BLs connected to the memory cell array 20 in response to a command received from the control circuit 50. The read/write circuit 40 may read data stored in a memory cell connected to the selected at least a portion of the bit lines BLs, or may write data to the memory cell connected to the selected at least a portion of the bit lines BLs. The read/write circuit 40 may include circuits such as a page buffer, an input/output (I/O) buffer, a data latch, and the like to perform the above operations.

The control circuit 50 may control operations of the row decoder 30 and the read/write circuit 40 in response to a control signal CTRL transmitted from an external source. When data stored in the memory cell array 20 is read, the control circuit 50 may control the row decoder 30 to supply a voltage for a data reading operation to a word line WL in which data is stored. When a voltage for a data reading operation is supplied to a certain word line WL, the control circuit 50 may control the read/write circuit 40 to read data stored in a memory cell connected to the word line WL to which the voltage for a data reading operation is supplied.

Meanwhile, when data is written to the memory cell array 20, the control circuit 50 may control the row decoder 30 to supply a voltage for a data writing operation to a word line WL to which data is written. When a voltage for a data writing operation is supplied to a certain word line WL the control circuit 50 may control the read/write circuit 40 to write data to a memory cell connected to the word line WL to which the voltage for a data writing operation is supplied.

Figure 2:
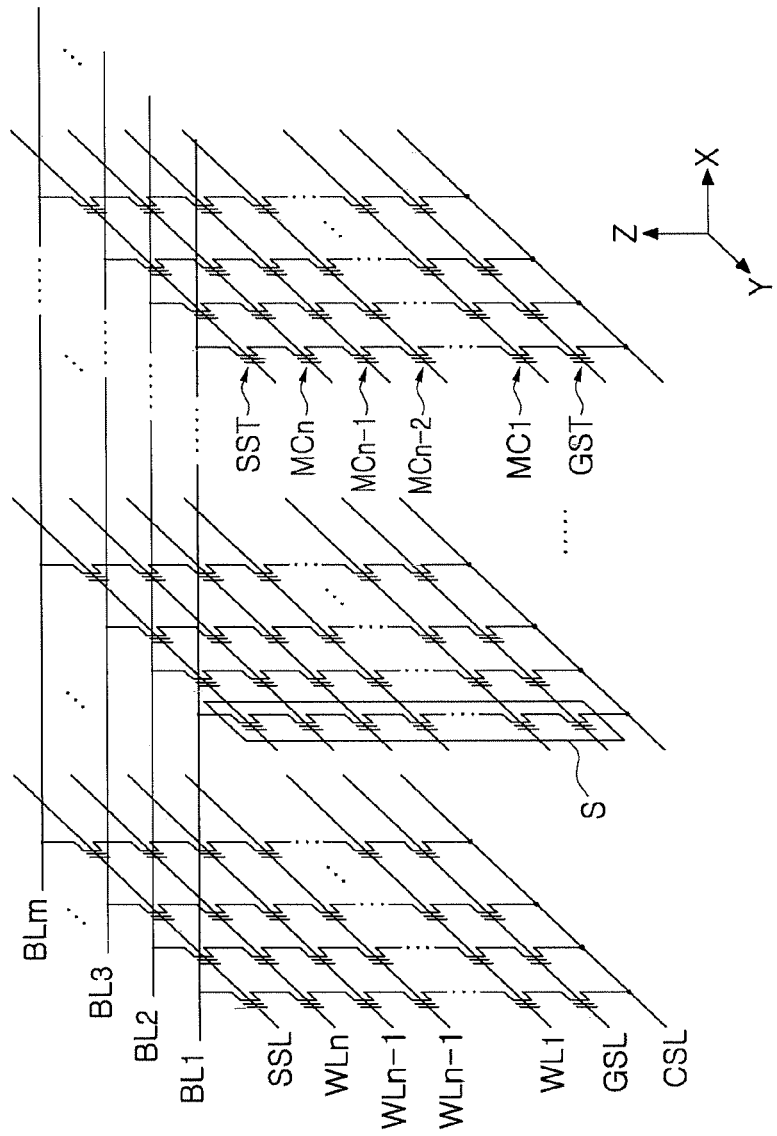
FIG. 2 is a circuit diagram illustrating a memory cell array of a memory device according to some embodiments of the present inventive concept.

FIG. 2 is an equivalent circuit diagram of a memory cell array of a memory device according to some embodiments of the present inventive concept. A semiconductor device according to some embodiments may be provided as a vertical NAND flash element.

Referring to FIG. 2, the memory cell array may include a plurality of memory cell strings S, each of which including n memory cells MC1 to MCn connected to each other in series, and a ground select transistor GST and a string select transistor SST connected to both ends of the memory cells MC1 to MCn in series. At least one dummy transistor can be connected between the ground select transistor GST and the memory cell MC1, and between the string select transistor SST and the memory cell MCn.

The n memory cells MC1 to MCn connected to each other in series may be respectively connected to n word lines WL1 to WLn for selecting the memory cells MC1 to MCn.

A gate terminal of the ground select transistor GST may be connected to a ground select line GSL, and a source terminal of the ground select transistor GST may be connected to a common source line CSL. Meanwhile, a gate terminal of the string select transistor SST may be connected to a string select line SSL, and a source terminal of the string select transistor SST may be connected to a drain terminal of the memory cell MCn. FIG. 2 illustrates a structure in which the ground select transistor GST and the string select transistor SST are connected to the n memory cells MC1 to MCn connected to each other in series one by one. In a different manner, a plurality of ground select transistors GSTs or a plurality of string select transistors SSTs may also be connected to the n memory cells MC1 to MCn.

A drain terminal of the string select transistor SST may be connected to a plurality of bit lines BL1 to BLm. When a signal is applied to the gate terminal of the string select transistor SST through the string select line SSL, a signal applied through the plurality of bit lines BL1 to BLm may be transmitted to the n memory cells MC1 to MCn connected to each other in series, and a data reading operation or a data writing operation may be performed. In addition, when the source terminal of the string select transistor SST applies a signal to the gate terminal of the gate select transistor GST connected to the common source line CSL through the gate select line GSL, an erasing operation of removing all electric charges stored in the n memory cells MC1 to MCn may be performed.

Figure 3:
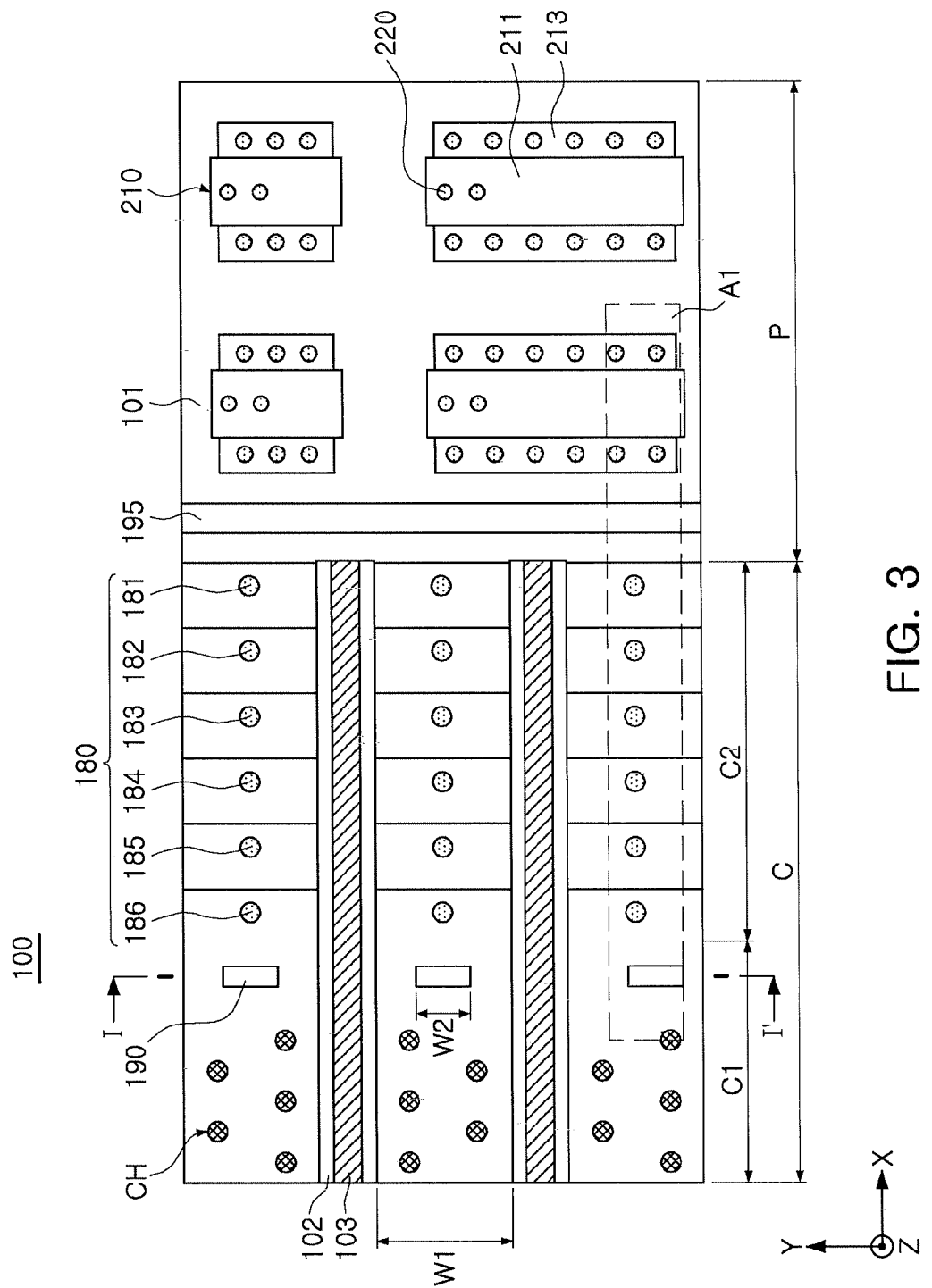
FIG. 3 is a plan view of a memory device according to some embodiments of the present inventive concept.

FIG. 3 is a plan view of a memory device according to some embodiments of the present inventive concept.

Referring to FIG. 3, a memory device 100 according to some embodiments may have a cell region C and a peripheral circuit region P that is adjacent the cell region C. The cell region C may include channel regions CH extending in a direction perpendicular to an upper surface of a substrate 101, and a plurality of cell contact plugs 181 to 186 collectively represented by a cell contact plug 180 and connected to a plurality of gate electrode layers stacked on the substrate 101 to be adjacent the channel regions CH. Meanwhile, the peripheral circuit region P may include a plurality of peripheral contact plugs 220 connected to peripheral circuit devices 210 formed on the substrate 101. In the cell region C, the channel regions CH and the gate electrode layers may be divided into a plurality of portions by isolation insulating layers 102. Meanwhile, an interlayer insulating layer disposed on the substrate 101 to cover the plurality of gate electrode layers, the peripheral circuit devices 210, and the like, may be omitted from the illustration of FIG. 3.

The upper surface of the substrate 101 may correspond to an X-Y plane, and the channel regions CH and the cell contact plug 180 may extend in a direction (a Z-axis direction of FIG. 3) that is perpendicular to the upper surface of the substrate 101. The plurality of gate electrode layers connected to the cell contact plug 180 may be disposed in the Z-axis direction to be stacked on the upper surface of the substrate 101 corresponding to the X-Y plane. A plurality of insulating layers may be disposed between the plurality of gate electrode layers in the Z-axis direction, respectively, and the plurality of gate electrode layers and the plurality of insulating layers may form gate structures.

The channel regions CH may be disposed to be spaced apart from each other on the X-Y plane. The number and an arrangement of the channel regions CHs may be various according to example embodiments, and for example, may also be disposed in a zigzag form as illustrated in FIG. 3. The arrangement of the channel regions CHs that are adjacent one another with the isolation insulating layers 102 interposed therebetween may be symmetrical as illustrated in FIG. 3, but the present inventive concept is not limited thereto. The channel regions CH may extend in the direction perpendicular to the upper surface of the substrate 101, the Z-axis direction of FIG. 3, to pass through the gate structures.

The plurality of gate electrode layers, the plurality of channel regions CHs, and the like may be divided into a plurality of unit regions by common source lines 103 and the isolation insulating layers 102 disposed around the common source lines 103. Each of the plurality of unit regions defined by the common source lines 103 and the isolation insulating layers 102 may be provided as a unit cell of the memory device 100. Each of the common source lines 103 may have a source region provided on a lower portion thereof in the Z-axis direction.

An interlayer insulating layer may be provided on the substrate 101 across the cell region C and the peripheral circuit region P. The interlayer insulating layer may cover the plurality of gate electrode layers, the peripheral circuit devices 210, and the like, and may include a silicon oxide and/or a silicon nitride. The illustration of FIG. 3 may omit the interlayer insulating layer in order to describe an internal structure of the memory device 100 in more detail.

Each of the peripheral circuit devices 210 may include a planar transistor, and may include active regions 213 provided as a drain or source region, and a planar gate electrode layer 211. The active regions 213 may be formed by injecting an impurity into portions of the substrate 101, and the active regions 213 and the planar gate electrode layer 211 may intersect each other. The active regions 213 and the planar gate electrode layer 211 may be connected to the plurality of peripheral contact plugs 220, respectively.

Meanwhile, referring to FIG. 3, the cell region C may include a first region C1 in which the channel regions CH are disposed and a second region C2 in which the cell contact plug 180 is connected to the plurality of gate electrode layers. The second region C2 may be disposed between the first region C1 and the peripheral circuit region P. Vertical insulating layers 190 may be provided to be adjacent a border between the first region C1 and the second region C2.

The vertical insulating layers 190 may be inserted into the gate structures from upper surfaces of the gate structures to a predetermined depth, respectively, and may include an insulating material. According to some embodiments, each of the vertical insulating layers 190 may extend from the interlayer insulating layer disposed on each of the gate structures. According to some embodiments illustrated in FIG. 3, the vertical insulating layers 190 are illustrated as each having a rectangular cross section on the X-Y plane, but in a different manner, a cross section of each of the vertical insulating layers 190 may be modified to have various forms such as a triangle, a square, a circle, an oval, and the like.

The vertical insulating layers 190 may be provided in predetermined reference positions in a process of forming the second region C2, respectively. In the second region C2, the plurality of gate electrode layers may extend in a first direction (an X-axis direction of FIG. 3) to have different lengths, respectively, and may be connected to the cell contact plug 180. Therefore, when a length of each of the plurality of gate electrode layers is not properly limited in the second region C2, an open defect in which at least a portion of the cell contact plug 180 is not connected to the gate electrode layers or a short circuit defect in which the at least a portion of the cell contact plug 180 is connected to two or more of the gate electrode layers may occur.

According to some embodiments, locations of ends of the plurality of gate electrode layers may be determined in the first direction, based on trenches provided to form the vertical insulating layers 190. Therefore, since the length of each of the plurality of gate electrode layers is properly controlled in the second region C2, an open defect or a short circuit defect that may occur when the cell contact plug 180 is formed may be prevented.

The vertical insulating layers 190 may have certain thicknesses, respectively, to be utilized as reference locations in a process of forming the plurality of gate electrode layers to have different lengths, respectively. As an example, each of the vertical insulating layers 190 may have a thickness whereby a portion of an uppermost gate electrode layer of the gate electrode layers may be recessed in the Z-axis direction. In some embodiments, each of the vertical insulating layers 190 may also penetrate the uppermost gate electrode layer in the Z-axis direction. The features of a manufacturing process may allow each of the vertical insulating layers 190 to have a greater thickness than that of the uppermost insulating layer 147.

According to the example embodiments of FIG. 3, the vertical insulating layers 190 may be disposed one by one within the plurality of unit regions defined by the isolation insulating layers 102. The vertical insulating layers 190 may also not be disposed within a portion of the plurality of unit regions. A width W2 of each of the plurality of vertical insulating layers 190 may be limited to a certain reference value or less to prevent a deterioration in the characteristics of gate electrode layers recessed or penetrated by the vertical insulating layers 190. According to some embodiments, the width W2 of each of the plurality of vertical insulating layers 190 may be ½ or less of a width W1 of each of the unit regions.

Meanwhile, a dummy trench 195 may be adjacent a border between the peripheral circuit region P and the cell region C. The dummy trench 195 may be provided as a portion in which the dummy trench 195 may be inserted into the substrate 101 to a certain depth, and may include an insulating material. The dummy trench 195 may be provided as a reference location for measuring locations of the plurality of gate electrode layers within the second region C2 as in the vertical insulating layers 190.

Figure 4:
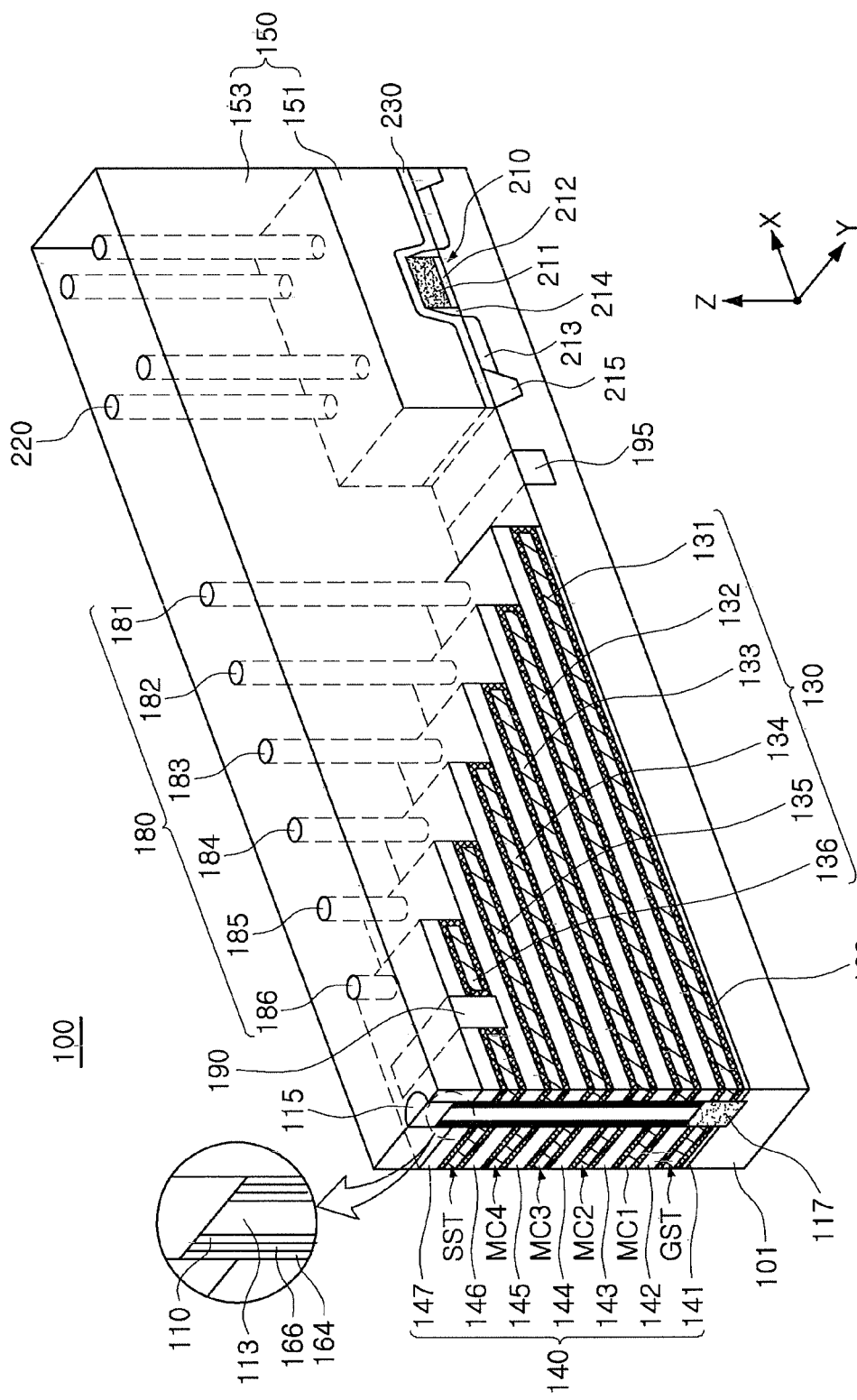
FIG. 4 is a partially-cutaway perspective view of region A1 of the memory device illustrated in FIG. 3.

FIG. 4 is a partially-cutaway perspective view of region A1 of the memory device illustrated in FIG. 3.

Referring to FIG. 4, the memory device 100 according to some embodiments of the present inventive concept may include a channel layer 110 extending in the direction perpendicular to the upper surface of the substrate 101, a plurality of gate electrode layers 131 to 136 collectively represented by a gate electrode layer 130 and stacked on the upper surface of the substrate 101 to be adjacent the channel layer 110, and an interlayer insulating layer 150 and the plurality of cell contact plugs 181 to 186 provided on the gate electrode layer 130, the plurality of cell contact plugs 181 to 186 collectively represented by the cell contact plug 180. The cell contact plug 180 may pass through the interlayer insulating layer 150 to be connected to the gate electrode layer 130. The gate electrode layers 131 to 136 may have a plurality of insulating layers 141 to 147 collectively represented by an insulating layer 140 therebetween, and a stack of the gate electrode layer 130 and the insulating layer 140 may be provided as the gate structure.

The channel layer 110 may be formed in a cavity passing through the gate structure, and may have an annular shape having a hollow. A space formed in the center of the channel layer 110 may be filled with an embedded insulating layer 113, and the channel layer 110 may have a conductive layer 115 formed thereon. The conductive layer 115 may be connected to a bit line to be provided as a drain region of a plurality of memory cell devices formed in the cell region C.

Each of the gate electrode layers 131 to 136 may provide a gate electrode of a ground select transistor GST, a plurality of memory cell transistors MC1 to MCn, and a string select transistor SST. The gate electrode layer 130 may extend while forming word lines WL1 to WLn, and may be commonly connected to adjacent memory cell strings of predetermined units arranged in the first direction (X-axis direction) and the second direction (Y-axis direction). According to some embodiments, the total number of the gate electrode layers 131 to 136 forming the memory cell transistors MC1 to MCn may be 2N (in which, N is a positive integer).

Figure 5:
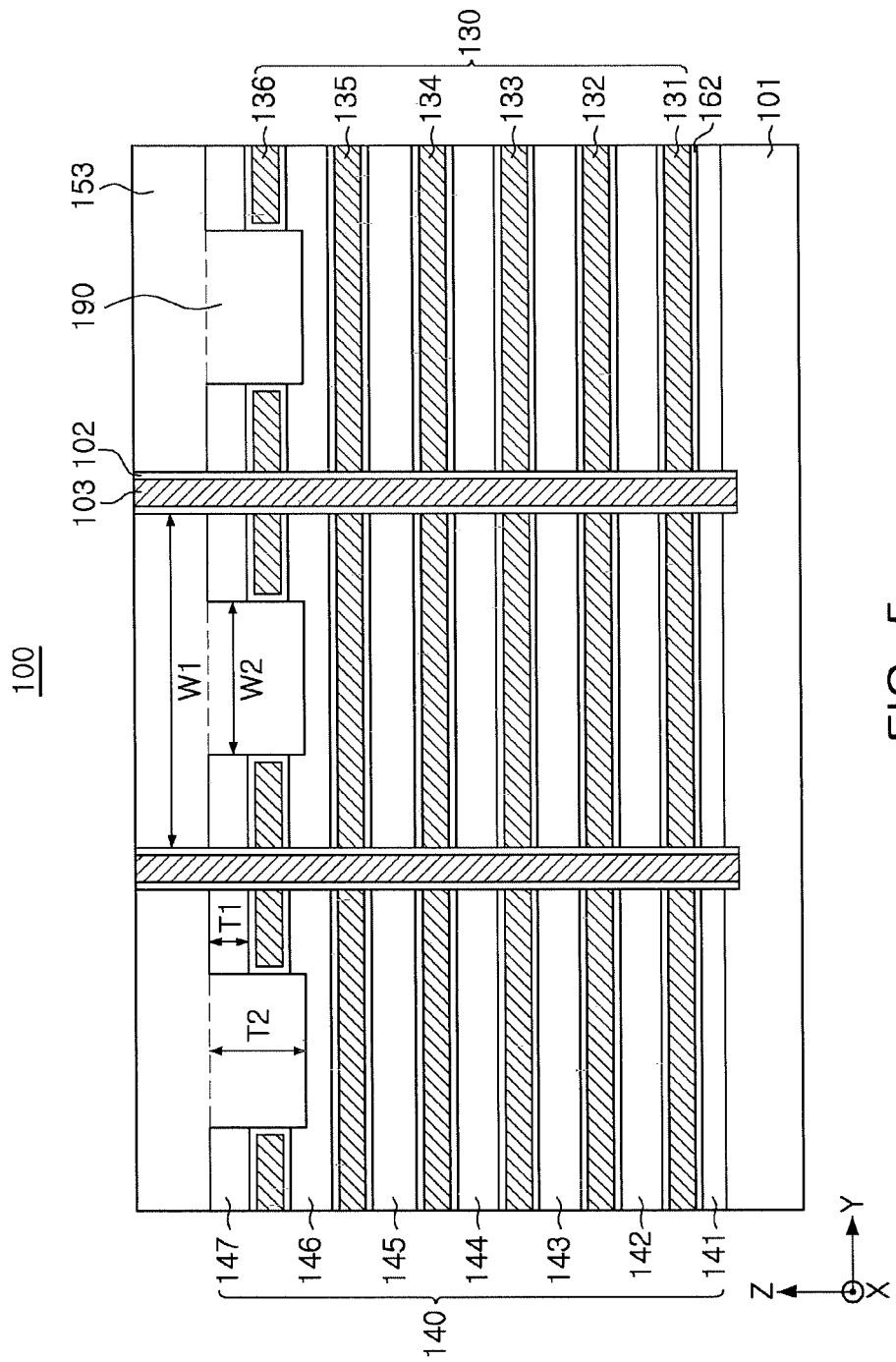
FIG. 5 is a cross-sectional view taken along line I-I' of the memory device illustrated in FIG. 3.

The gate electrode layer 131 of the ground select transistor GST may be connected to a ground select line GSL. FIG. 5 illustrates a single gate electrode layer 136 of the string select transistor SST and a single gate electrode layer 131 of the ground select transistor GST, but the number of each of the gate electrode layer 136 and the gate electrode layer 131 is not limited to one. Meanwhile, the gate electrode layer 136 of the string select transistor SST and the gate electrode layer 131 of the ground select transistor GST may also have a structure that is different from that of the gate electrode layers 132 to 135 of the memory cell transistors MC1 to MCn. The string select transistor SST may also be provided as a plurality of string select transistors SSTs within a single memory cell array.

The plurality of gate electrode layers 131 to 136 and the insulating layers 141 to 147 may extend in the first direction (X-axis direction) to have different lengths, respectively, to form a plurality of pad regions having a stepped shape. The plurality of pad regions may be provided by the plurality of gate electrode layers 131 to 136 and the plurality of insulating layers 141 to 147 respectively extending in the stacking direction (Z-axis direction) to have lengths different from those of another plurality of gate electrode layers 131 to 136 and another plurality of insulating layers 141 to 147 adjacent thereto. FIG. 4 illustrates the insulating layer 140 positioned above the gate electrode layer 130 in the Z-axis direction in each of the pad regions, but in a different manner, the gate electrode layer 130 may be positioned above the insulating layer 140.

The gate electrode layer 130 may include a polycrystalline silicon material and/or a metallic silicide material. The metal silicide material may be, for example, a silicide material including a metal selected from cobalt (Co), nickel (Ni), hafnium (Hf), platinum (Pt), tungsten (W), and/or titanium (Ti). According to some embodiments, the gate electrode layer 130 may also include a metallic material such as tungsten (W). In addition, although not illustrated, the gate electrode layer 130 may further include a diffusion barrier, and the diffusion barrier may include, for example, at least one of a tungsten nitride (WN), a tantalum nitride (TaN), and/or a titanium nitride (TiN).

The plurality of insulating layers 141 to 147 and the plurality of gate electrode layers 131 to 136 alternately stacked with each other, may be isolated from each other by the isolation insulating layers 102 in the Y-axis direction as in the gate electrode layer 130. The insulating layer 140 may include an insulating material such as a silicon oxide and/or a silicon nitride.

A gate insulating film may be disposed between the channel layer 110 and the gate electrode layer 130 and include a blocking layer 162, an electric charge storage layer 164, and a tunneling layer 166. A structure of the memory device 100 may allow all of the blocking layer 162, the electric charge storage layer 164, and the tunneling layer 166 to surround the gate electrode layer 130. In some embodiments, at least a portion of the gate insulating film may extend in the Z-axis direction in parallel to the channel layer 110 to be disposed outside of the channel layer 110, and the remainder of the gate insulating film may be disposed to surround the gate electrode layer 130. According to example embodiments illustrated in FIG. 4, the electric charge storage layer 164 and the tunneling layer 166 may be disposed outside the channel layer 110 to extend in the Z-axis direction in parallel to the channel layer 110, and the blocking layer 162 may be disposed to surround the gate electrode layer 130.

The blocking layer 162 may include, for example, a silicon oxide ($SiO_2$), a silicon nitride ($Si_3N_4$), a silicon oxynitride (SiON) and/or a high-dielectric constant dielectric material. The high-dielectric constant dielectric material may be provided as one of an aluminum oxide ($Al_2O_3$), a tantalum oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and/or a praseodymium oxide ($Pr_2O_3$). When the blocking layer 162 includes the high-dielectric constant dielectric material, the term "high-dielectric constant" may be defined as having a meaning in which a dielectric constant of the blocking layer 162 is higher than that of the tunneling layer 166 or a silicon oxide.

The blocking layer 162 may selectively include a plurality of layers having different dielectric constants, respectively. In this case, a layer having a relatively low dielectric constant among the plurality of layers may be disposed to be closer to the channel layer 110 than a layer having a relatively high dielectric constant thereamong, so that an energy gap such as a barrier height may be controlled, thereby improving the characteristics of the memory device 100, for example, erase features.

The electric charge storage layer 164 may be provided as an electric charge trapping layer or a conductive floating gate layer. When the electric charge storage layer 164 is provided as the conductive floating gate layer, the electric charge storage layer 164 may be formed by depositing polycrystalline silicon using low pressure chemical vapor deposition (LPCVD). When the electric charge storage layer 164 is provided as the electric charge trapping layer, the electric charge storage layer 164 may include at least one of a silicon oxide ($SiO_2$), a silicon nitride ($Si_3N_4$), a silicon oxynitride (SiON), a hafnium oxide ($HfO_2$), a zirconium oxide ($ZrO_2$), a tantalum oxide ($Ta_2O_3$), a titanium oxide ($TiO_2$), a hafnium aluminum oxide ($HfAl_xO_y$), a hafnium tantalum oxide ($HfTa_xO_y$), a hafnium silicon oxide ($HfSi_xO_y$), an aluminum nitride ($Al_xN_y$), and/or an aluminum gallium nitride ($AlGa_xN_y$).

The tunneling layer 166 may include at least one of a silicon oxide ($SiO_2$), a silicon nitride ($Si_3N_4$), a silicon oxynitride (SiON), a hafnium oxide ($HfO_2$), a hafnium silicon oxide ($HfSi_xO_y$), an aluminum oxide ($Al_2O_3$), and/or a zirconium oxide ($ZrO_2$).

The peripheral circuit device 210 may be disposed in the peripheral circuit region P. The peripheral circuit device 210 may include the active regions 213 formed by injecting the impurity into the portions of the substrate 101, the planar gate electrode layer 211 intersecting the active regions 213, and a planar gate insulating film 212 disposed between the planar gate electrode layer 211 and the substrate 101. The planar gate electrode layer 211 may have gate spacers 214 disposed on side surfaces thereof. The active regions 213 may be provided as a source or drain region of the peripheral circuit device 210, and may have an isolation layer 215 disposed outwardly thereof, respectively. At least a portion of the active region 213 may also be shared by two or more peripheral circuit devices 210 that are adjacent one another.

The peripheral circuit device 210 may have a cover layer 230 formed thereon. The cover layer 230 may include a material having a predetermined etch selectivity ratio with the interlayer insulating layer 150. For example, when the interlayer insulating layer 150 includes a silicon oxide film, the cover layer 230 may include a silicon nitride film. The cover layer 230 may prevent the active region 213 from being excessively recessed in a process of forming the plurality of peripheral contact plugs 220. The cover layer 230 may also be selectively removed from a portion of the planar gate electrode layer 211. Therefore, the peripheral contact plugs 220 may be connected to the planar gate electrode layer 211 without contacting the cover layer 230.

Meanwhile, the memory device 100 according to some example embodiments may include the interlayer insulating layer 150 disposed on the substrate 101. The interlayer insulating layer 150 may include a first interlayer insulating layer 151 and a second interlayer insulating layer 153. The first interlayer insulating layer 151 and the second interlayer insulating layer 153 may include the same material, for example, a silicon oxide or a silicon nitride. The first interlayer insulating layer 151 may cover the peripheral circuit device 210. In particular, the first interlayer insulating layer 151 may also be formed only in a portion in which the peripheral circuit device 210 may be formed. As described above, the first interlayer insulating layer 151 may include a high density plasma (HDP) oxide film, and the second interlayer insulating layer 153 may include a tetraethyl orthosilicate (TEOS) oxide film. The second interlayer insulating layer 153 may be formed using a process such as physical vapor deposition (PVD), chemical vapor deposition (CVD), sub-atmospheric chemical vapor deposition (SACVD), low pressure chemical vapor deposition (LPCVD), and/or plasma enhanced chemical vapor deposition (PECVD).

Referring to FIG. 4, the memory device 100 according to some embodiments may include the vertical insulating layer 190. The vertical insulating layer 190 may have a structure in which the vertical insulating layer 190 is inserted into the gate structure from the upper surface of the gate structure to a certain depth, and may be provided as a portion extending from the interlayer insulating layer 150. According to some embodiments, the vertical insulating layer 190 may be provided as a portion including an insulating material different from that of the interlayer insulating layer 150. The vertical insulating layer 190 may be surrounded by at least one gate electrode layer 136 in at least a portion thereof. According to example embodiments illustrated in FIG. 4, the vertical insulating layer 190 may pass through the uppermost gate electrode layer 136, and may be surrounded by a gate electrode layer 136 that is adjacent the uppermost gate electrode layer 136 in the direction (X-axis or Y-axis direction) parallel to the upper surface of the substrate 101.

A thickness of the vertical insulating layer 190 may be greater than that of each of the plurality of insulating layers 141 to 147. The vertical insulating layer 190 may pass through the uppermost insulating layer 147, and at least a portion of the vertical insulating layer 190 may be adjacent to the gate insulating film. According to some embodiments illustrated in FIG. 4, the vertical insulating layer 190 may pass through the uppermost gate electrode layer 136 so that a portion of a side surface of the vertical insulating layer 190 may contact the blocking layer 162. When the vertical insulating layer 190 does not pass through the uppermost gate electrode layer 136, the portion of the side surface of the vertical insulating layer 190 and a lower surface thereof may contact the blocking layer 162.

Meanwhile, the dummy trench 195 may be provided between the gate electrode layer 130 and the peripheral circuit device 210. The dummy trench 195 may have a structure in which the dummy trench 195 may be inserted into the substrate 101 to a certain depth, and may include an insulating material. The dummy trench 195 may be provided as a reference location for measuring a length of the gate electrode layer 130 in the first direction (X-axis direction) as similar with the vertical insulating layer 190.

FIG. 5 is a cross-sectional view taken along line I-I' of the memory device 100 illustrated in FIG. 3.

Referring to FIG. 5, the memory device 100 according to some embodiments of the present inventive concept may include the gate electrode layer 130 and the insulating layer 140 stacked on the substrate 101. The gate electrode layer 130 and the insulating layer 140 may form the gate structure, and the second interlayer insulating layer 153 may be provided on the gate structure. The gate structure may be divided into the plurality of unit regions by the isolation insulating layers 102 and the common source lines 103.

The plurality of unit regions may have the vertical insulating layers 190 formed in at least a portion thereof. According to some embodiments illustrated in FIG. 5, the vertical insulating layers 190 may be illustrated by being formed one by one in each unit region, but in a different manner, may not be formed in a portion of the plurality of unit regions. Each of the vertical insulating layers 190 may be provided as a portion extending from the second interlayer insulating layer 153, and may be inserted into a portion of the gate structure. Referring to FIG. 5, a thickness T2 of each of the vertical insulating layers 190 may be greater than a thickness T1 of the uppermost insulating layer 147. Therefore, each of the vertical insulating layers 190 may be inserted into or penetrate through at least a portion of the uppermost gate electrode layer 136. According to some embodiments, each of the vertical insulating layers 190 may also pass through the gate electrode layer 130 from the uppermost gate electrode layer 136.

Meanwhile, a width W2 of each of the plurality of vertical insulating layers 190 may be less than a width W1 of each of the unit regions. In particular, when each of the vertical insulating layers 190 is inserted into or passes through the at least a portion of the uppermost gate electrode layer 136, the width W2 of each of the vertical insulating layers 190 may be less than the width W1 of each of the unit regions for an electrical connection of the uppermost gate electrode layer 136. According to some embodiments, the width W2 may also be limited to be ½ or less of the width W1.

Figure 6:
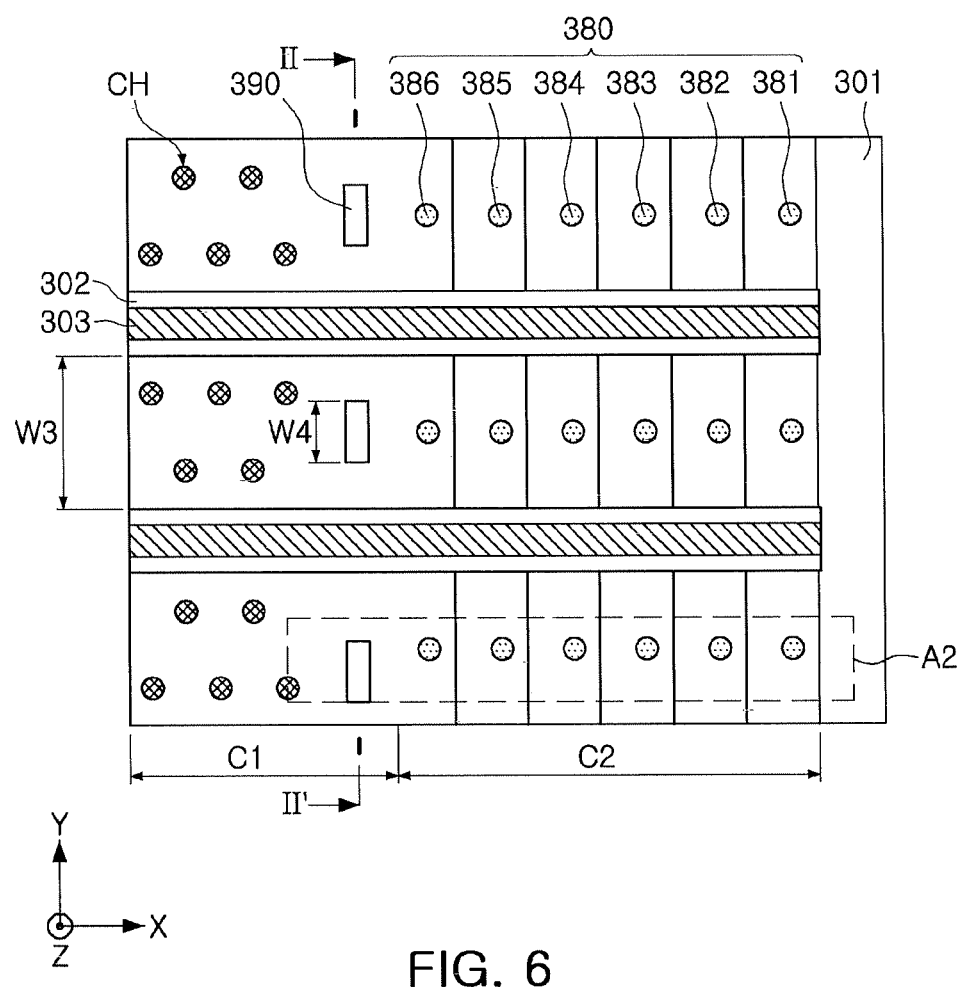
FIG. 6 is a plan view of a memory device according to some embodiments of the present inventive concept.

FIG. 6 is a plan view of a memory device according to some embodiments of the present inventive concept.

Referring to FIG. 6, a memory device 300 according to some embodiments may include a plurality of gate electrode layers, a plurality of channel regions CH, and a plurality of cell contact plugs 381 to 386 collectively represented by a cell contact plug 380. The plurality of gate electrode layers and the plurality of channel regions CH may be divided into a plurality of unit regions by isolation insulating layers 302 and common source lines 303.

The memory device 300 according to the example embodiment illustrated in FIG. 6 may include a cell region C and a peripheral circuit region P (refer to FIG. 7) disposed in a vertical direction. As an example, the memory device 300 may have a cell-on-peri (COP) structure in which the cell region C may be disposed on the peripheral circuit region P. Therefore, in FIG. 6, the plan view illustrates the cell region C, and the peripheral circuit region P positioned below the cell region C may not be illustrated.

The plurality of unit regions defined by the isolation insulating layers 302 may include vertical insulating layers 390, respectively. The vertical insulating layers 390 may have a structure in which the vertical insulating layers 390 may be inserted into portions of gate structures defined by the plurality of gate electrode layers and the plurality of insulating layer alternately stacked, respectively. Each of the vertical insulating layers 390 may have a thickness by which at least one of the plurality of gate electrode layers and the plurality of insulating layers may be penetrated.

Each of the vertical insulating layers 390 may be used as a reference position for measuring a length of each of the plurality of gate electrode layers respectively extending in a first direction (an X-axis direction of FIG. 6) to have different lengths in a second region C2. When the length of each of the plurality of gate electrode layers is not properly limited in the second region C2, a defect in which at least a portion of the cell contact plug 380 is not connected to the gate electrode layers or is connected to two or more of the gate electrode layers may occur.

According to some embodiments, the vertical insulating layers 390 may be formed before forming the plurality of gate electrode layers. A process of manufacturing the memory device 300 according to example embodiments may include alternately stacking a plurality of sacrificial layers and a plurality of insulating layers on a substrate 301, preparing trenches for forming the vertical insulating layers 390, and repeatedly etching the plurality of sacrificial layers and the plurality of insulating layers. By repeatedly etching the plurality of sacrificial layers and the plurality of insulating layers, the plurality of gate electrode layers may extend to have different lengths, respectively, in the second region C2.

The trenches for forming the vertical insulating layers 390 may be used as a certain reference location in the process of etching the plurality of sacrificial layers and the plurality of insulating layers. In more detail, the process of etching the plurality of sacrificial layers and the plurality of insulating layers may be performed while measuring lengths of the plurality of sacrificial layers and the plurality of insulating layers in the first direction (the X-axis direction) based on the trenches. Therefore, the lengths of the plurality of gate electrode layers extending in the second region C2 may be accurately controlled, and a defect rate that may occur when the cell contact plug 380 is formed may be reduced.

A width W4 of each of the plurality of vertical insulating layers 390 may be less than a width W3 of each of the plurality of unit regions. When at least one of the plurality of gate electrode layers is penetrated or recessed by each of the vertical insulating layers 390, the width W4 of each of the vertical insulating layers 390 may be less than ½ of the width W3 of each of the plurality of unit regions to prevent a deterioration in electrical characteristics due to the vertical insulating layers 390. The memory device 300 will hereinafter be described with reference to FIGS. 7 and 8.

Figure 7:
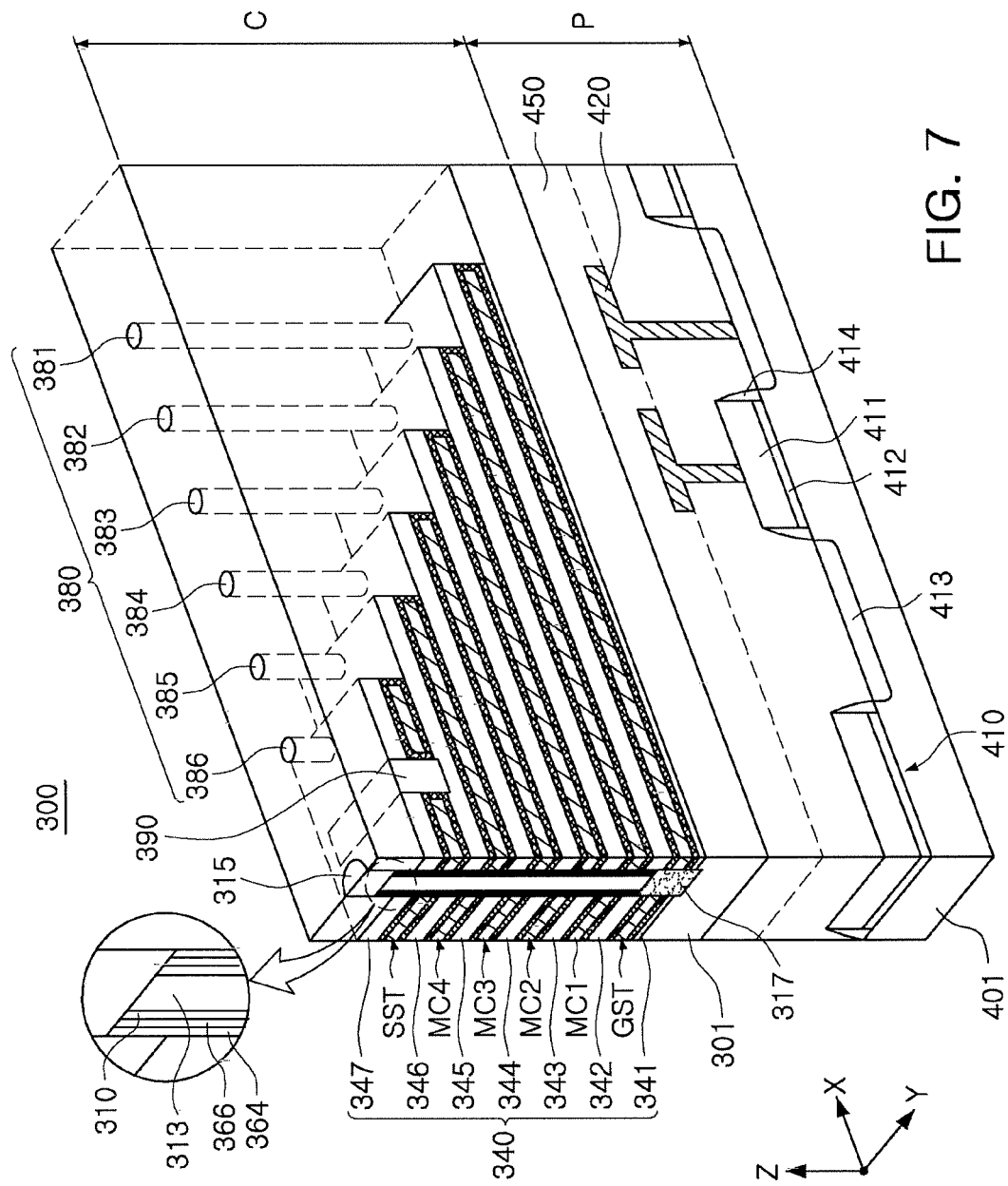
FIG. 7 is a partially-cutaway perspective view of region A2 of the memory device illustrated in FIG. 6.
Figure 8:
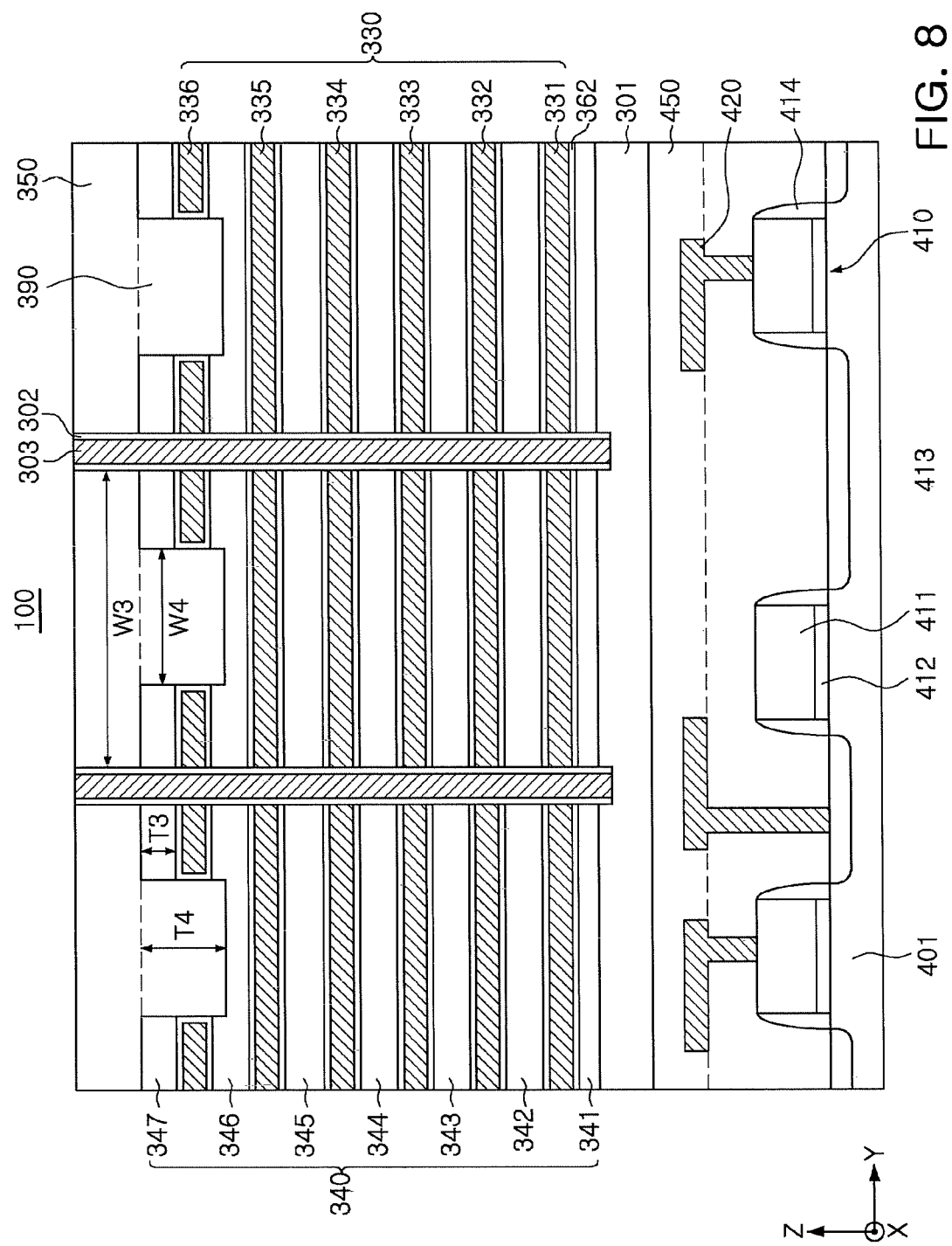
FIG. 8 is a cross-sectional view taken along line II-IT of the memory device illustrated in FIG. 6.

FIG. 7 is a partially-cutaway perspective view of region A2 of the memory device 300 illustrated in FIG. 6. FIG. 8 is a cross-sectional view taken along line II-II' of the memory device 300 illustrated in FIG. 6.

Referring to FIG. 7, the memory device 300 according to some embodiments of the present inventive concept may include the cell region C and the peripheral circuit region P disposed in the vertical direction. In more detail, the memory device 300 may have the COP structure in which the cell region C may be disposed on the peripheral circuit region P. Alternatively, unlike the example embodiment illustrated in FIG. 7, the memory device 300 may also have a peri-on-cell (POC) structure in which the peripheral circuit region P may be disposed on the cell region C.

The cell region C may include the first substrate 301, a plurality of gate electrode layers 331 to 336 collectively represented by a gate electrode layer 330 and formed on the first substrate 301, a plurality of insulating layers 341 to 347 collectively represented by an insulating layer 340 and formed on the first substrate 301, the plurality of cell contact plugs 381 to 386 collectively represented by the cell contact plug 380 and connected to the gate electrode layer 330, and a first interlayer insulating layer 350. The plurality of gate electrode layers 331 to 336 may be alternately stacked with the plurality of insulating layers 341 to 347 to form the gate structure. Meanwhile, the cell region C may include the vertical insulating layer 390 inserted into a portion of the gate structure.

The vertical insulating layer 390 may include an insulating material, and may be provided as a portion extending from the first interlayer insulating layer 350. The vertical insulating layer 390 may pass through the uppermost insulating layer 347 in the gate structure to be inserted into at least one gate electrode layer 336. As an example, the vertical insulating layer 390 may also pass through the uppermost gate electrode layer 336 of the gate electrode layer 330.

The peripheral circuit region P disposed below the cell region C may include a second substrate 401, a plurality of peripheral circuit devices 410 formed on the second substrate 401, and a second interlayer insulating layer 450 covering the plurality of peripheral circuit devices 410. The second interlayer insulating layer 450 may have wiring patterns 420 disposed therein to be connected to the plurality of peripheral circuit devices 410. Each of the plurality of peripheral circuit devices 410 may include active regions 413, a planar gate electrode layer 411 intersecting the active regions 413, a planar gate insulating film 412 formed between the planar gate electrode layer 411 and the second substrate 401, and gate spacers 414.

In the COP structure in which the cell region C may be disposed on the peripheral circuit region P, the first substrate 301 may be disposed on the second interlayer insulating layer 450. Therefore, the first substrate 301 and the second substrate 401 may have different degrees of crystallinity, respectively. According to some embodiments, the second substrate 401 may be provided as a single crystalline silicon substrate, and the first substrate 301 may be provided as a poly crystalline silicon substrate.

A channel layer 310 may extend in a direction perpendicular to an upper surface of the first substrate 301, and may have an annular shape having a hollow. The channel layer 310 may be filled with an embedded insulating layer 313, and a gate insulating film may be disposed between the channel layer 310 and the gate electrode layer 330. The gate insulating film may include a blocking layer 362, an electric charge storage layer 364, and a tunneling layer 366. At least a portion of the gate insulating film may be disposed in parallel to the channel layer 310, and the remainder of the gate insulating film may be disposed to surround the gate electrode layer 330. In some embodiments, the whole of the gate insulating film may be disposed to surround the gate electrode layer 330 or to be parallel to the channel layer 310.

The plurality of gate electrode layers 331 to 336 and the plurality of insulating layers 341 to 347 may extend in the first direction (the X-axis direction) to have different lengths, respectively. As illustrated in FIG. 7, each of the gate electrode layers 331 to 336 and each of the insulating layers 341 to 347 may form pairs, and may extend in the first direction to have different lengths, respectively, to form pad regions. The pad regions may correspond to the second region C2 illustrated in FIG. 6, the cell contact plug 380 may pass through the first interlayer insulating layer 350 in the pad regions to be connected to the gate electrode layer 330.

Referring to FIG. 8, the vertical insulating layers 390 may be disposed in the plurality of unit regions, defined by the isolation insulating layers 302 and the common source lines 303, in the cell region C, respectively. The number of the vertical insulating layers 390 may be less than or equal to that of the plurality of unit regions. The width W4 of each of the vertical insulating layers 390 may be limited to be less than or equal to ½ of the width W3 of each of the unit regions to prevent a deterioration in electrical characteristics of the uppermost gate electrode layer 336 recessed or penetrated by each of the vertical insulating layers 390. Meanwhile, a thickness T4 of each of the vertical insulating layers 390 may be greater than a thickness T3 of the uppermost insulating layer 347 included in each of the gate structures.

The memory device 300 according to example embodiments illustrated in FIG. 7 may have the peripheral circuit region P and the cell region C disposed vertically, and the plurality of substrates 301 and 401 may thus be required. Therefore, unlike the memory device 100 illustrated in FIGS. 3 through 5, the peripheral circuit devices 410 may be formed on the second substrate 401, and an additional process may thus be required to form a dummy trench in the first substrate 301. According to some embodiments, the length of the gate electrode layer 330 in the first substrate (the X-axis direction) may be adjusted using trenches provided to form the vertical insulating layers 390 in the gate structures without forming the dummy trench in the first substrate 301. Therefore, the number of processes of manufacturing the memory device 300 may be reduced as compared to forming the dummy trench in the first substrate 301.

Figure 9:
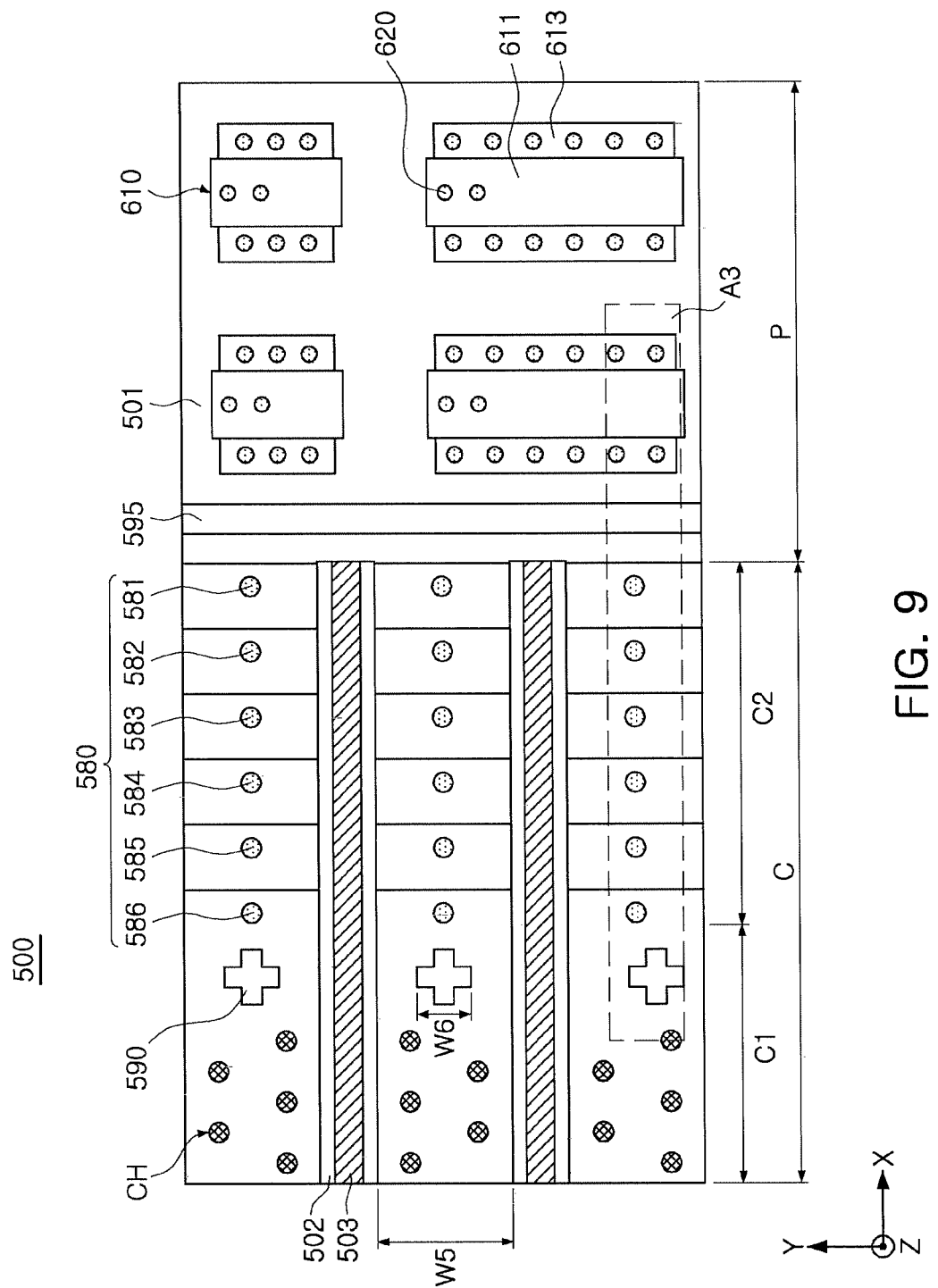
FIG. 9 is a plan view of a memory device according to some embodiments of the present inventive concept.

FIG. 9 is a plan view of a memory device according to some embodiments of the present inventive concept.

Referring to FIG. 9, a memory device 500 according to some embodiments may have a cell region C and a peripheral circuit region P. The cell region C may include gate structures including a plurality of gate electrode layers and a plurality of insulating layers alternately stacked on a substrate 501, and channel regions CH passing through each of the gate structures to be adjacent the plurality of gate electrode layers. The cell region C may include a first region C1 and a second region C2, and the second region C2 may be defined by a portion in which the plurality of gate electrode layers may be connected to a plurality of cell contact plugs 581 to 586 collectively represented by a cell contact plug 580. The plurality of gate electrode layers may extend in a first direction (an X-axis direction) to have different lengths, respectively, in the second region C2.

The cell region C may be divided into a plurality of unit regions by isolation insulating layers 502 and common source lines 503. The isolation insulating layers 502 and the common source lines 503 may extend in the first direction, and may be erected in a stacking direction (a Z-axis direction) perpendicular to an upper surface of the substrate 501, the stacking direction in which the plurality of gate electrode layers are stacked.

The peripheral circuit region P may include a plurality of peripheral circuit devices 610. Each of the peripheral circuit devices 610 may include active regions 613 and a planar gate electrode layer 611 intersecting the active regions 613. The active regions 613 and the planar gate electrode layer 611 may be connected to a plurality of peripheral contact plugs 620, respectively.

Meanwhile, the memory device 500 according to the example embodiment may include vertical insulating layers 590 and a dummy trench 595. Each of the vertical insulating layers 590 may be inserted into a portion of each of the gate structures, and the dummy trench 595 may be inserted into a portion of the substrate 501. The vertical insulating layers 590 may be disposed within the plurality of unit regions defined by the isolation insulating layers 502, respectively. In addition, the vertical insulating layers 590 may have various different shapes other than a cross shape illustrated in FIG. 9, and the dummy trench 595 may have a line shape extending in a second direction (a Y-axis direction).

A width W6 of each of the plurality of vertical insulating layers 590 may be less than a width W5 of each of the unit regions. According to some embodiments, the width W6 of each of the plurality of vertical insulating layers 590 may be less than or equal to ½ of the width W5 of each of the unit regions. The width W6 of each of the plurality of vertical insulating layers 590 may be set under the conditions described above, and a short circuit or a deterioration in electrical characteristics may be prevented from occurring in the gate electrode layers. The vertical insulating layers 590 and the dummy trench 595 may be used as certain reference locations in a process of forming the plurality of gate electrode layers to have different lengths, respectively, in the first direction in the second region C2.

Figure 10:
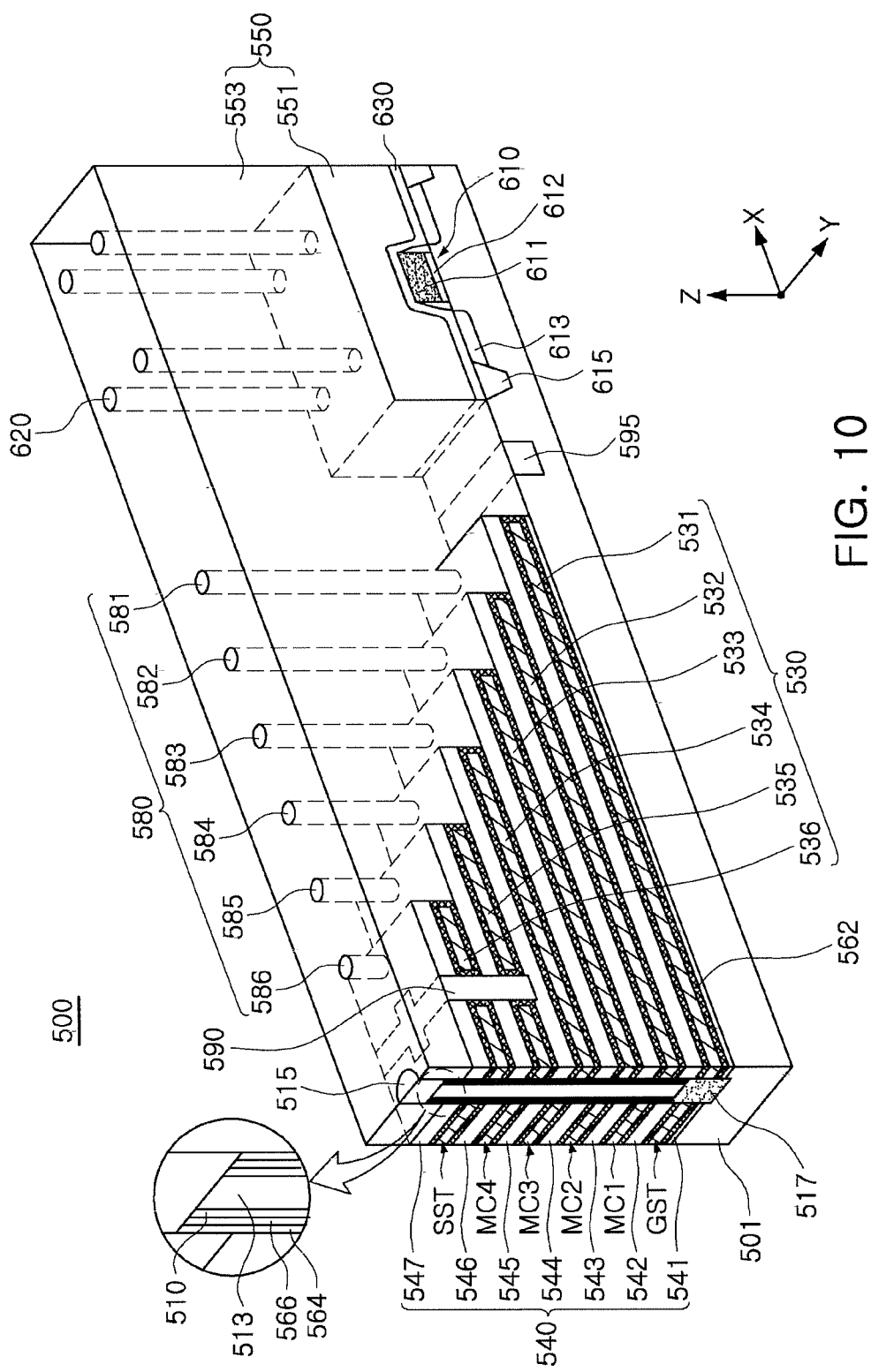
FIG. 10 is a partially-cutaway perspective view of region A3 of the memory device illustrated in FIG. 9.

FIG. 10 is a partially-cutaway perspective view of region A3 of the memory device 500 illustrated in FIG. 9.

Referring to FIG. 10, the memory device 500 according to some embodiments may have the cell region C and the peripheral circuit region P. The cell region C may include a plurality of gate electrode layers 531 to 536 collectively represented by a gate electrode layer 530, a plurality of insulating layers 541 to 547 collectively represented by an insulating layer 540, the gate electrode layers 531 to 536 and the insulating layers 541 to 547 alternately stacked on the substrate 501, a channel layer 510 extending in the direction perpendicular to the upper surface of the substrate 501, a gate insulating film 562, 564, and 566 disposed between the channel layer 510 and the gate electrode layer 530, and the like. The gate electrode layer 530 and the insulating layer 540 may form the gate structure, and the gate structure may have the vertical insulating layer 590 formed therein.

The peripheral circuit region P may include the peripheral circuit device 610. The peripheral circuit device 610 may have the active regions 613 and the planar gate electrode layer 611, and the planar gate electrode layer 611 and the substrate 501 may have a planar gate insulating film 612 disposed therebetween. The planar gate electrode layer 611 may have gate spacers 614 provided on side surfaces thereof, respectively, and the peripheral circuit device 610 may have a cover layer 630 provided thereon. Meanwhile, an interlayer insulating layer 550 may be provided across the cell region C and the peripheral circuit region P, and may include a first interlayer insulating layer 551 and a second interlayer insulating layer 553.

Meanwhile, the vertical insulating layer 590 may be provided in the cell region C, and the dummy trench 595 may be provided in close proximity to a border between the cell region C and the peripheral circuit region P. The dummy trench 595 may be provided as a portion inserted into the substrate 501. The vertical insulating layer 590 may be provided as a portion in which the vertical insulating layer 590 may extend from the interlayer insulating layer 550, in particular, the second interlayer insulating layer 553, and may have a depth allowing at least one gate electrode layer 530 to penetrate therethrough.

According to some embodiments illustrated in FIG. 10, the vertical insulating layer 590 may have a depth allowing two or more gate electrode layers, for example, the gate electrode layers 535 and 536, to penetrate therethrough. Therefore, the vertical insulating layer 590 may be formed using a manufacturing process different from that of the memory devices 100 and 300 illustrated in FIGS. 4 and 7.

FIGS. 11A through 22B are views of a method of manufacturing the memory device 100 illustrated in FIGS. 3 through 5, respectively.

Figure 11A:
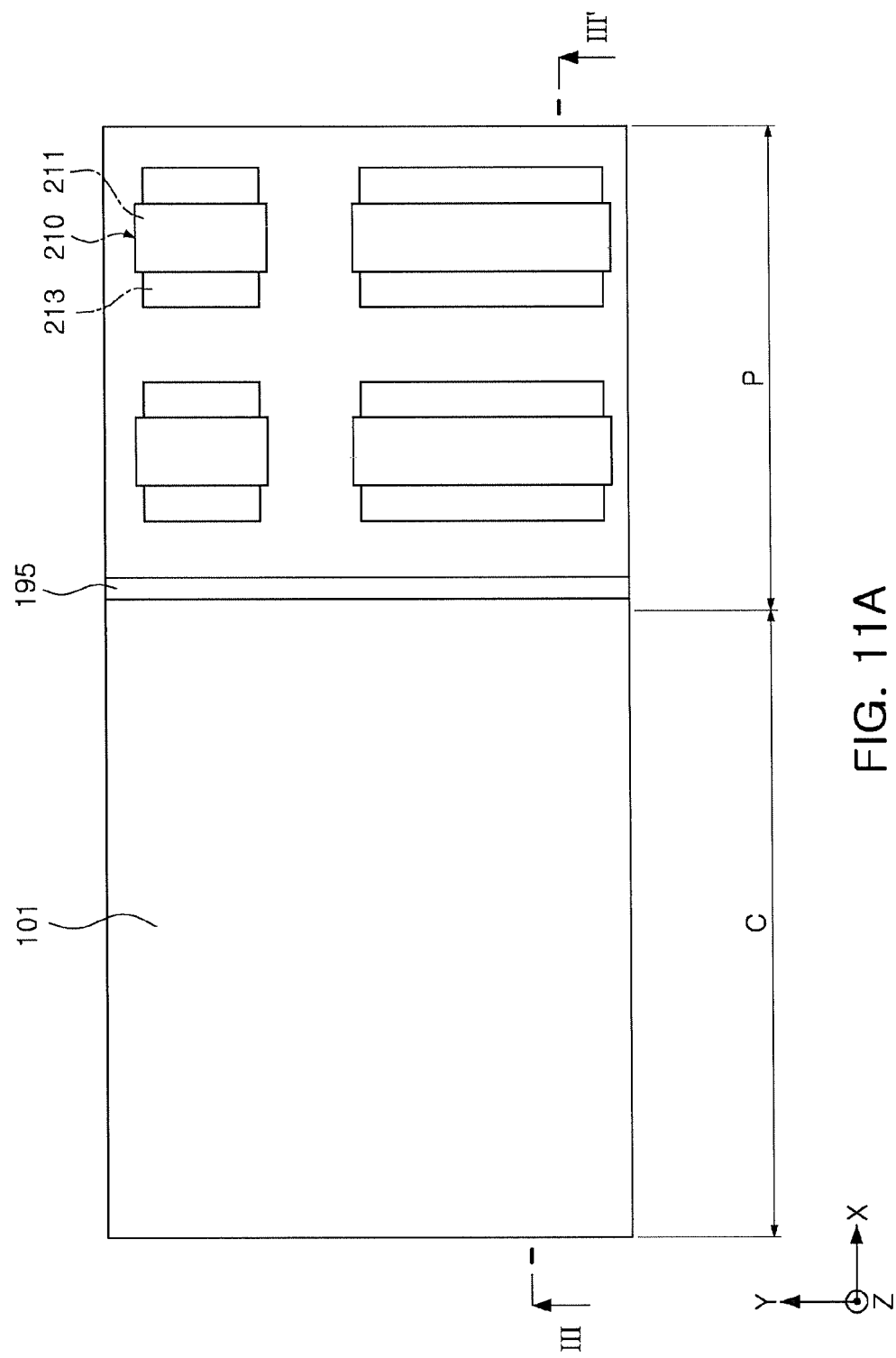
FIGS. 11A through 22B are views of a method of manufacturing the memory device illustrated in FIGS. 3 through 5, respectively.
Figure 11B:
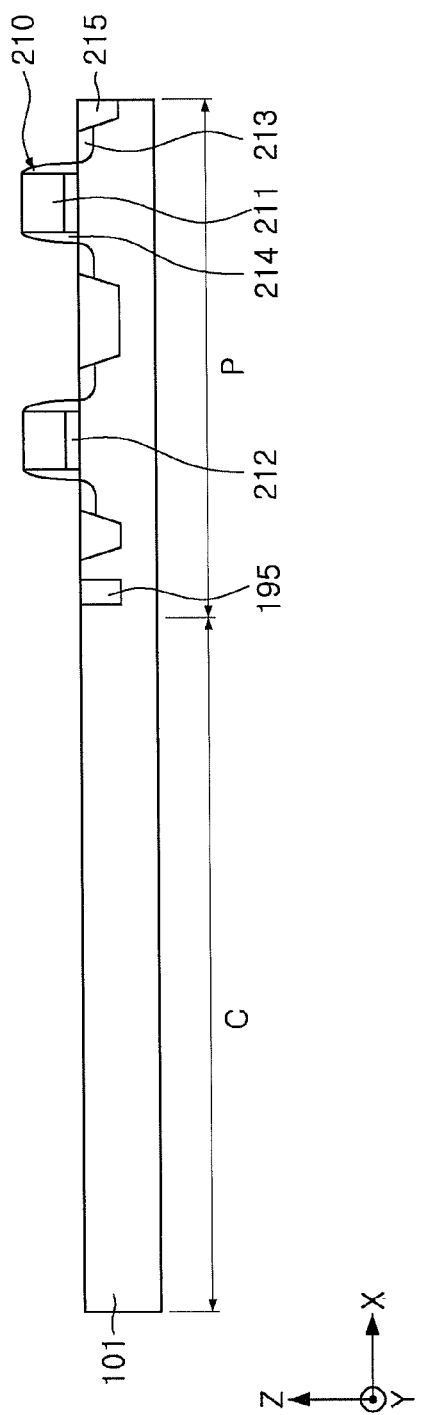

Referring to FIGS. 11A and 11B, the plurality of peripheral circuit devices 210 may be disposed on the substrate 101 in the peripheral circuit region P. FIG. 11B is a cross-sectional view taken along line III-III' of FIG. 11A. At least a portion of the plurality of peripheral circuit devices 210 may have different sizes. Each of the peripheral circuit devices 210 may be provided as a planar transistor, and may include the active regions 213, the planar gate electrode layer 211, and the planar gate insulating film 212. The planar gate electrode layer 211 may have the gate spacers 214 provided on the side surfaces thereof, respectively, and the active regions 213 may have the isolation layer 215 provided therebetween.

Meanwhile, the dummy trench 195 may be adjacent the border between the peripheral circuit region P and the cell region C. The dummy trench 195 may have the depth allowing the dummy trench 195 to be inserted into at least a portion of the substrate 101, and may have a line shape extending in the second direction (the Y-axis direction). FIGS. 11A and 11B illustrate the dummy trench 195 adjacent the border between the cell region C and the peripheral circuit region P to be included in the peripheral circuit region P, but in a different manner, may be included in the cell region C.

Figure 12B:
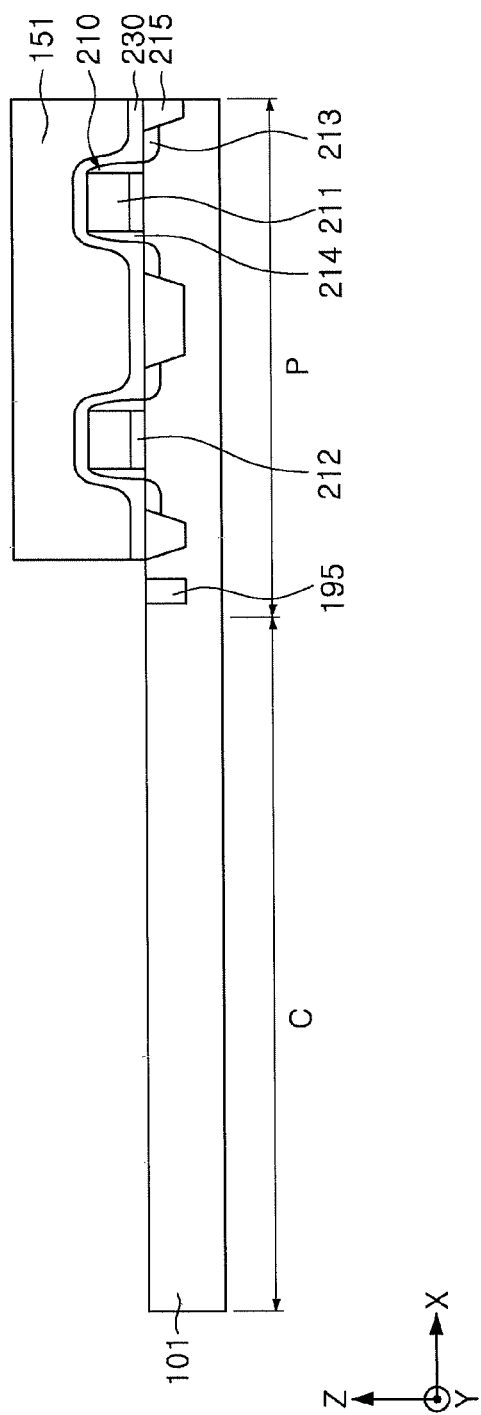

Referring to FIGS. 12A and 12B, the first interlayer insulating layer 151 may be formed. The first interlayer insulating layer 151 may cover the plurality of peripheral circuit devices 210 in the peripheral circuit region P. In order to fill a space between the plurality of peripheral circuit devices 210 and the substrate 101, the first interlayer insulating layer 151 may include an HDP oxide film having improved gap filling characteristics. The first interlayer insulating layer 151 may not cover the dummy trench 195.

Figure 13A:
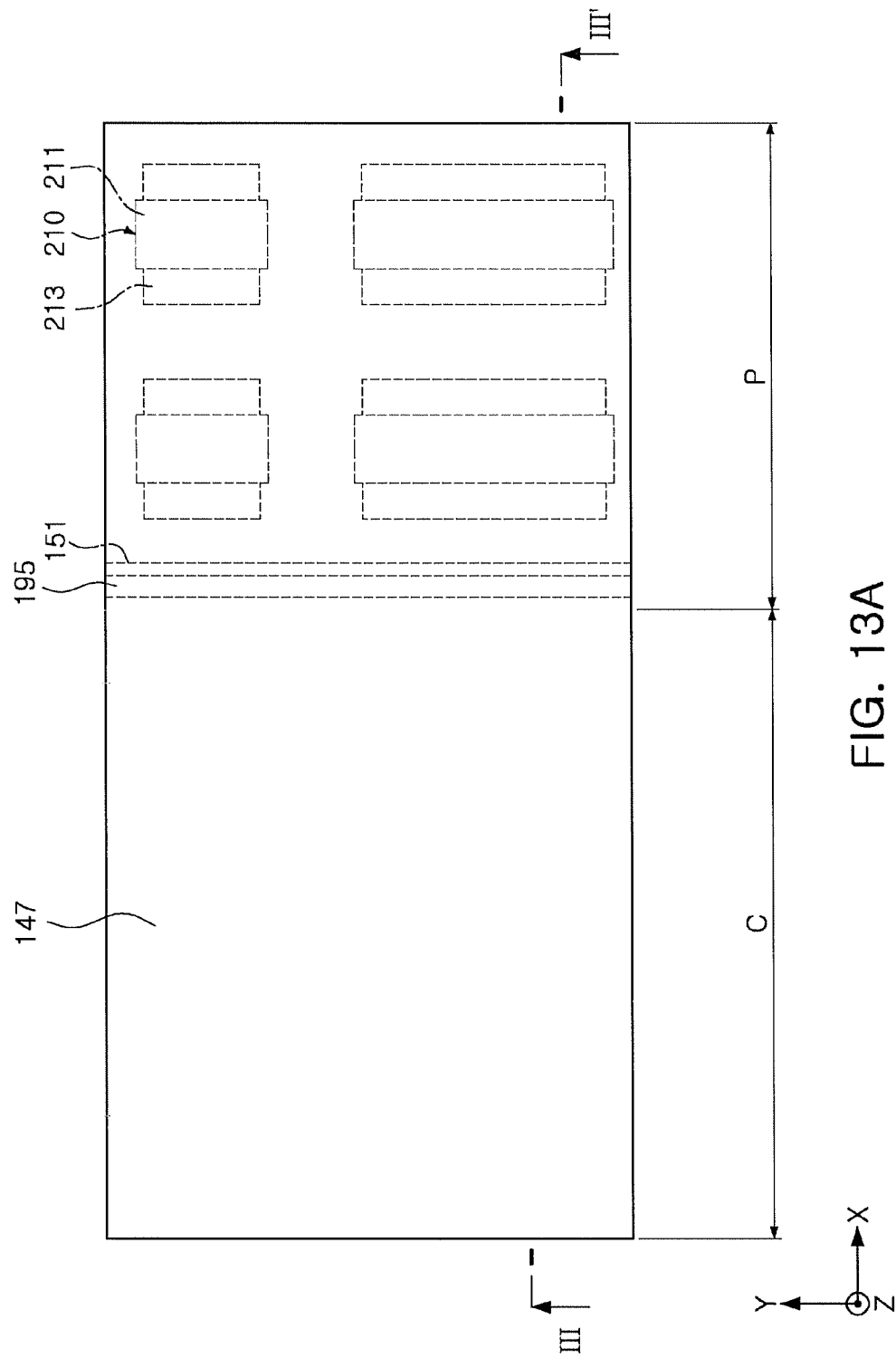
Figure 13B:
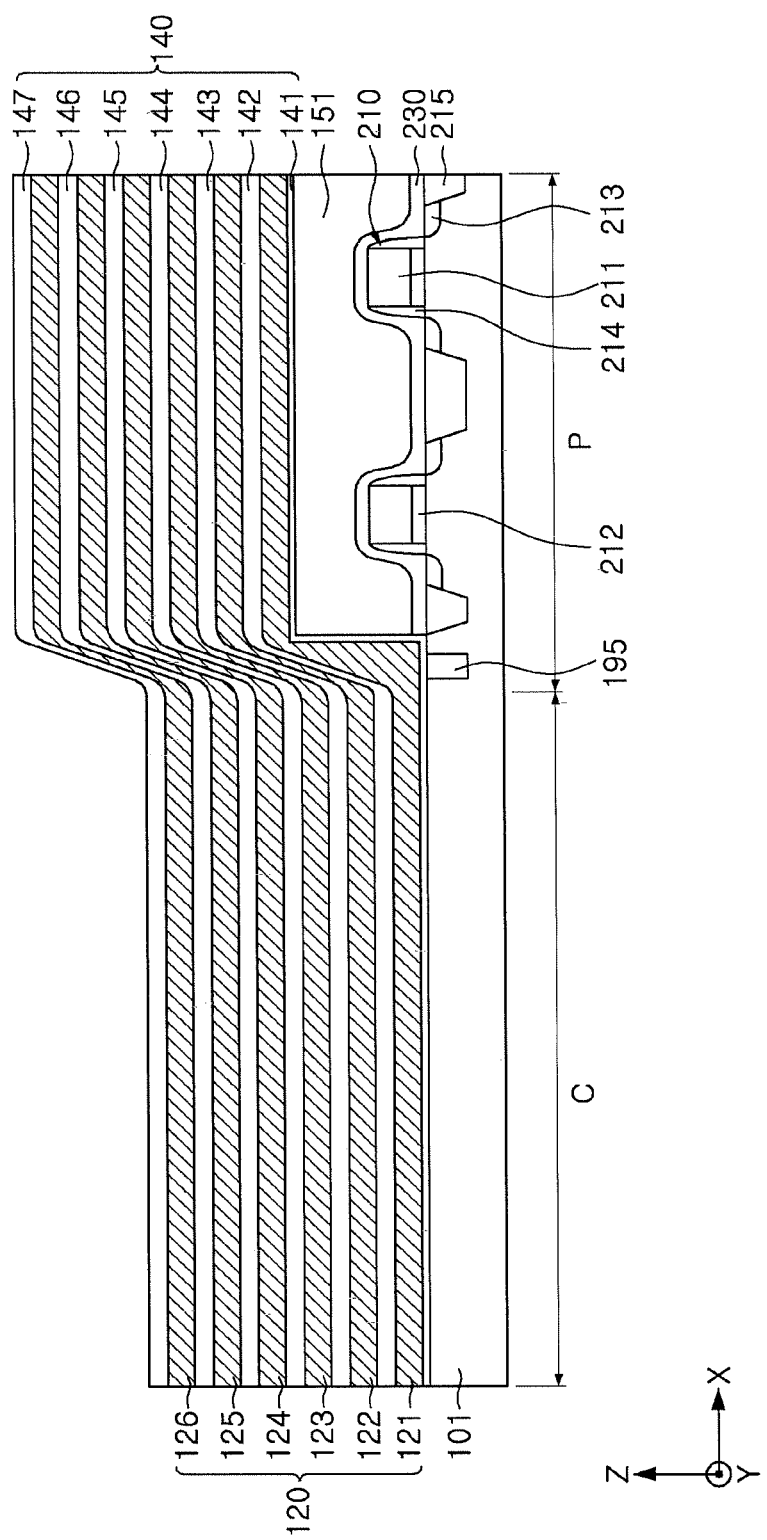

Referring to FIGS. 13A and 13B, a plurality of sacrificial layers 121 to 126 collectively represented by a sacrificial layer 120 and the plurality of insulating layers 141 to 147 collectively represented by the insulating layer 140 may be alternately stacked on the substrate 101. The sacrificial layer 120 and the insulating layer 140 may include a material having a predetermined etch selectivity ratio. As an example, when the sacrificial layer 120 includes a silicon nitride, the insulating layer 140 may include a silicon oxide. In FIGS. 13A and 13B, it is assumed that the sacrificial layer 120 may include the first to sixth sacrificial layers 121 to 126 and the insulating layer 140 may include the first to seventh insulating layers 141 to 147, but the numbers of the sacrificial layer 120 and the insulating layer 140 may be changed according to some embodiments.

Each of the sacrificial layer 120 and the insulating layer 140 may have the same or different thicknesses. Referring to FIG. 13B, the first insulating layer 141 positioned on the top of the insulating layer 140 in the stacking direction (the Z-axis direction) may have a relatively less thickness than that of the second to seventh insulating layers 142 to 147.

Figure 14B:
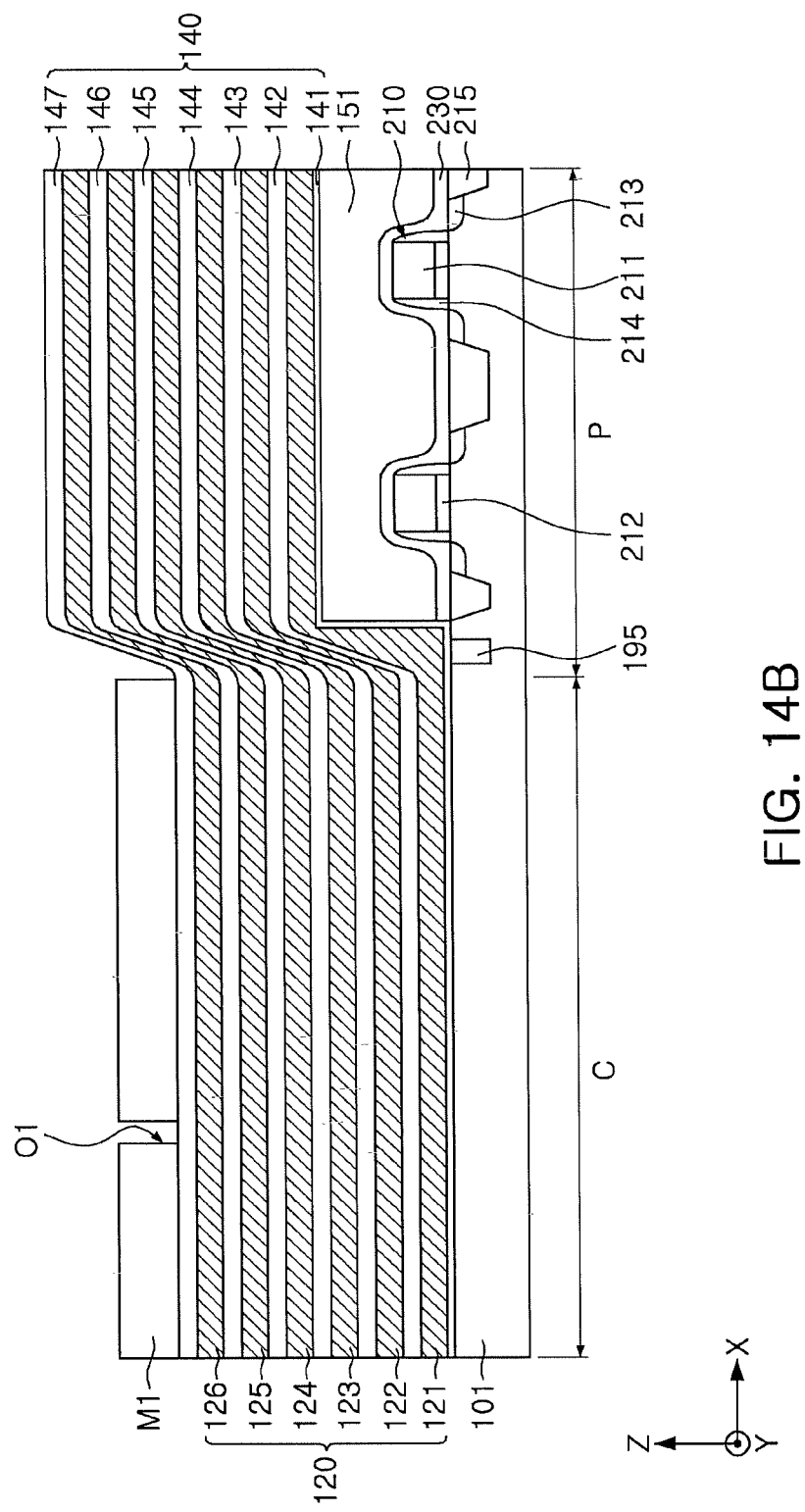

Referring to FIGS. 14A and 14B, when the sacrificial layer 120 and the insulating layer 140 are formed, a mask layer M1 may be formed thereon. The mask layer M1 may have a plurality of open regions O1, and the plurality of open regions O1 may allow an upper surface of the seventh insulating layer 147 to be externally exposed in the cell region C. The mask layer M1 may be formed only in the cell region C and may not be formed in the peripheral circuit region P.

Figure 15A:
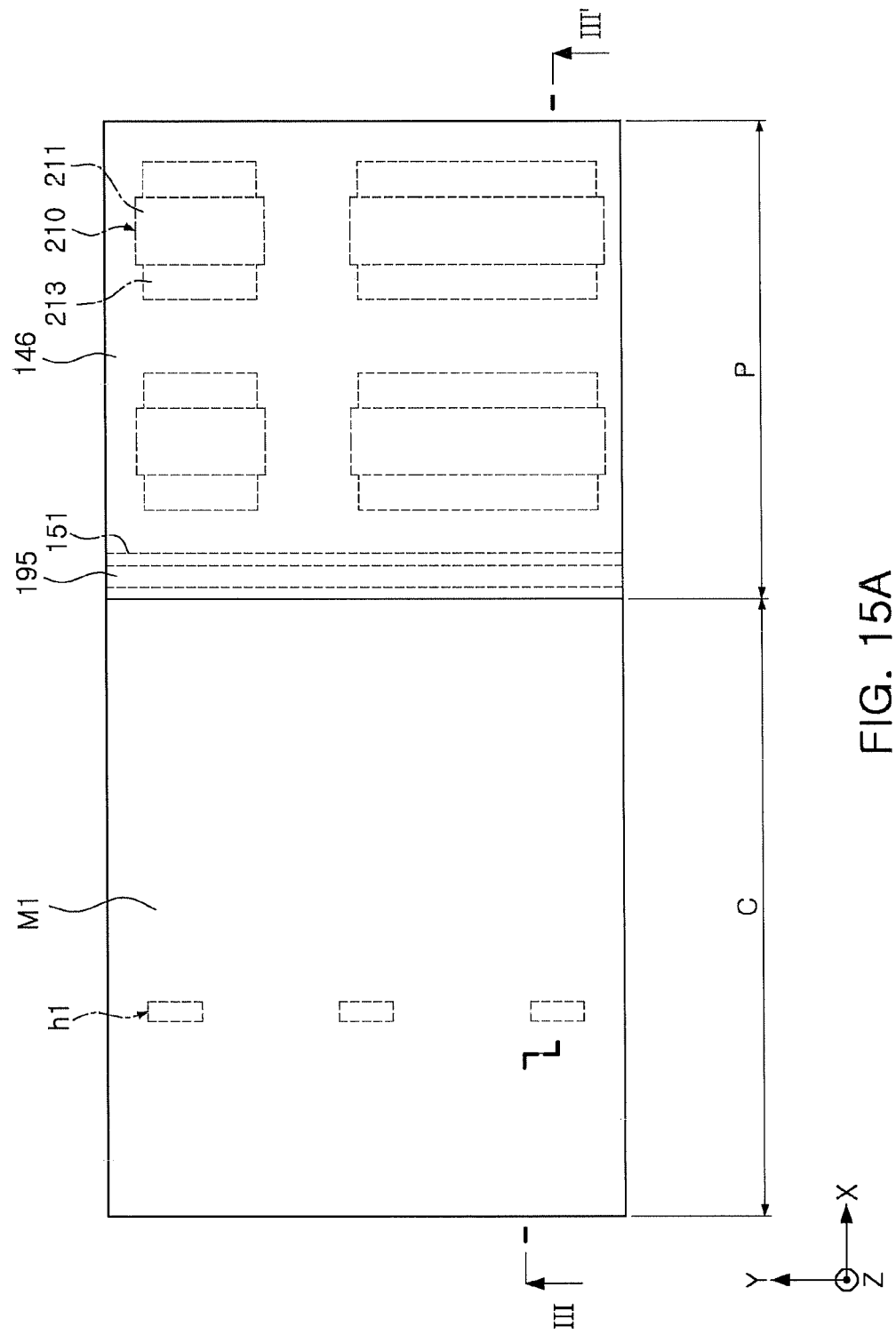
Figure 15B:
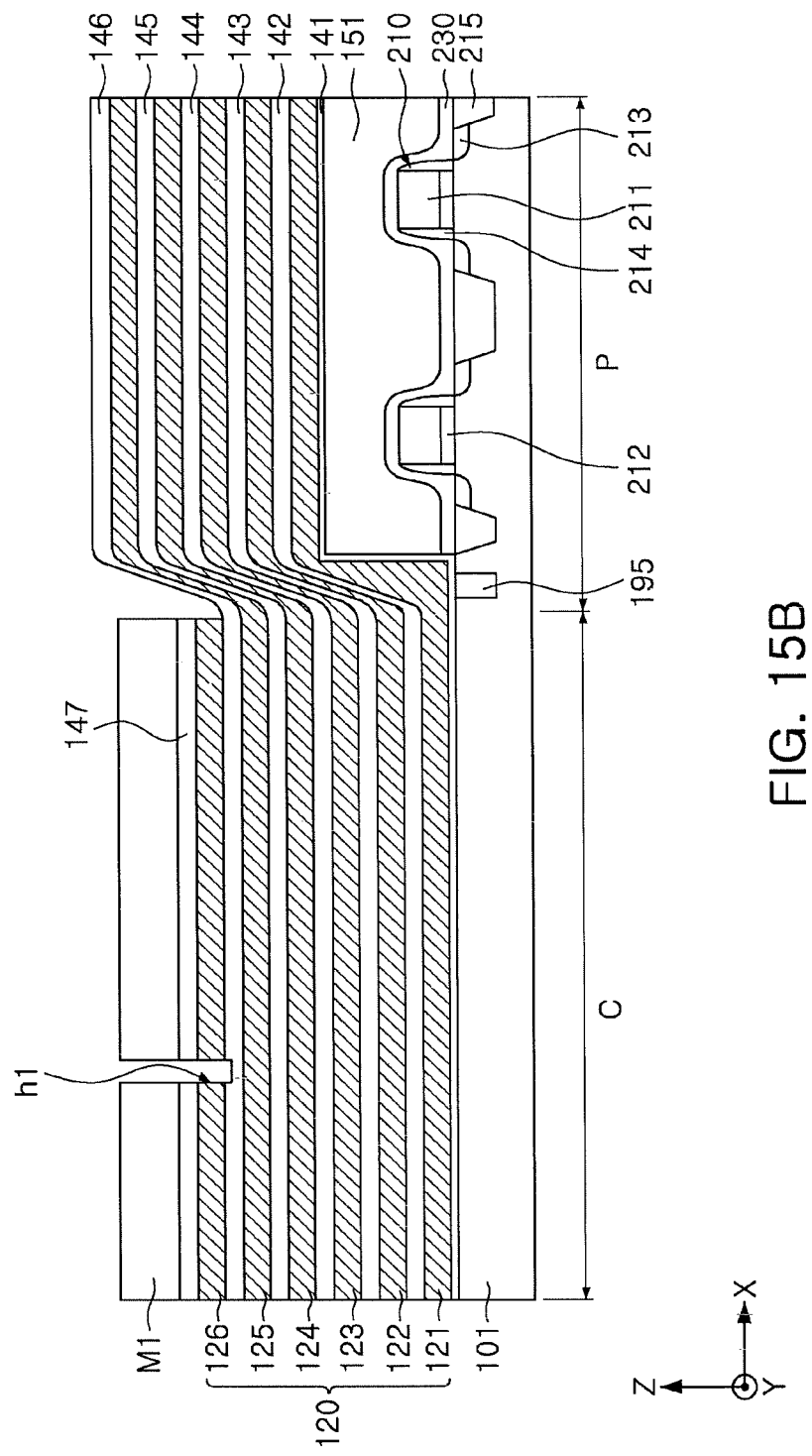

Referring to FIGS. 15A and 15B, an etching process may be performed using the mask layer M1. A portion exposed by the mask layer M1 may be removed by the etching process. As an example, as illustrated in FIGS. 15A and 15B, portions of the sixth sacrificial layer 126 positioned on the top of the sacrificial layer 120 and the seventh insulating layer 147 positioned on the top of the insulating layer 140 may be removed by the etching process. Therefore, an upper surface of the sixth insulating layer 146 may be externally exposed in a portion that may not be covered by the mask layer M1. When the etching process is completed, the mask layer M1 may be removed.

In this case, the portions of the sixth sacrificial layer 126 and the seventh insulating layer 147 removed by the open regions O1 of the mask layer M1 may allow a plurality of trenches h1 to be formed. The trenches h1 may be filled with an insulating material in a subsequent process, and the insulating material provided in the trenches h1 may be provided as the vertical insulating layer 190 illustrated in FIGS. 3 through 5.

Figure 16A:
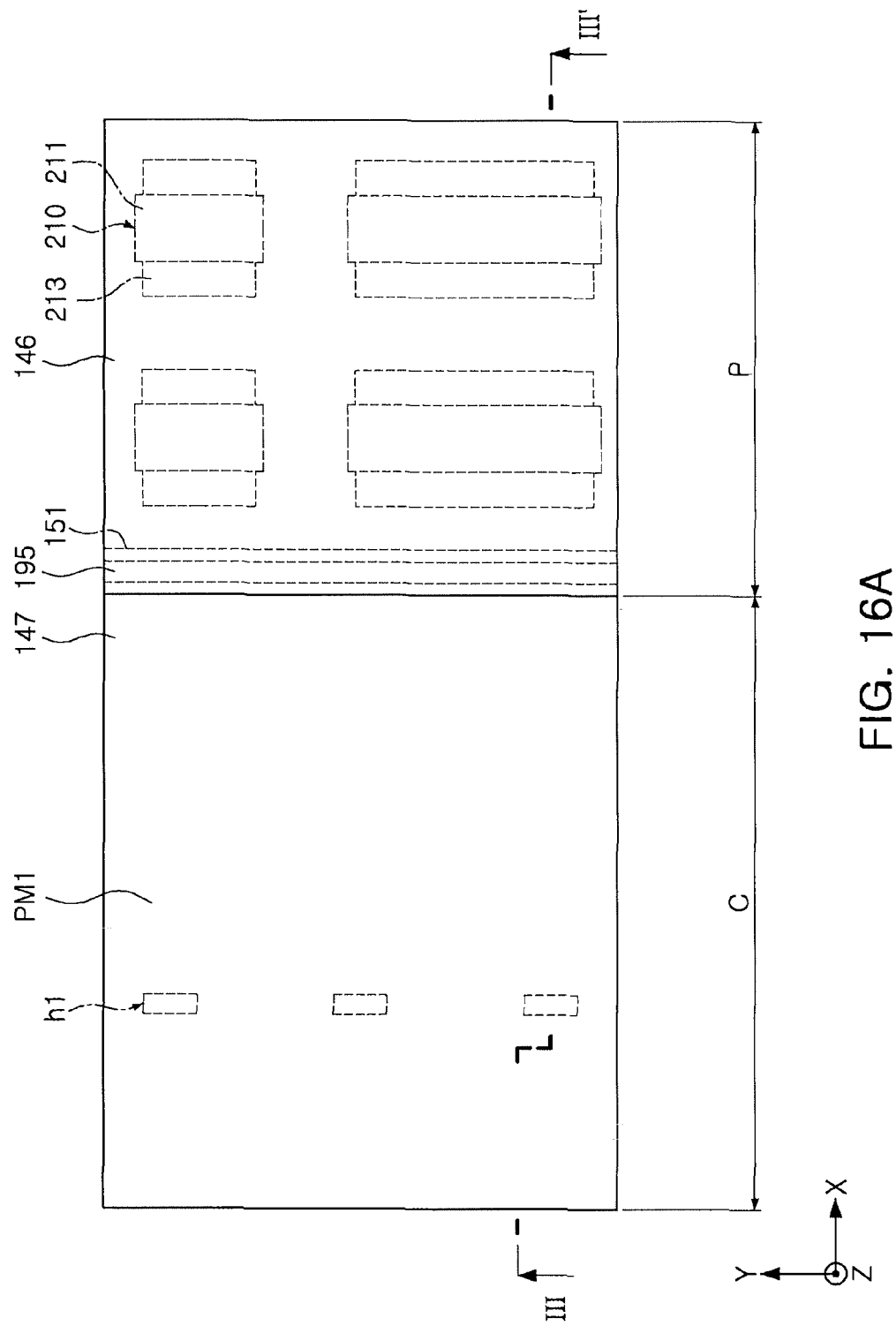
Figure 16B:
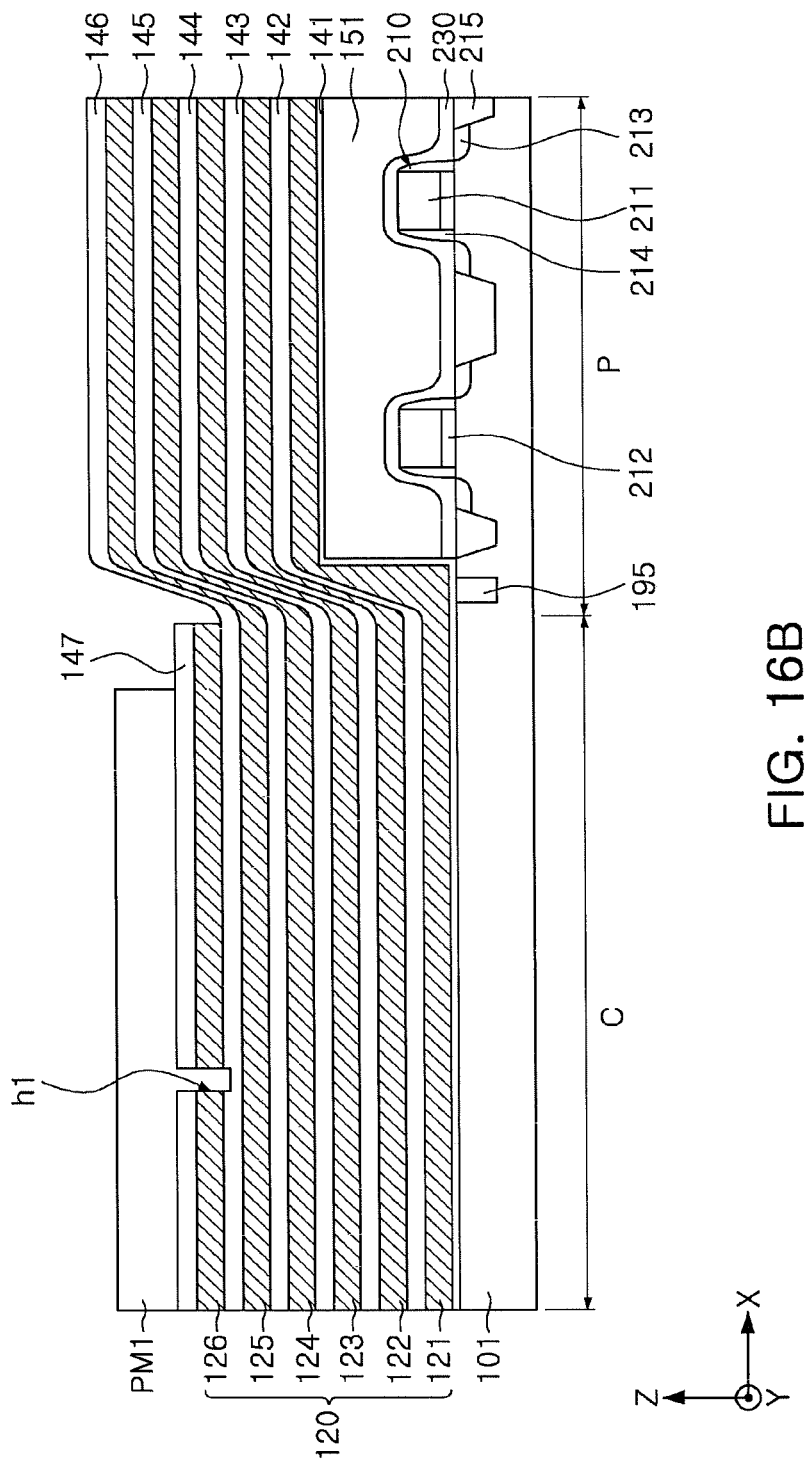
Figure 17A:
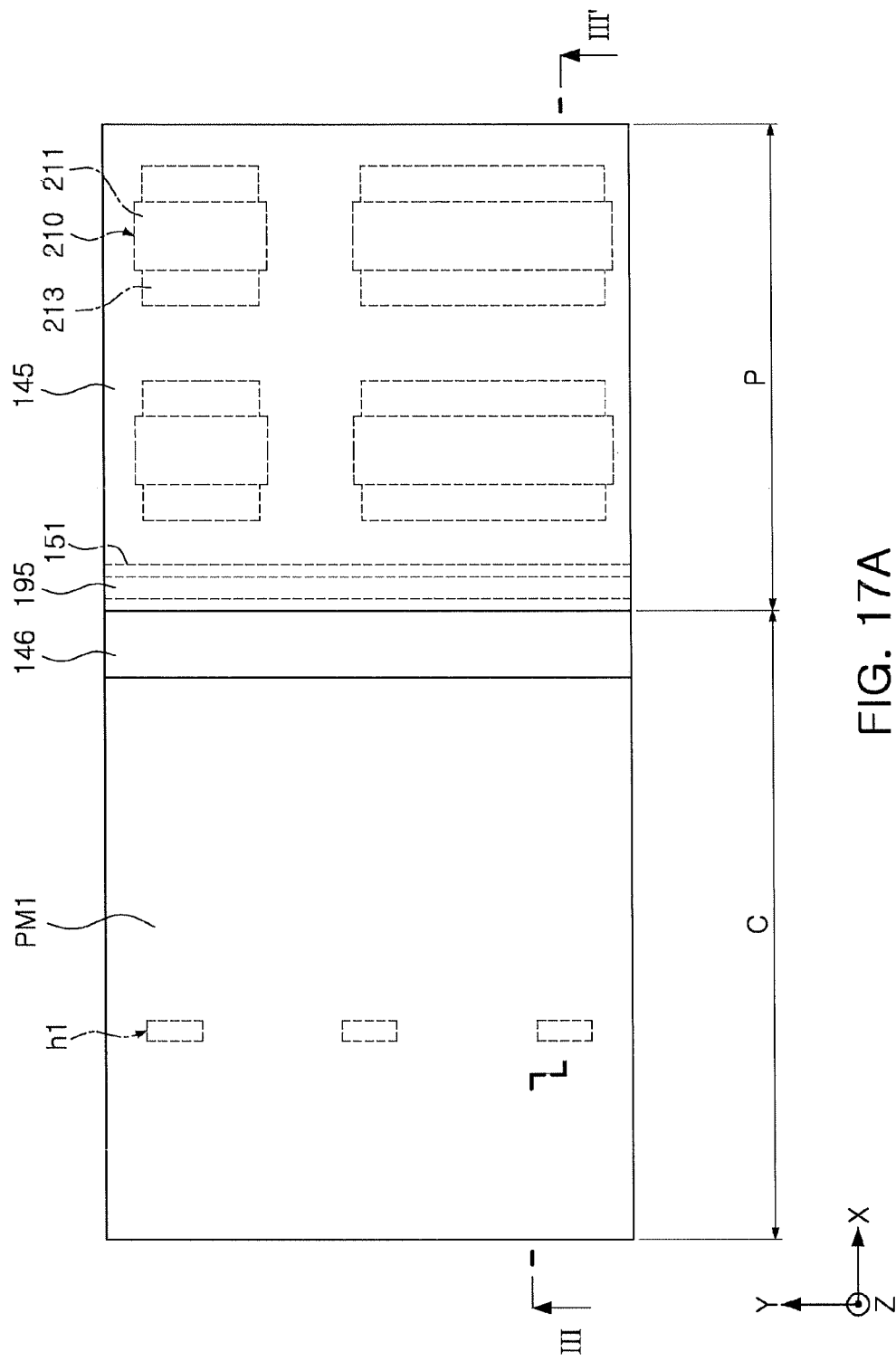
Figure 17B:
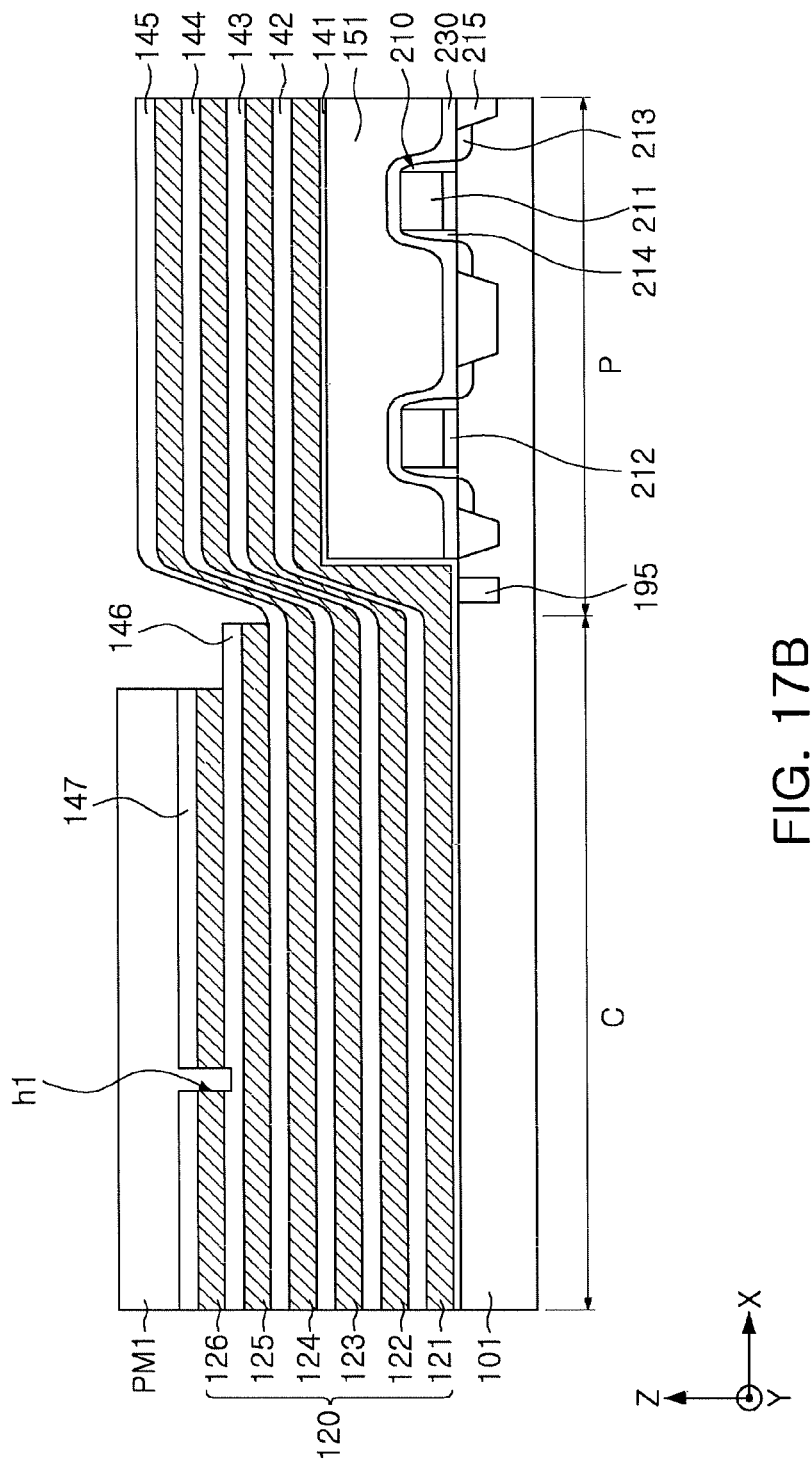

Referring to FIGS. 16A and 16B, a mask pattern PM1 may be formed on a portion of the upper surface of the seventh insulating layer 147. The mask pattern PM1 may fill the plurality of trenches h1, and may allow the portion of the upper surface of the seventh insulating layer 147 to be exposed. Referring to FIGS. 17A and 17B, portions of the sacrificial layer 120 and the insulating layer 140 may be etched in the portion exposed by the mask pattern PM1. In this case, the portions of a pair of each of the sacrificial layers 121 to 126 and each of the insulating layers 141 to 147 that are adjacent one another in the stacking direction of the sacrificial layer 120 and the insulating layer 140 may be removed. In more detail, as illustrated in FIGS. 17A and 17B, portions of the fifth and sixth sacrificial layers 125 and 126 and the sixth and seventh insulating layers 146 and 147 may be removed in the portion exposed by the mask pattern PM1. Therefore, in the portion exposed by the mask pattern PM1, a portion of the upper surface of the sixth insulating layer 146 and a portion of an upper surface of the fifth insulating layer 145 may be exposed.

Figure 18A:
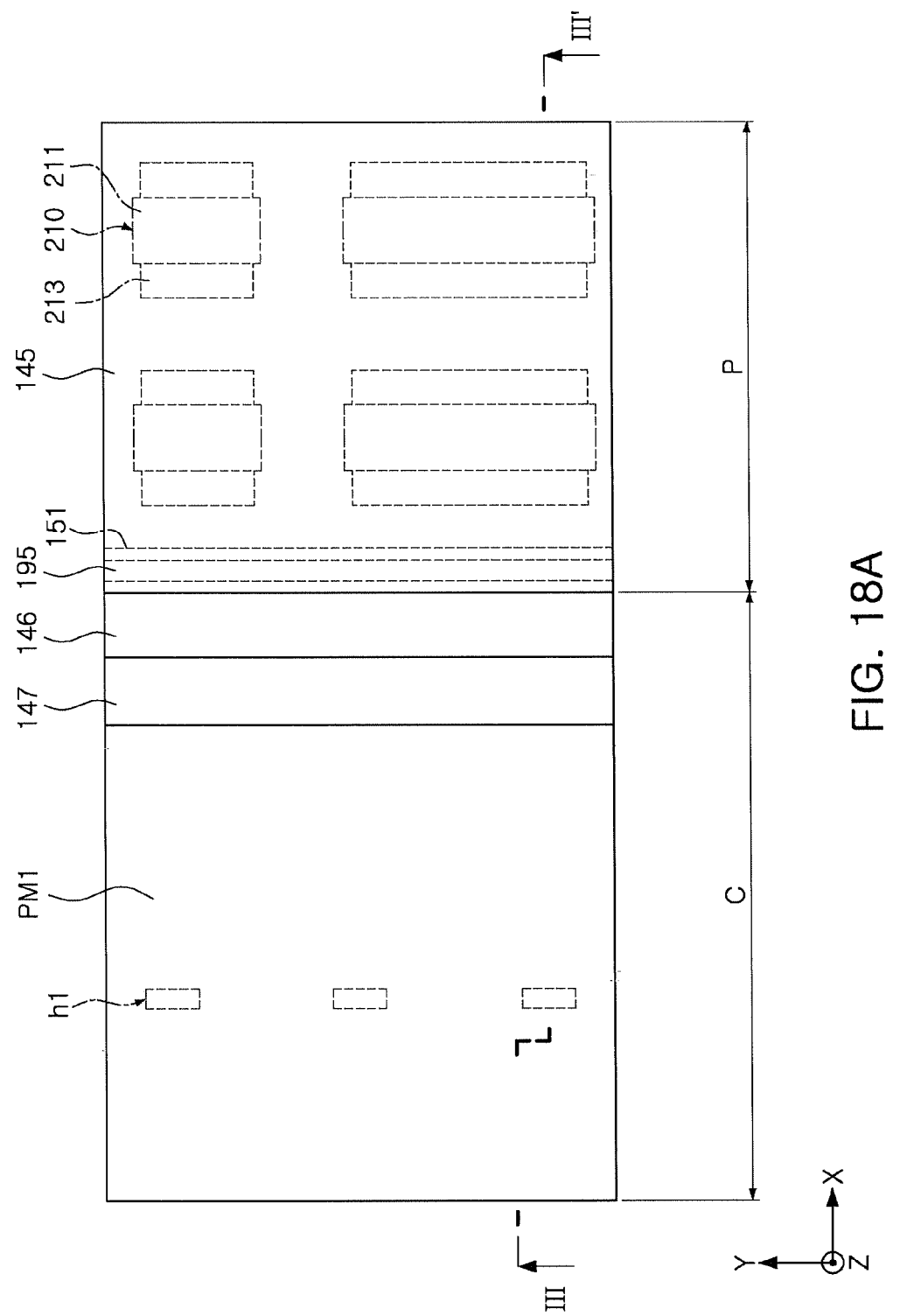
Figure 18B:
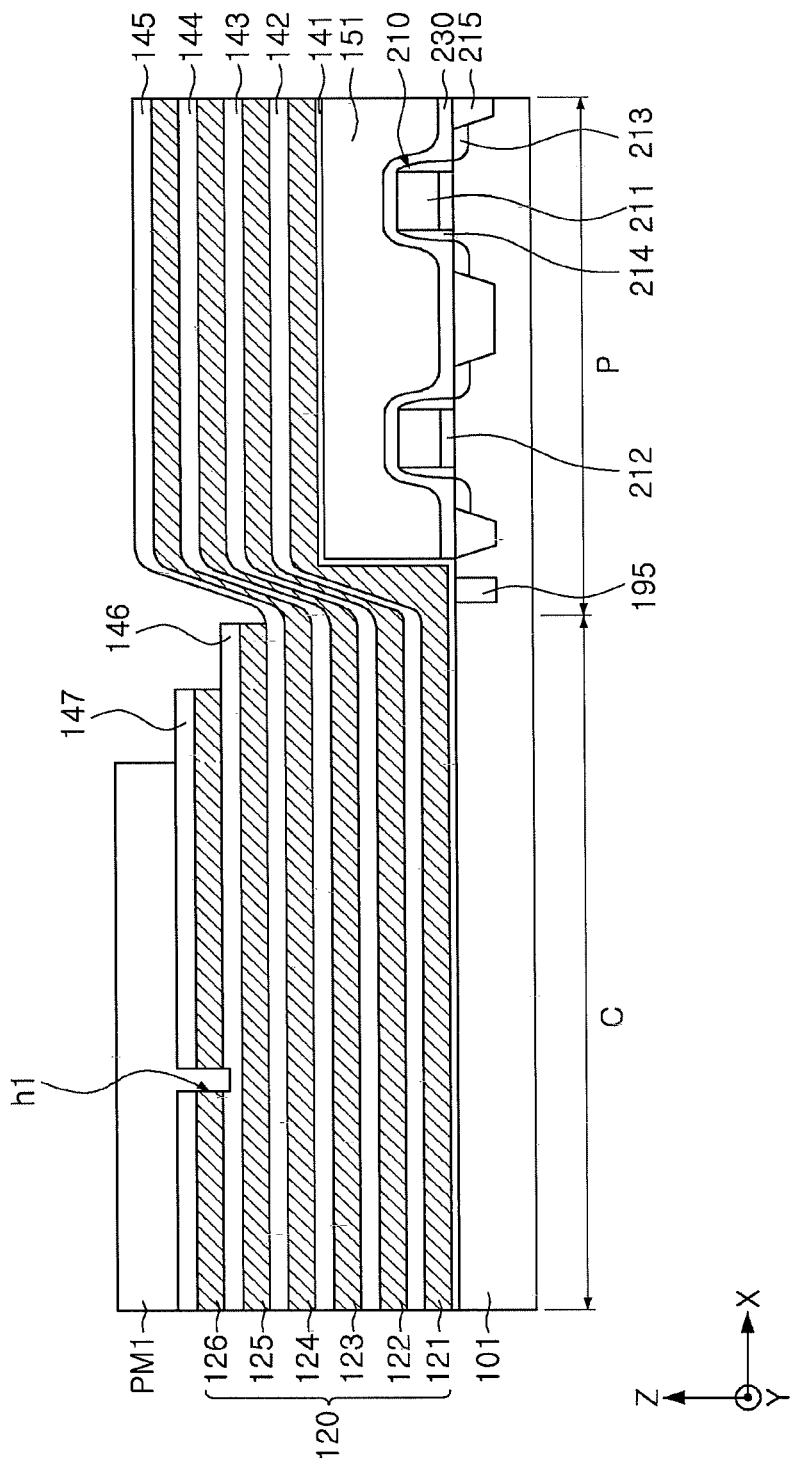

Referring to FIGS. 18A and 18B, the mask pattern PM1 may be trimmed. By trimming the mask pattern PM1, a portion of the upper surface of the seventh insulating layer 147 may be repeatedly exposed. When the mask pattern PM1 is trimmed, a length of the mask pattern PM1 in the first direction (the X-axis direction) and a thickness of the mask pattern PM1 may be reduced.

Figure 19A:
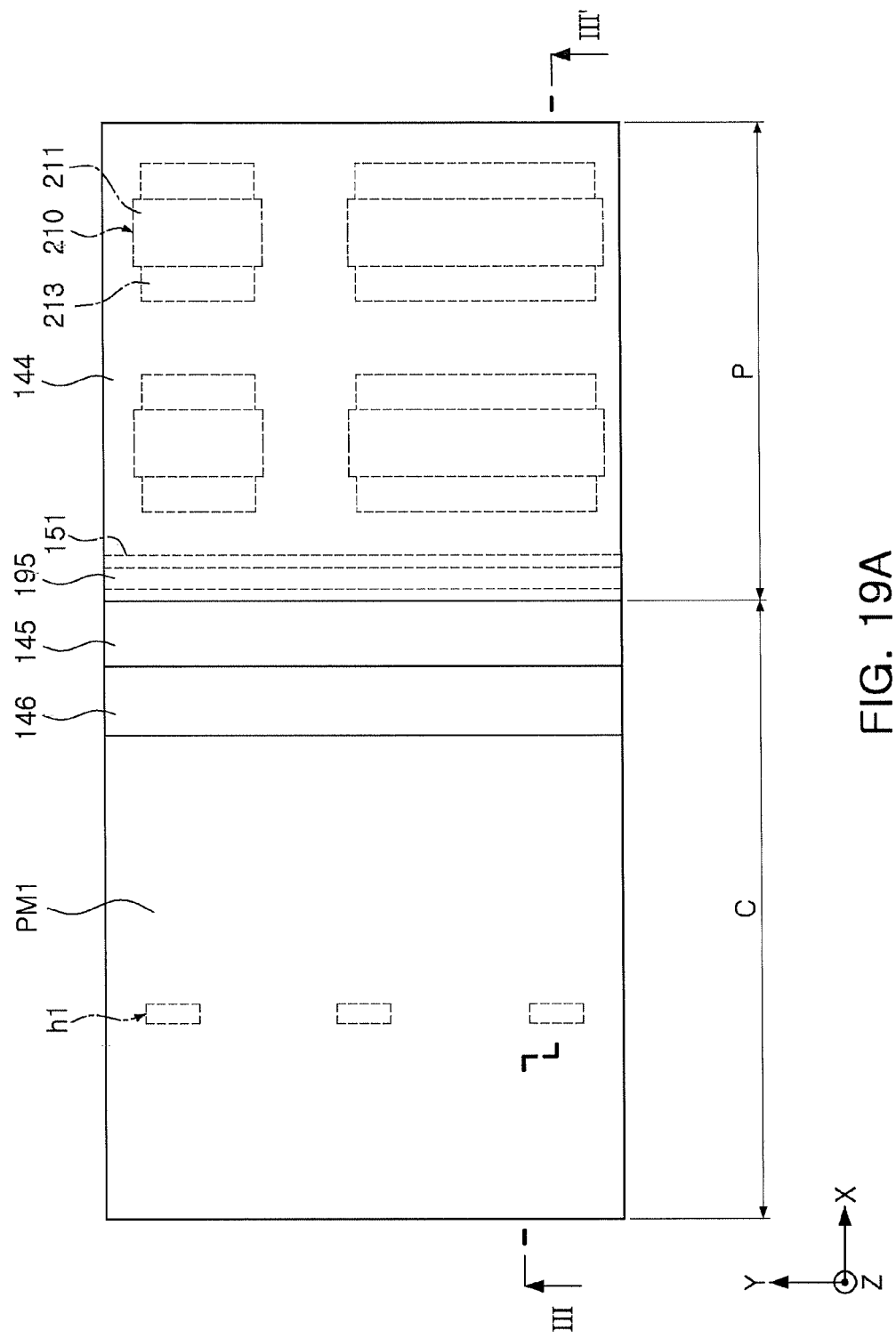
Figure 19B:
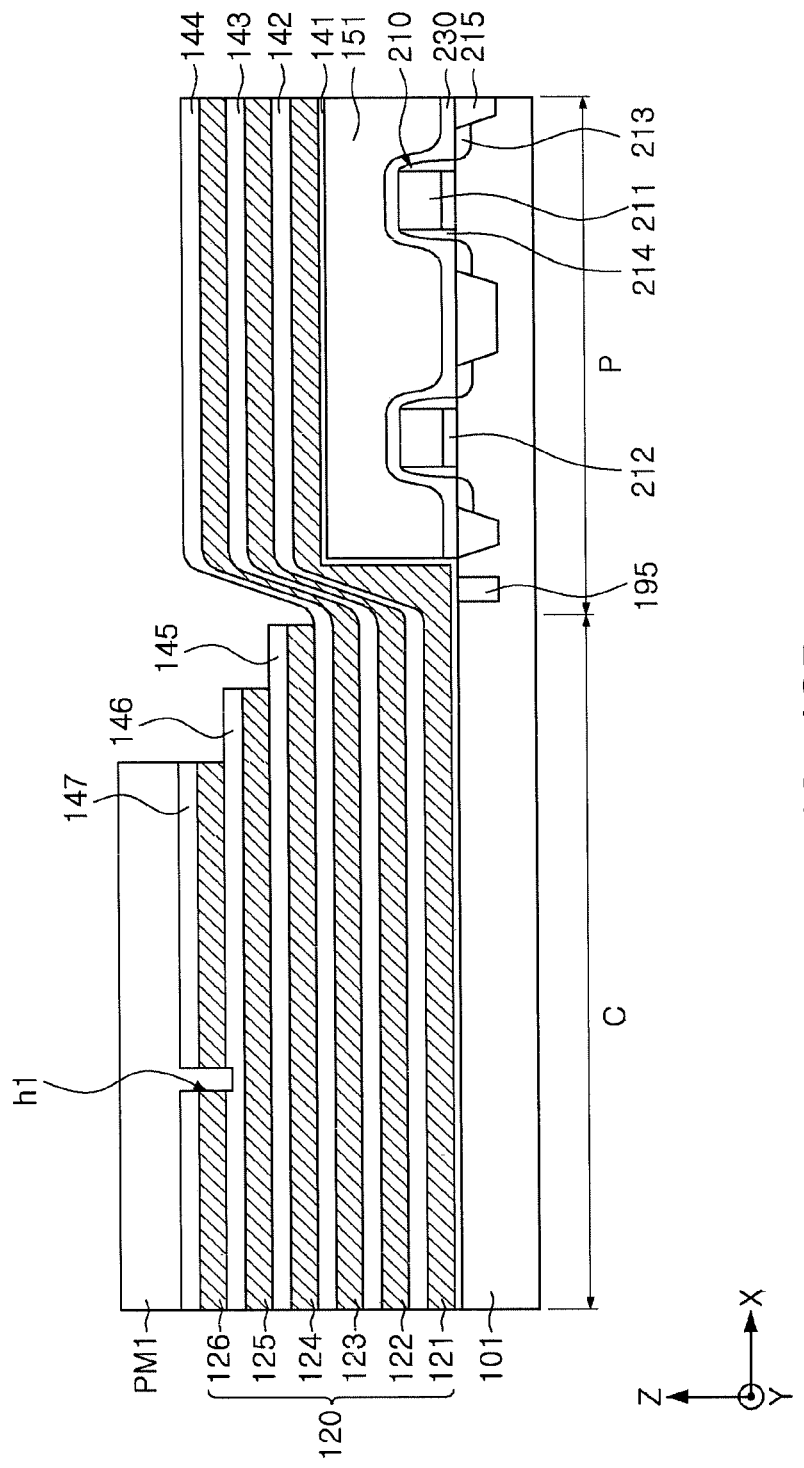

Referring to FIGS. 19A and 19B, portions of the sacrificial layer 120 and the insulating layer 140 may be etched in the portion exposed by the trimmed mask pattern PM1. In this case, as illustrated in FIGS. 17A and 17B, the portions of a pair of each of the sacrificial layers 121 to 126 and each of the insulating layers 141 to 147 may be removed in the portion exposed by the mask pattern PM1. Therefore, as illustrated in FIGS. 19A and 19B, portions of upper surfaces of the fourth to sixth sacrificial layers 144, 145, and 146 may be externally exposed.

Figure 20A:
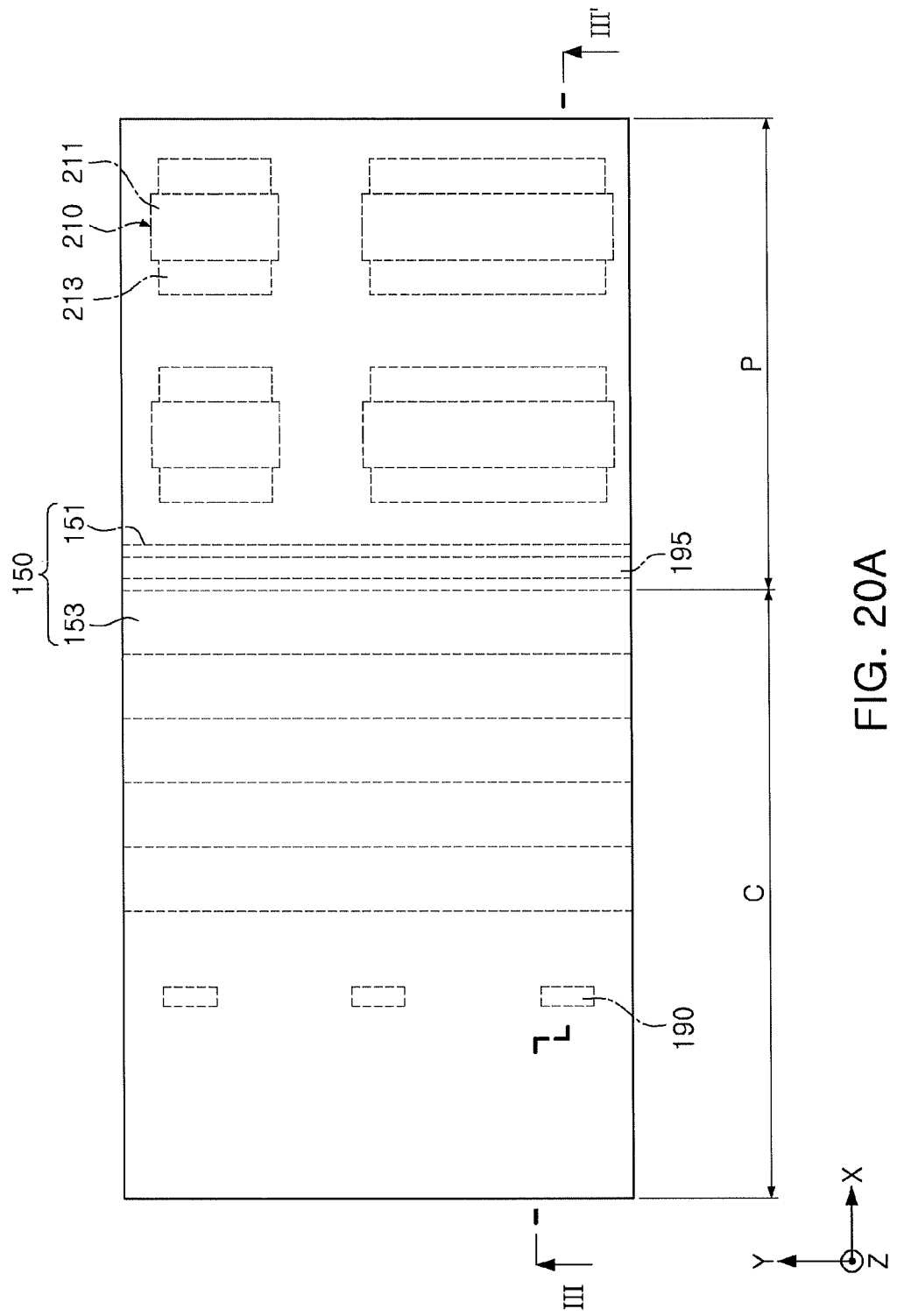
Figure 20B:
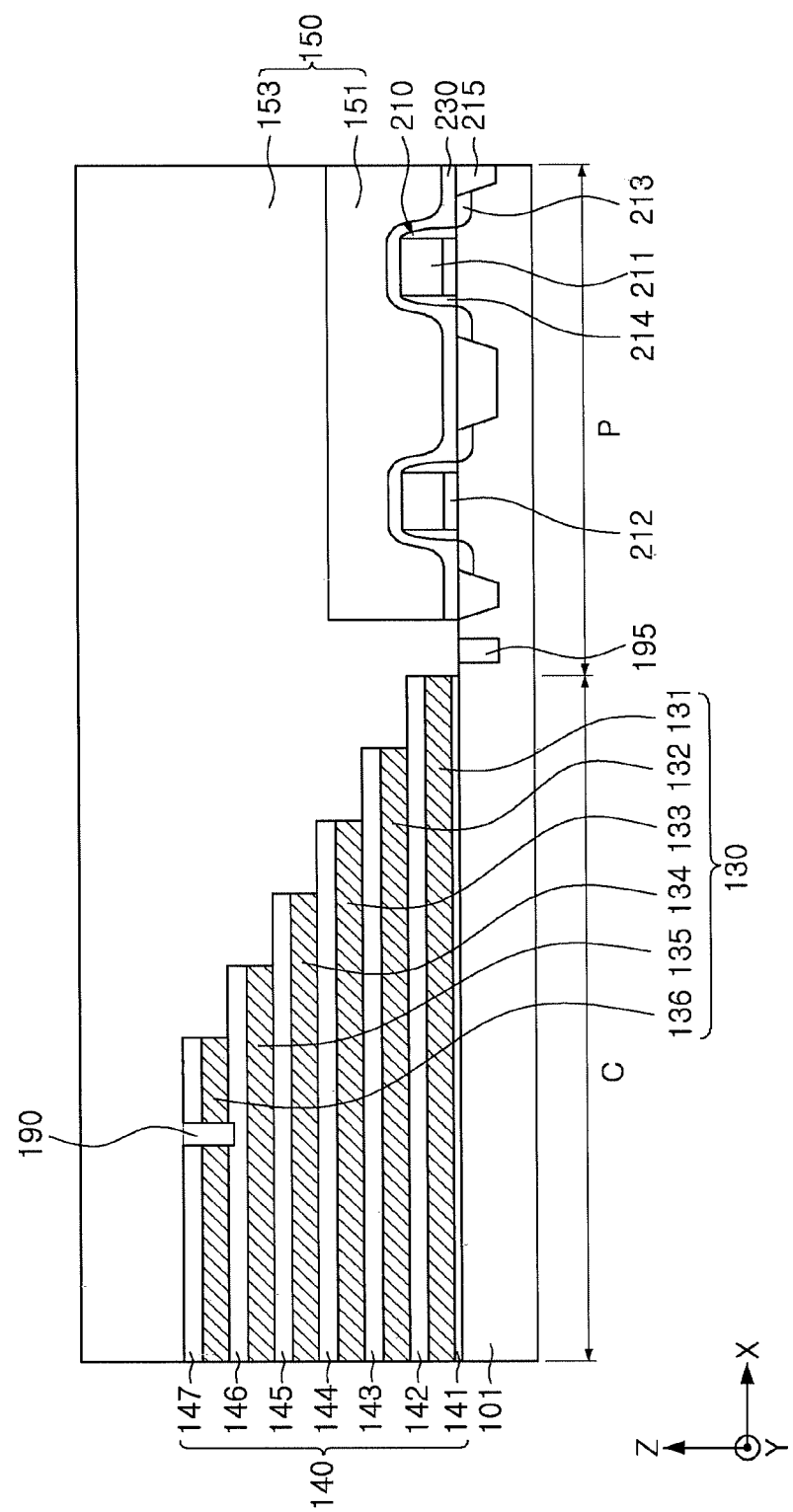

By repeating the processes described with reference to FIGS. 16A through 19B, the sacrificial layer 120 and the insulating layer 140 may be formed to have a structure illustrated in FIGS. 20A and 20B. The sacrificial layer 120 and the insulating layer 140 may have the second interlayer insulating layer 153 disposed thereon. The second interlayer insulating layer 153 may account for a relatively greater volume than that of the first interlayer insulating layer 151, and may thus include a TEOS oxide film having a high deposition rate. A process of forming the second interlayer insulating layer 153 may allow the vertical insulating layer 190 to be formed.

In more detail, the vertical insulating layer 190 may be formed by filling the trenches h1 with the insulating material. As described above, the trenches h1 may be formed when the sixth sacrificial layer 126 positioned on the top of the sacrificial layer 120 and the seventh insulating layer 147 positioned on the top of the insulating layer 140 are removed by the etching process using the mask layer M1. Therefore, the thickness of the vertical insulating layer 190 may be substantially the same as a sum of a thickness of the sixth sacrificial layer 126 positioned on the top of the sacrificial layer 120 and a thickness of the seventh insulating layer 147 positioned on the top of the insulating layer 140.

Meanwhile, when the processes as described above with reference to FIGS. 16A through 19B are repeated, a length L of each of the pad regions may be determined according to lengths of the mask pattern PM1 trimmed in the first direction (the X-axis direction). The length L of each of the pad regions may be properly selected in consideration of the numbers of the sacrificial layer 120 and the insulating layer 140, a size of the memory device 100, and the like. When the lengths L of the pad regions are excessively short or have a great variation therein, a defect or the like in which the cell contact plug 180 formed later is electrically connected to two or more of the gate electrode layers 131 to 136 may occur.

According to some embodiments, the lengths L of the pad regions may be controlled using the trenches h1 for forming the vertical insulating layer 190 as a certain reference position. As described above, the lengths L of the pad regions may be determined according to the lengths of the mask pattern PM1 trimmed in the first direction. According to the example embodiment, when the processes described with reference to FIGS. 16A through 19B are performed, the length of the mask pattern PM1 trimmed in the first direction may be controlled using the trenches h1 as the reference position. Therefore, while the process of forming the pad regions is carried out, the lengths L of the pad regions may be checked, and the occurrence of defects may be prevented and managed more efficiently.

In a general manufacturing process, the trenches h1 and the vertical insulating layer 190 may not be formed, and the lengths L of the pad regions may be measured based on the dummy trench 195. In this case, after all of the pad regions are formed, the lengths L of the pad regions may be measured based on the dummy trench 195, and it may thus be difficult to determine defect occurrence probability while the process of forming the pad regions is performed. According to some embodiments, while the process of forming the pad regions is performed, the lengths L of the pad regions may be predicted based on the trenches h1 and the occurrence of defects may be prevented.

Meanwhile, the trenches h1 may also be formed by a different process. According to some embodiments, unlike the embodiments illustrated in FIGS. 14A and 14B, the mask layer M1 may be formed across the cell region C and the peripheral circuit region P. In more detail, the mask layer M1 may cover the sacrificial layer 120 and the insulating layer 140 in the peripheral circuit region P as well as the cell region C. The mask layer M1 may be provided in such a shape to form only the trenches h1, and the mask pattern PM1 may then be provided to form the pad regions through repeating the etching and trimming processes. According to some embodiments as described above, the trenches h1 may not be formed along with the pad regions, and depths of the trenches h1 may be changed.

Figure 21A:
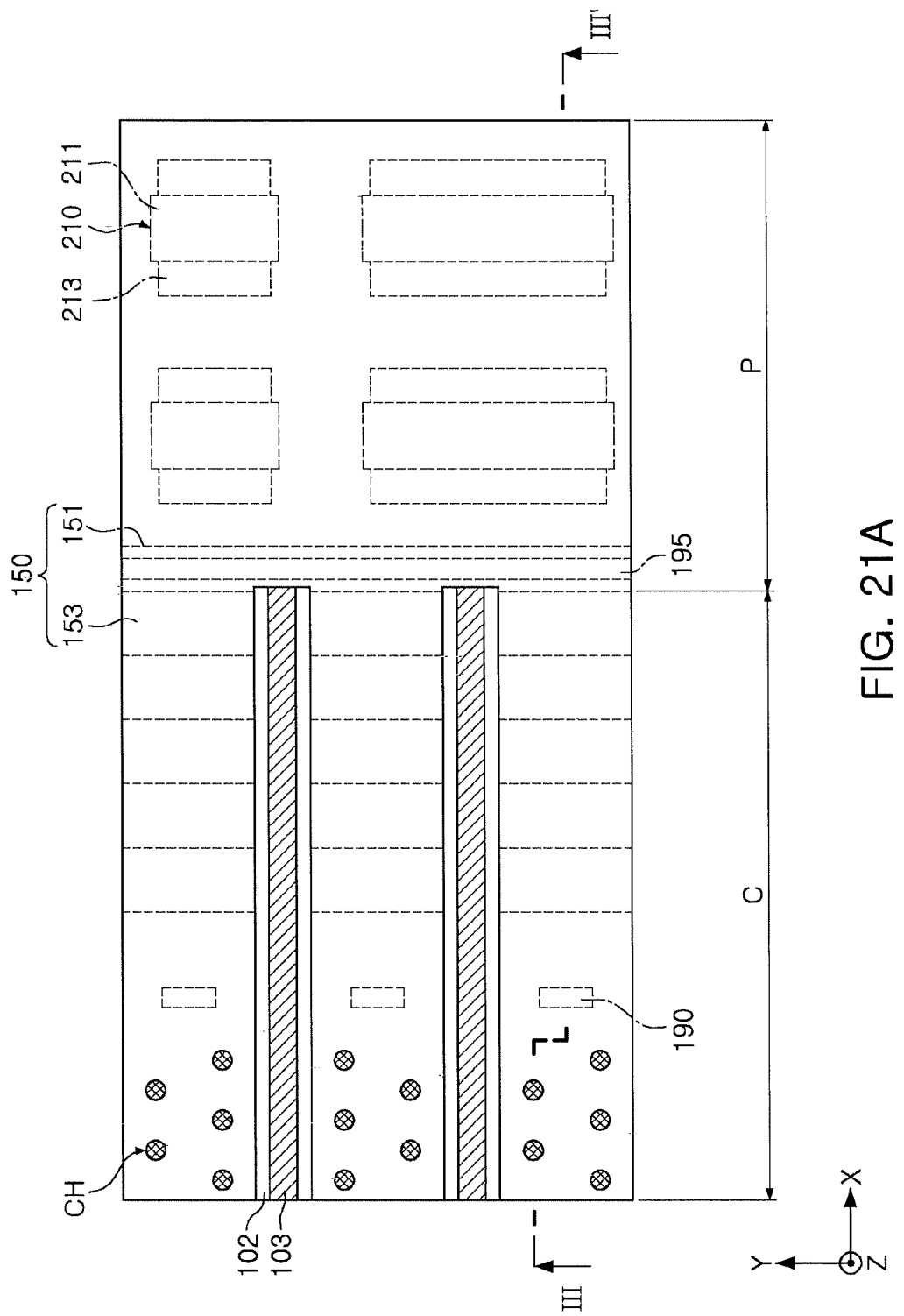
Figure 21B:
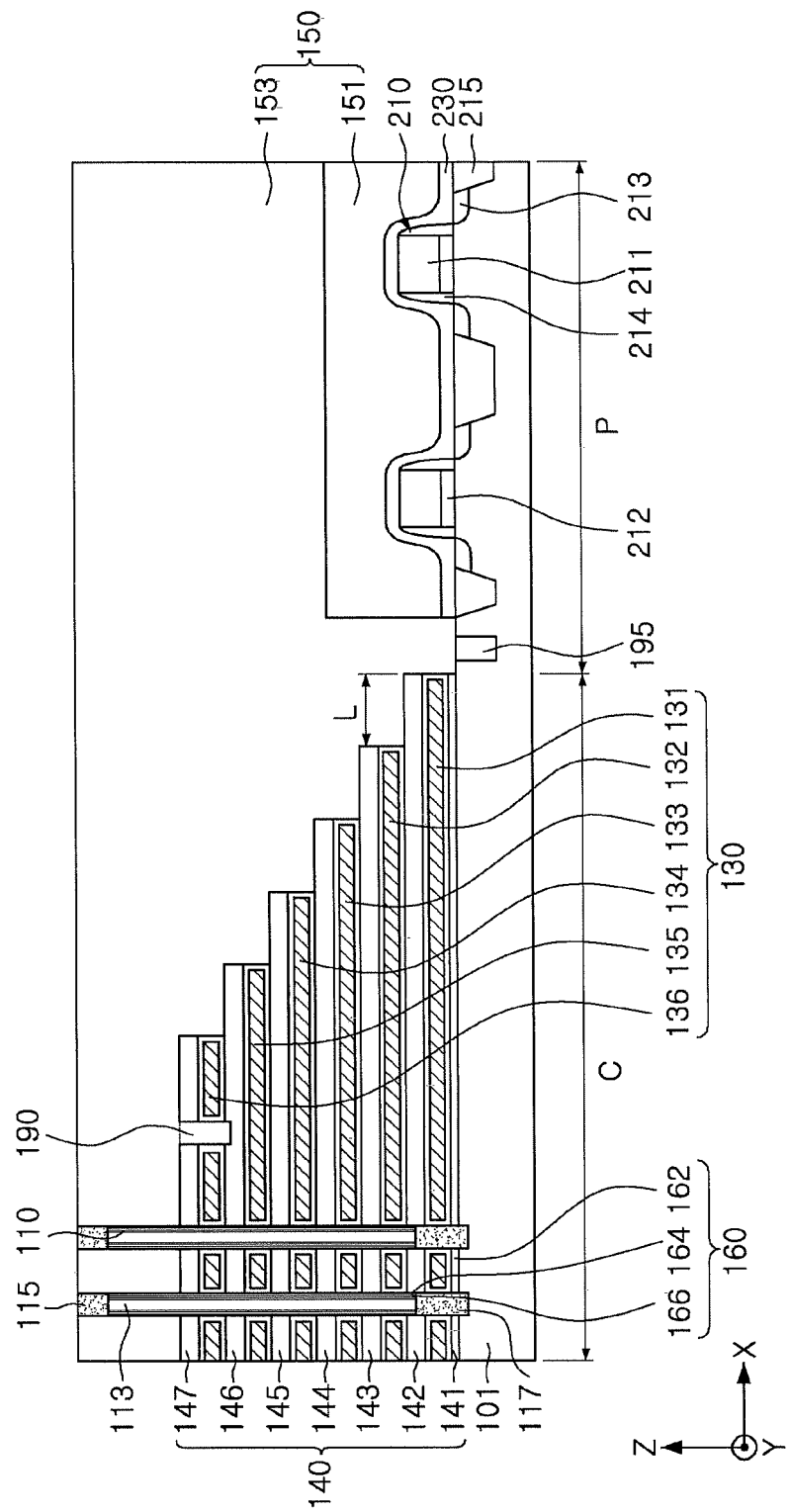

Referring to FIGS. 21A and 21B, the channel regions CH may be formed. The channel regions CH may extend in the direction (the Z-axis direction) perpendicular to the upper surface of the substrate 101, and may include the channel layers 110, respectively. Each of the channel layers 110 may have an annular shape having a hollow, and may have the embedded insulating layer 113 provided therein. The conductive layer 115 provided on each of the channel layers 110 may be connected to the bit line BL to be provided as the drain region of the memory cell array.

An epitaxial layer 117 may be provided below each of the channel layers 110. The epitaxial layer 117 may be formed by forming openings for forming the channel regions CH and performing a selective epitaxial process using the upper surface of the substrate 101, exposed by the openings, as a seed layer. Prior to the formation of the channel layers 110, portions 164 and 166 of the gate insulating film may also be formed in a direction parallel to each of the channel layers 110.

When the channel regions CH are formed, openings for forming the isolation insulating layers 102 and the common source lines 103 may be provided, and the sacrificial layer 120 may be removed through the openings. Portions from which the sacrificial layers 121 to 126 are removed may be filled with the gate electrode layers 131 to 136 collectively represented by the gate electrode layer 130. According to some embodiments, prior to the formation of the gate electrode layer 130, a portion of the gate insulating film, for example, the blocking layer 162, may be formed. Therefore, as illustrated in FIG. 20B, the blocking layer 162 may also surround the gate electrode layer 130. The blocking layer 162 surrounding the gate electrode layer 130 may also be disposed between the vertical insulating layer 190 and the gate electrode layer 130. After the formation of the gate electrode layer 130, the isolation insulating layers 102 and the common source lines 103 may be formed.

Figure 22A:
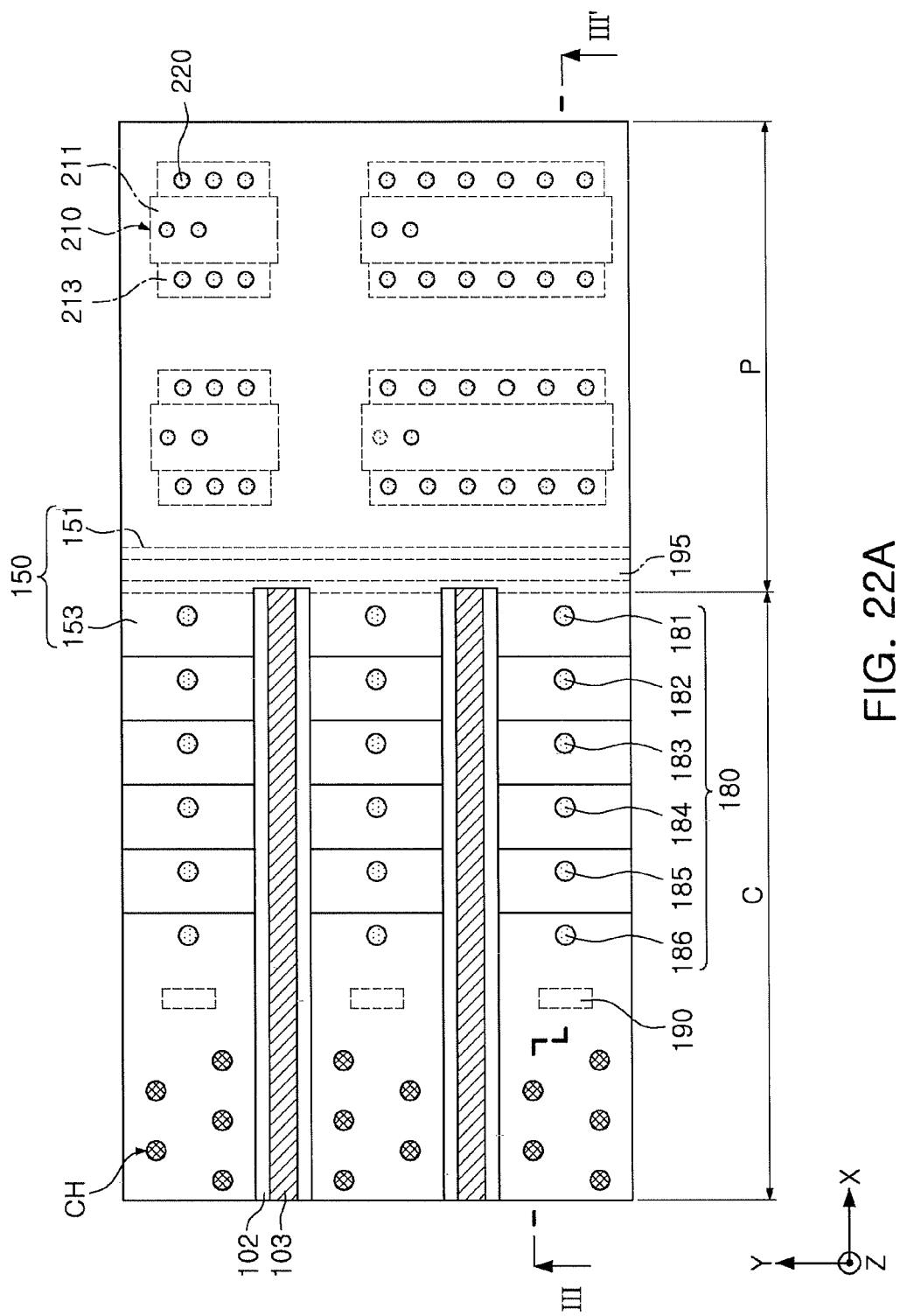
Figure 22B:
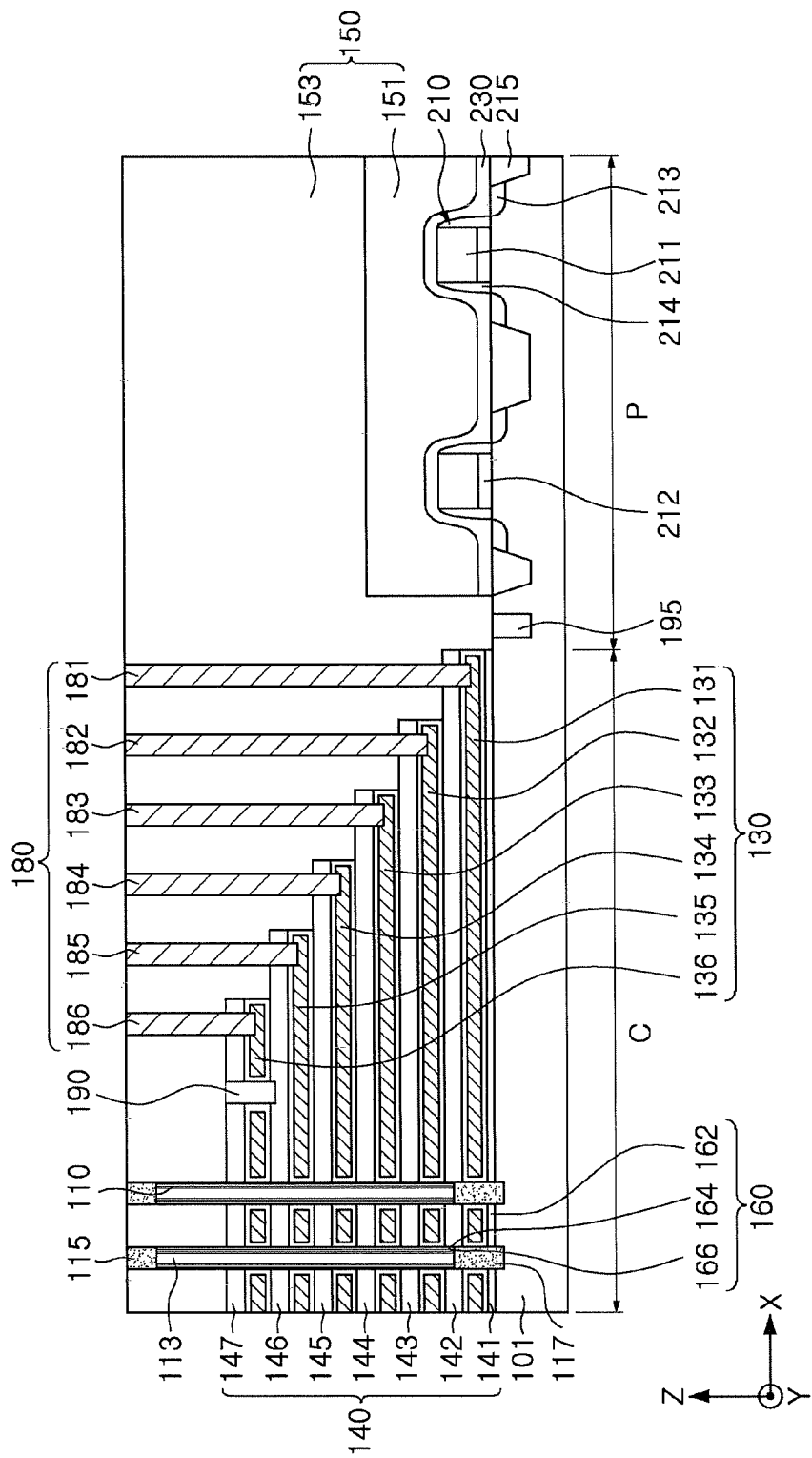

Referring to FIGS. 22A and 22B, the plurality of cell contact plugs 181 to 186 collectively represented by the cell contact plug 180 and the plurality of peripheral contact plugs 220 may be formed. The cell contact plug 180 and the peripheral contact plugs 220 may be formed in different processes or in the same process, and may include a conductive material. The cell contact plug 180 may be connected to a word line WL.

FIGS. 23A through 28B are views of methods of manufacturing the memory device 300 illustrated in FIGS. 6 through 8, respectively.

Figure 23A:
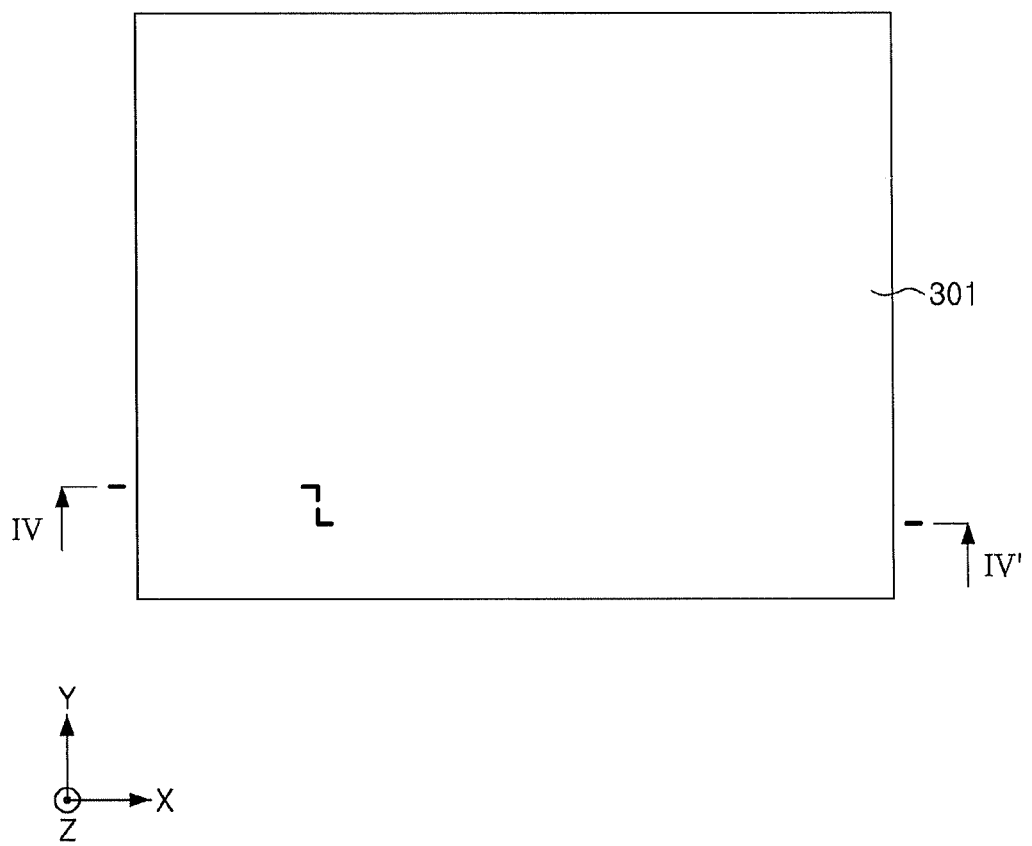
FIGS. 23A through 28B are views of a method of manufacturing the memory device illustrated in FIGS. 6 through 8, respectively.
Figure 23B:
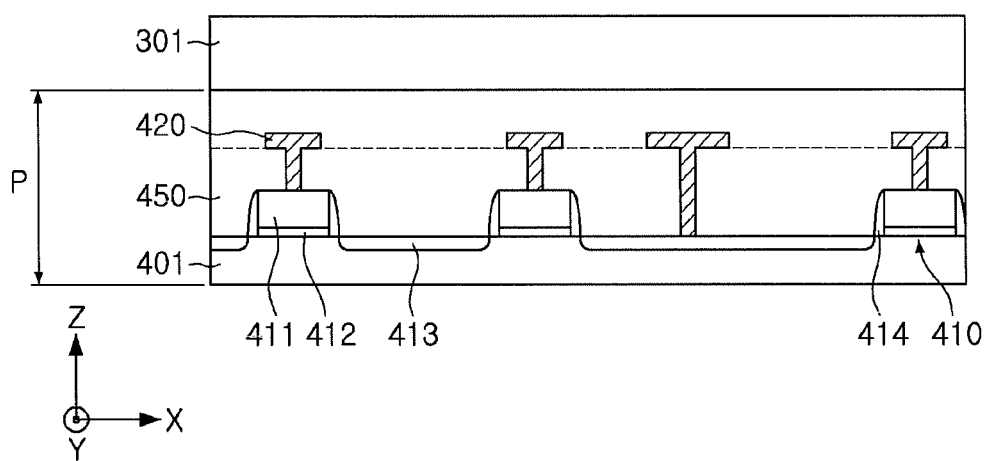

Referring to FIGS. 23A and 23B, the peripheral circuit region P may have the first substrate 301 provided thereon. Referring to FIG. 23B illustrating a cross-sectional view taken along line IV-IV' of FIG. 23A, the peripheral circuit region P may include the second substrate 401, the plurality of peripheral circuit devices 410 formed on the second substrate 401, and the second interlayer insulating layer 450. Each of the peripheral circuit devices 410 may be provided as a planar transistor, and may include the active regions 413, the planar gate electrode layer 411, and the planar gate insulating film 412. The planar gate electrode layer 411 may have the gate spacers 414 provided on the side surfaces thereof, respectively, and the active regions 413 and the planar gate electrode layer 411 may be electrically connected to the wiring patterns 420. The wiring patterns 420 may be disposed in the second interlayer insulating layer 450.

Figure 24A:
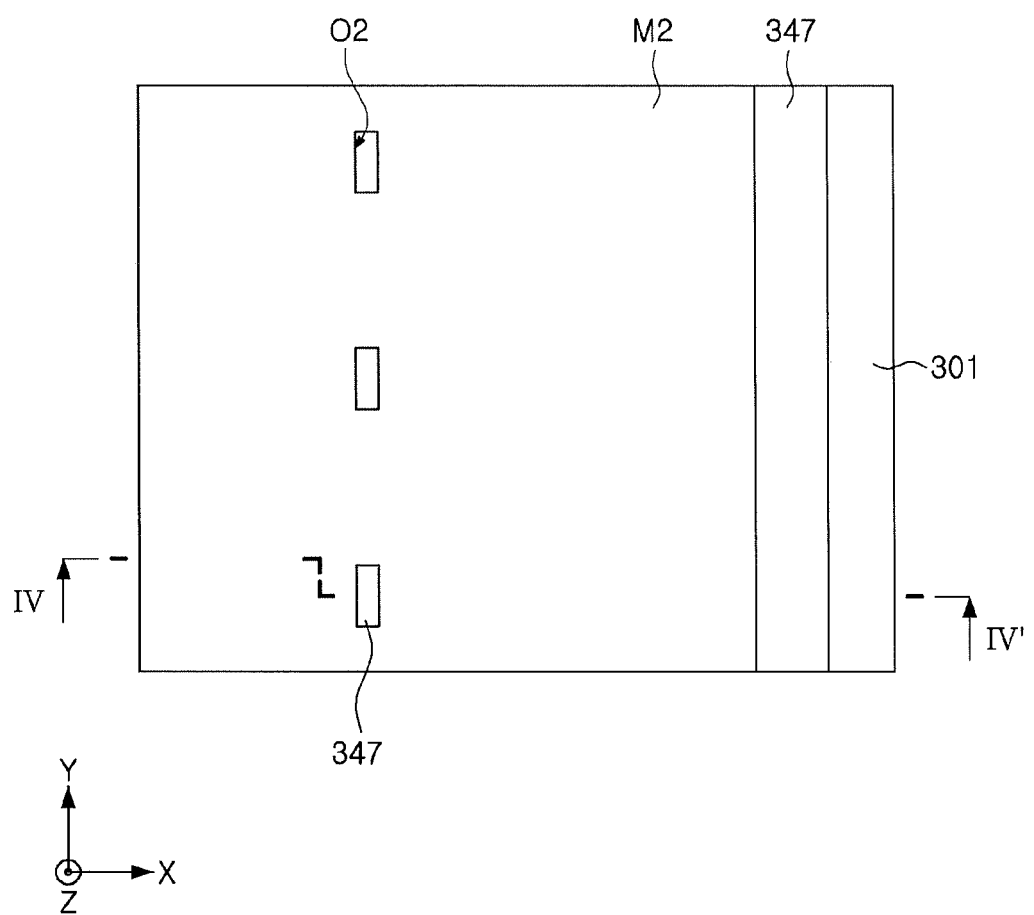
Figure 24B:
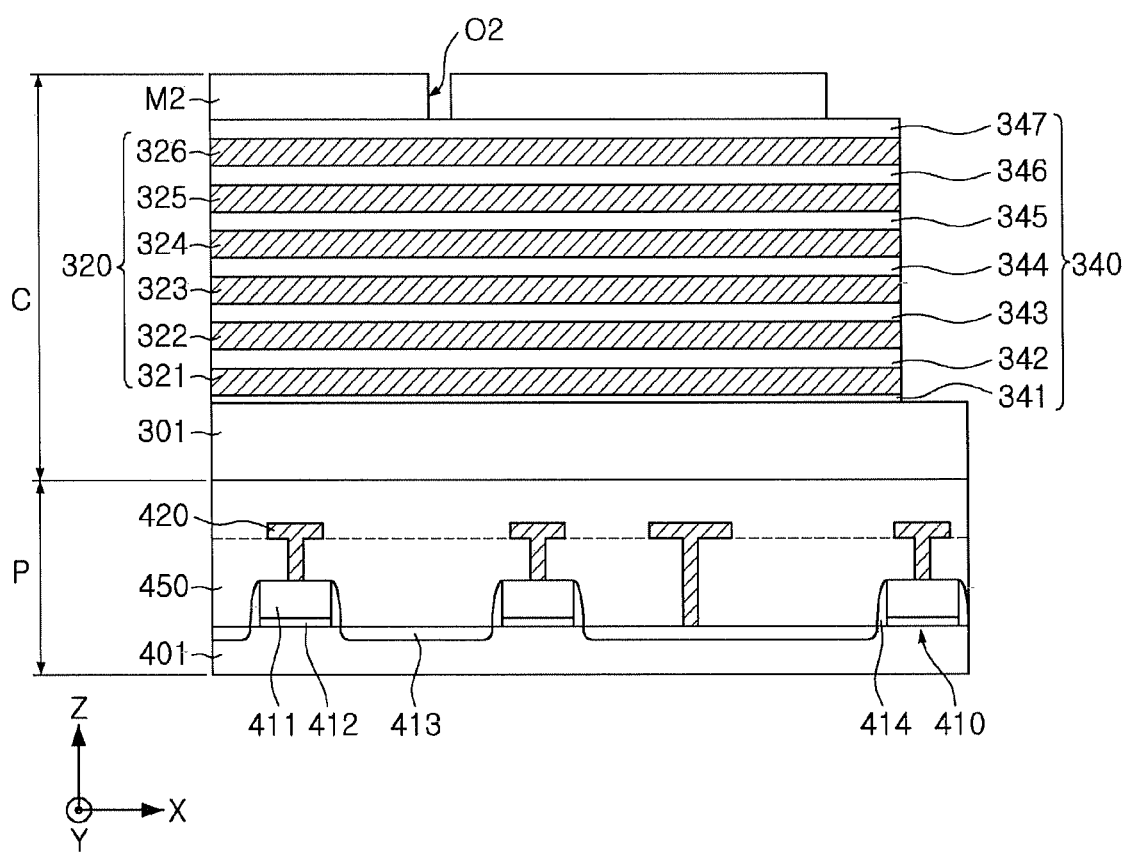

Referring to FIGS. 24A and 24B, a plurality of sacrificial layers 321 to 326 collectively represented by a sacrificial layer 320 and the plurality of insulating layers 341 to 347 collectively represented by the insulating layer 340 may be alternately stacked on the substrate 301. The sacrificial layer 320 and the insulating layer 340 may include a material having a predetermined etch selectivity ratio. According to some embodiments, the insulating layer 340 may include a silicon oxide, and the sacrificial layer 320 may include a silicon nitride. The numbers of the sacrificial layer 320 and the insulating layer 340 are not limited to those of the embodiments illustrated in FIGS. 24A and 24B, and may be changed.

A mask layer M2 may be disposed on the uppermost insulating layer 347. The mask layer M2 may allow a portion of the uppermost insulating layer 347 to be exposed. In particular, the mask layer M2 may include open regions O2 exposing portions of the uppermost insulating layer 347, respectively.

Figure 25A:
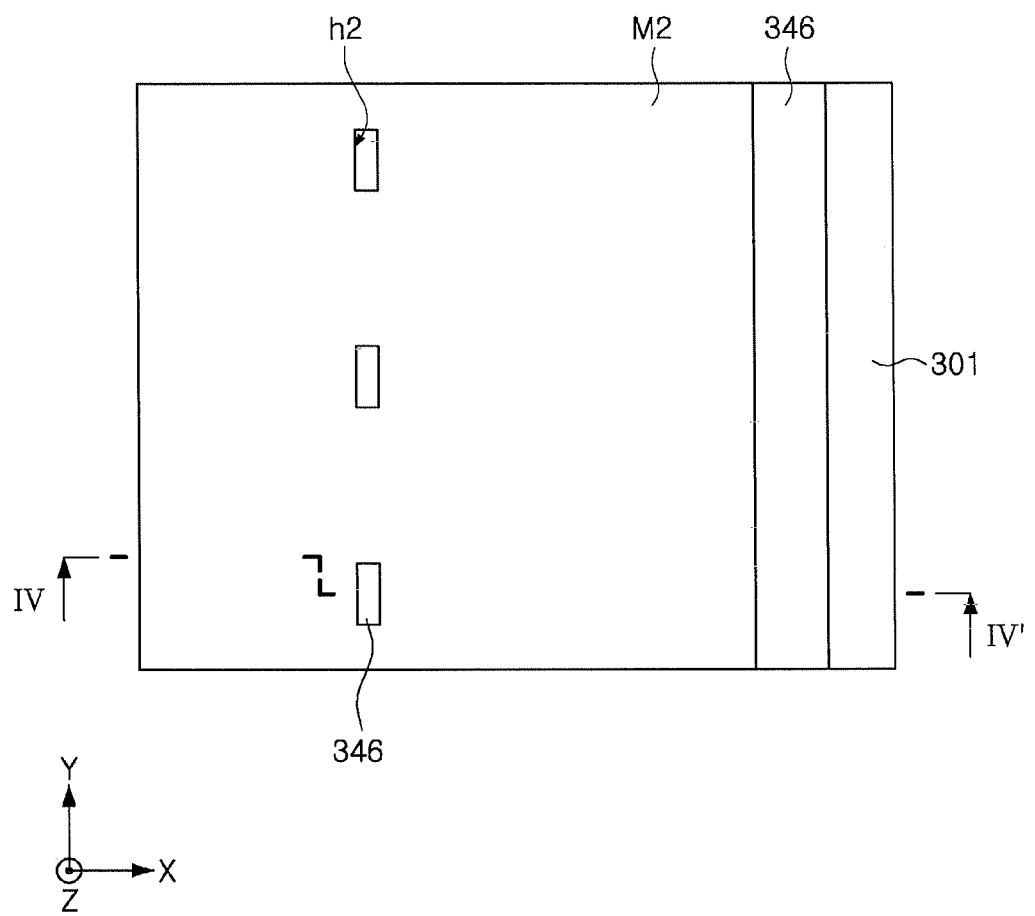
Figure 25B:
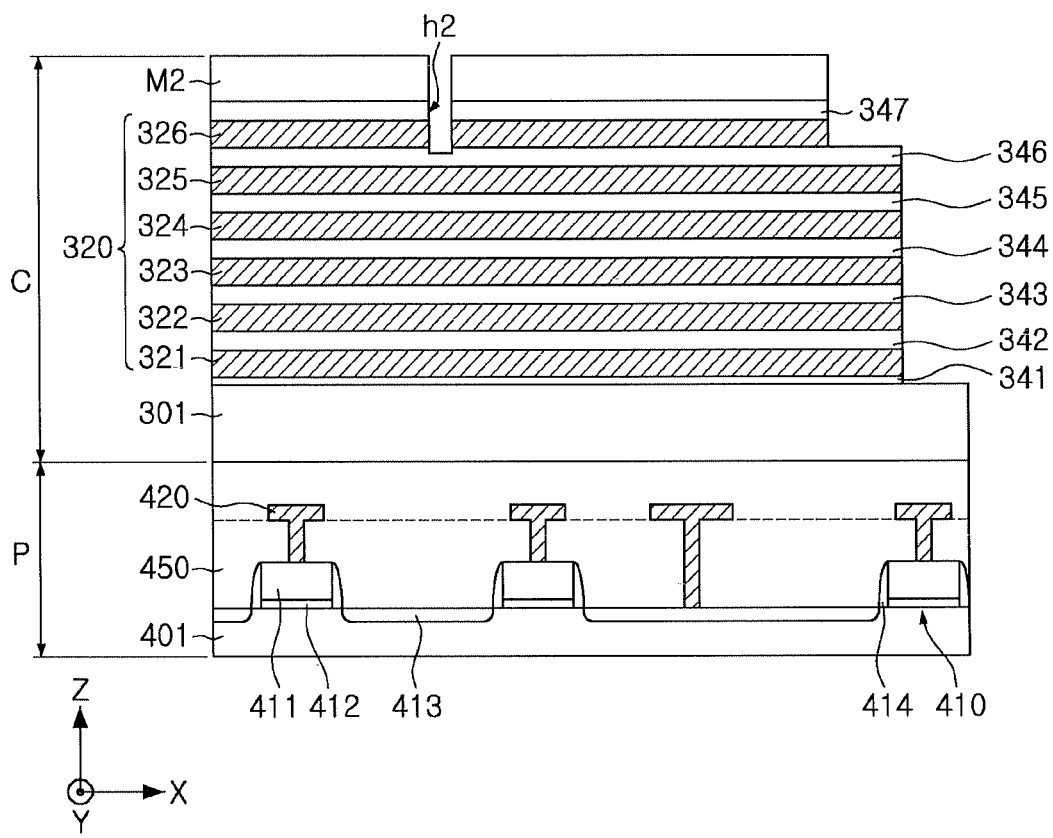

Referring to FIGS. 25A and 25B, an etching process may be performed using the mask layer M2, and portions of the uppermost insulating layer 347 and the uppermost sacrificial layer 346 may thus be removed. In particular, the portions of the uppermost insulating layer 347 and the uppermost sacrificial layer 346 removed through the open regions O2 may allow trenches h2 to be formed.

Figure 26A:
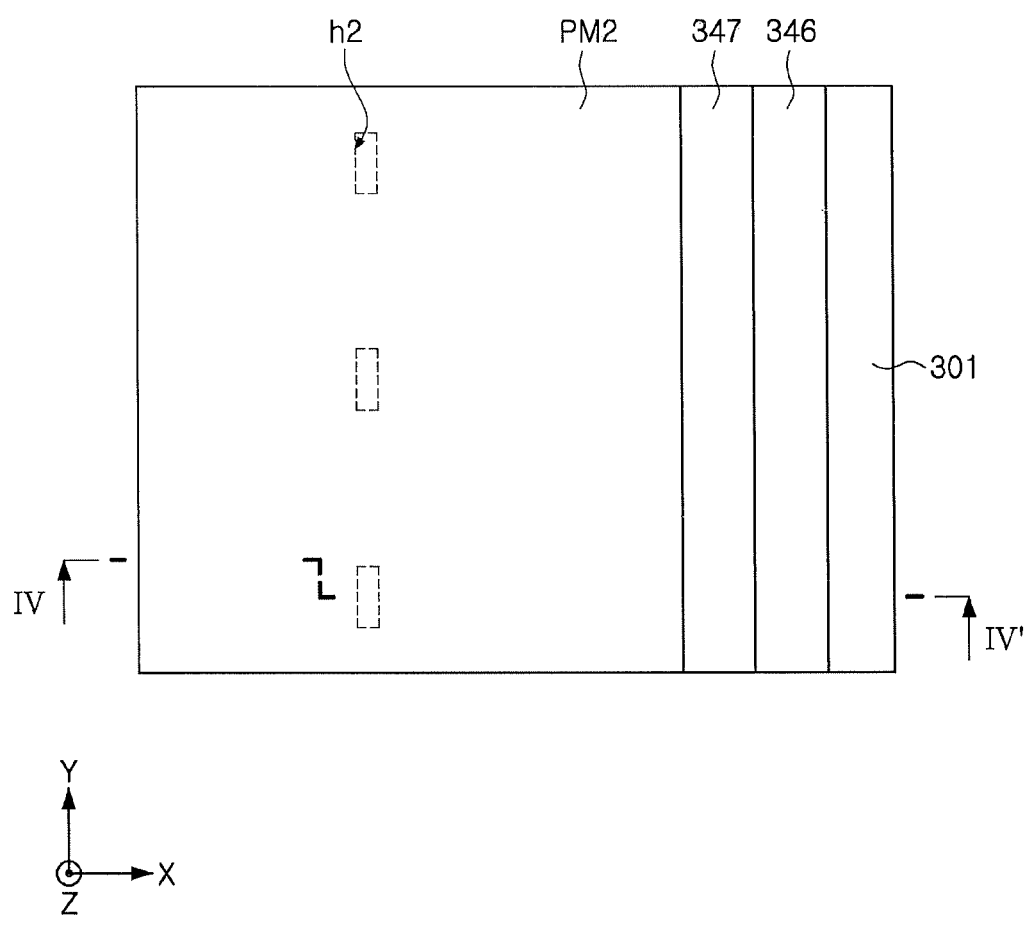
Figure 26B:
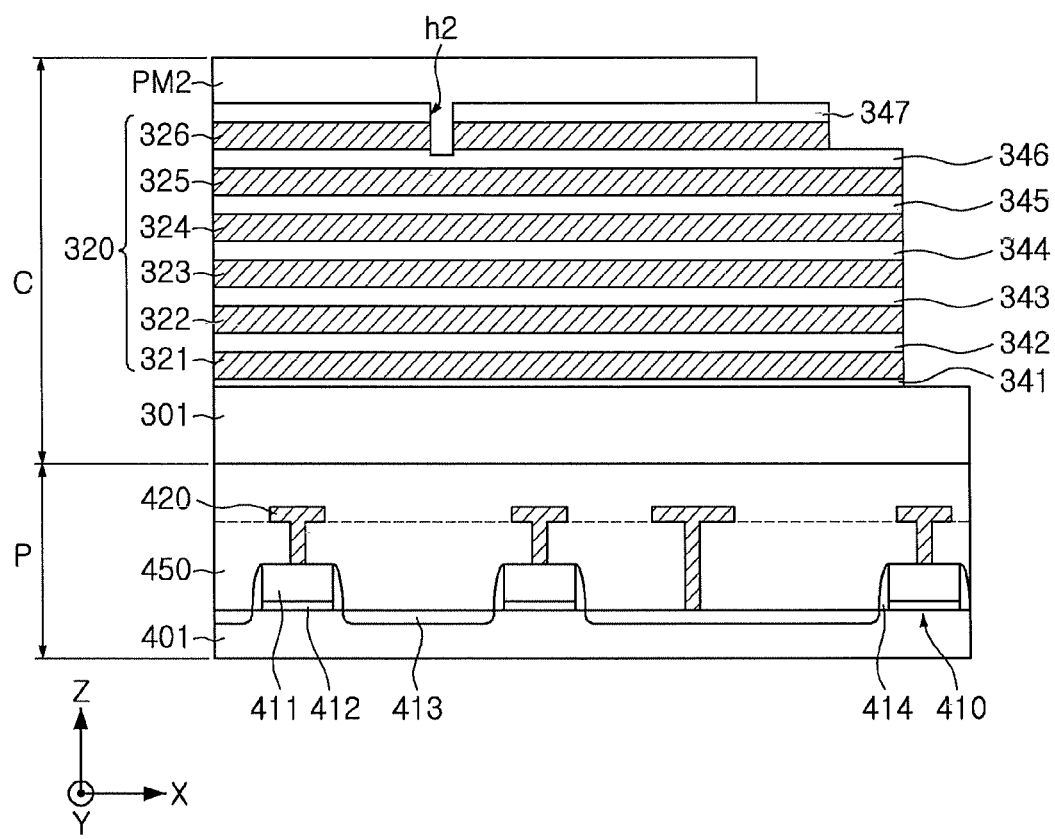

When the etching process is completed, the mask layer M2 may be removed, and a mask pattern PM2 (refer to FIGS. 26A and 26B) may be formed. As illustrated in FIGS. 26A and 26B, the mask pattern PM2 may have an area less than that of the mask layer M2. Therefore, a portion of the uppermost insulating layer 347 may be exposed by the mask pattern PM2. Meanwhile, the trenches h2 may be filled with the mask pattern PM2.

Figure 27A:
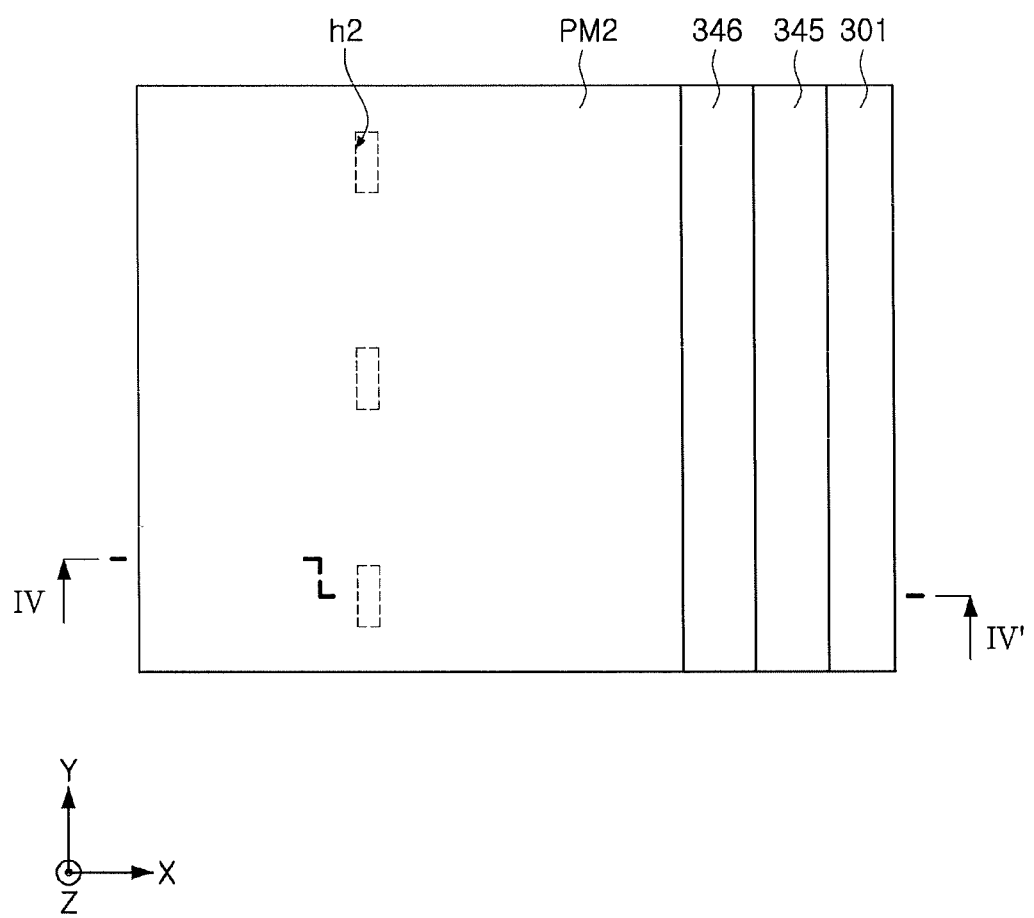
Figure 27B:
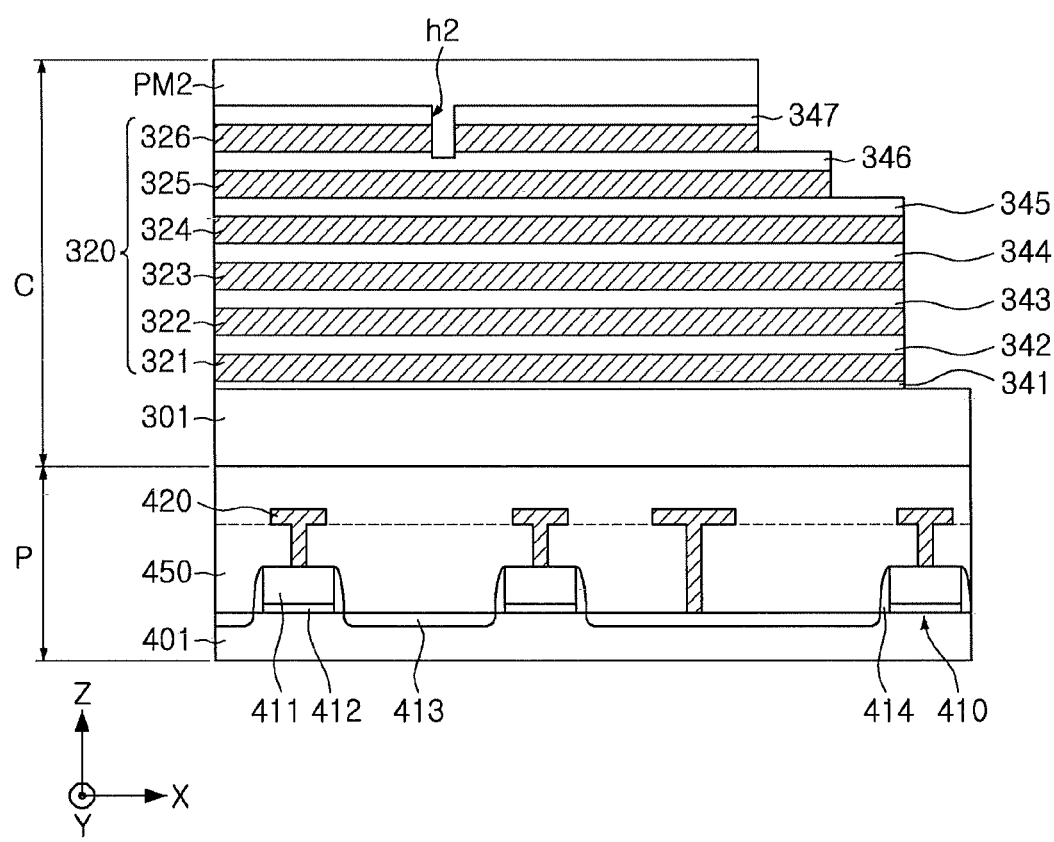
Figure 28A:
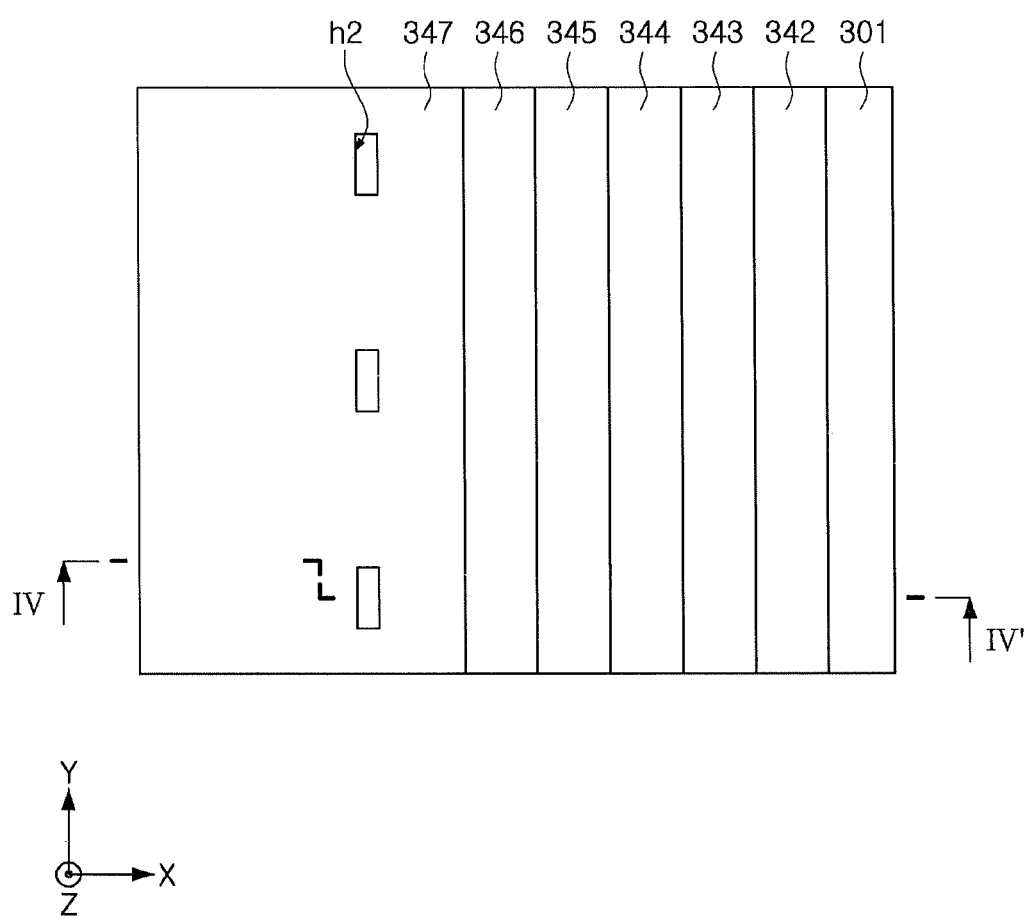
Figure 28B:
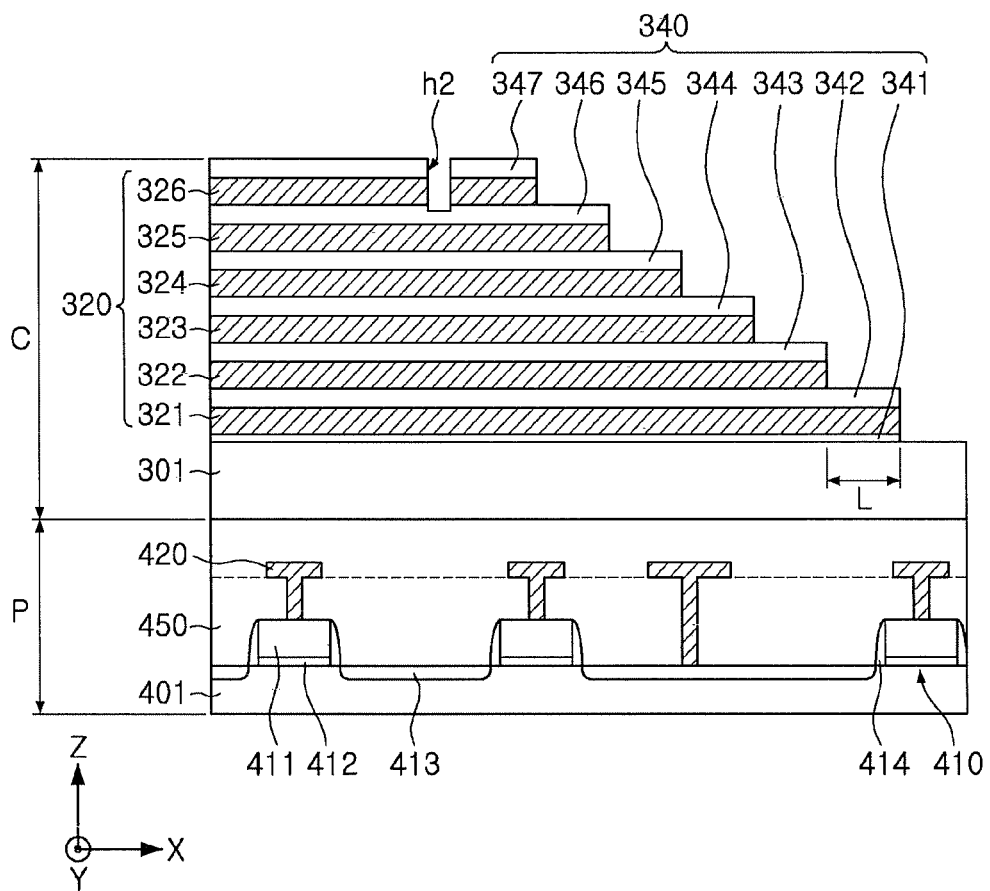

Referring to FIGS. 27A and 27B, an etching process may be performed using the mask pattern PM2, and a stepped structure may thus be formed as illustrated in FIG. 27B. As described with reference to FIGS. 18A and 18B, a process of trimming a portion of the mask pattern PM2 and etching portions of the sacrificial layer 320 and the insulating layer 340 in the portion may be repeated, and the pad regions having the stepped structures as illustrated in FIGS. 28A and 28B may thus be formed.

Lengths L of the pad regions may be determined in the process of trimming the mask pattern PM2. In more detail, the lengths L of the pad regions may correspond to lengths of the mask pattern PM2 removed in the first direction (the X-axis direction) when the portion of the mask pattern PM2 is trimmed. When the lengths L of the pad regions are not properly controlled, a defect or the like in which the cell contact plug 380 formed in a subsequent process may not be connected to the gate electrode layer 330, or two or more of the gate electrode layers 331 to 336 may be connected to one of the cell contact plugs 381 to 386 may occur.

According to some embodiments, the portion of the mask pattern PM2 may be trimmed based on the trenches h2, and the lengths L of the pad regions may thus be properly controlled. Therefore, the lengths L of the pad regions may be prevented from being excessively increased or decreased, and a short circuit defect in which two or more of the gate electrode layers 331 to 336 may be connected to one of the cell contact plugs 381 to 386, or an open defect in which the gate electrode layer 330 may not be connected to the cell contact plug 380 may be avoided.

FIGS. 29A through 31B are views of a method of manufacturing the memory device 500 illustrated in FIGS. 9 and 10, respectively.

Figure 29A:
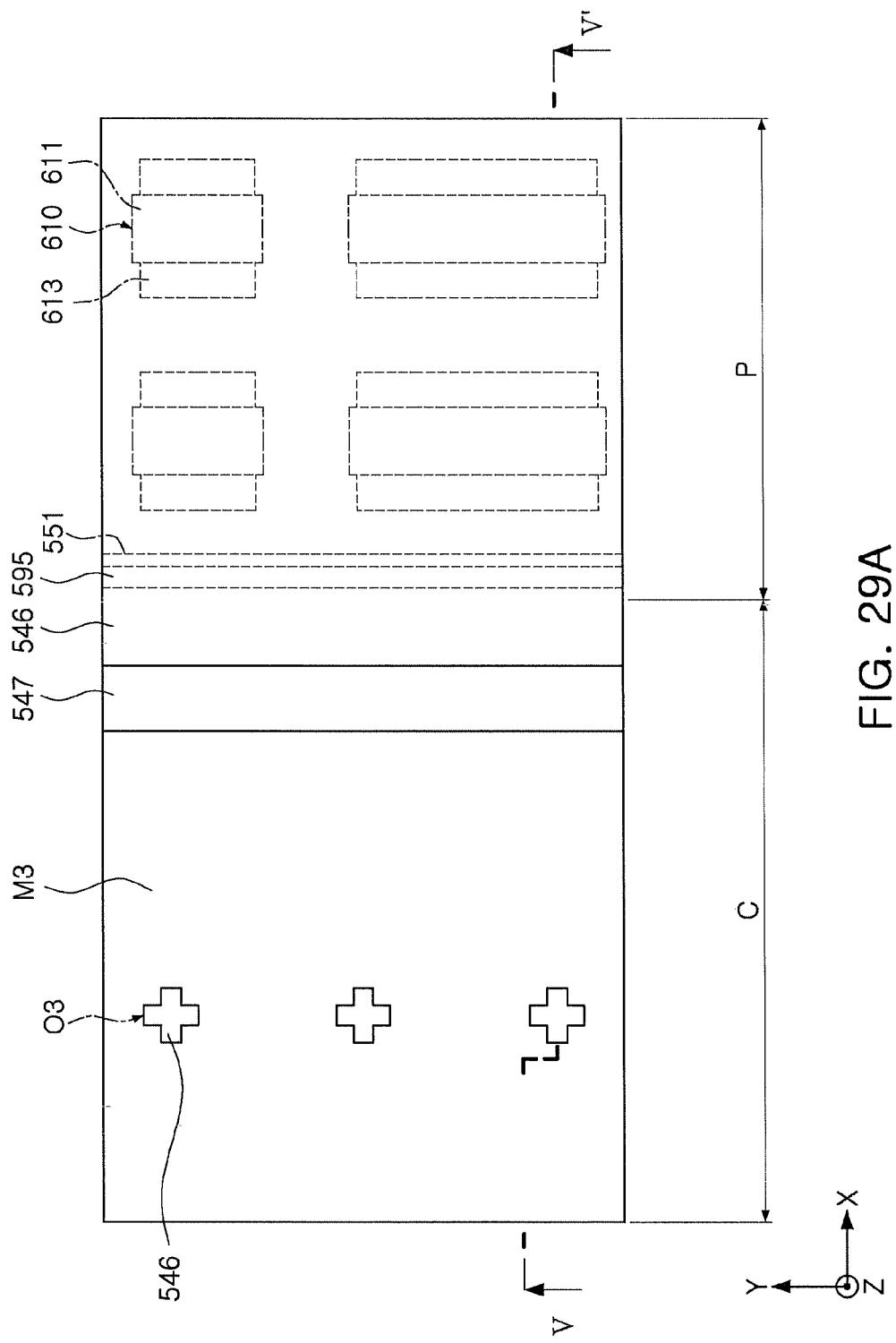
FIGS. 29A through 31B are views of a method of manufacturing the memory device illustrated in FIGS. 9 through 10, respectively.
Figure 29B:
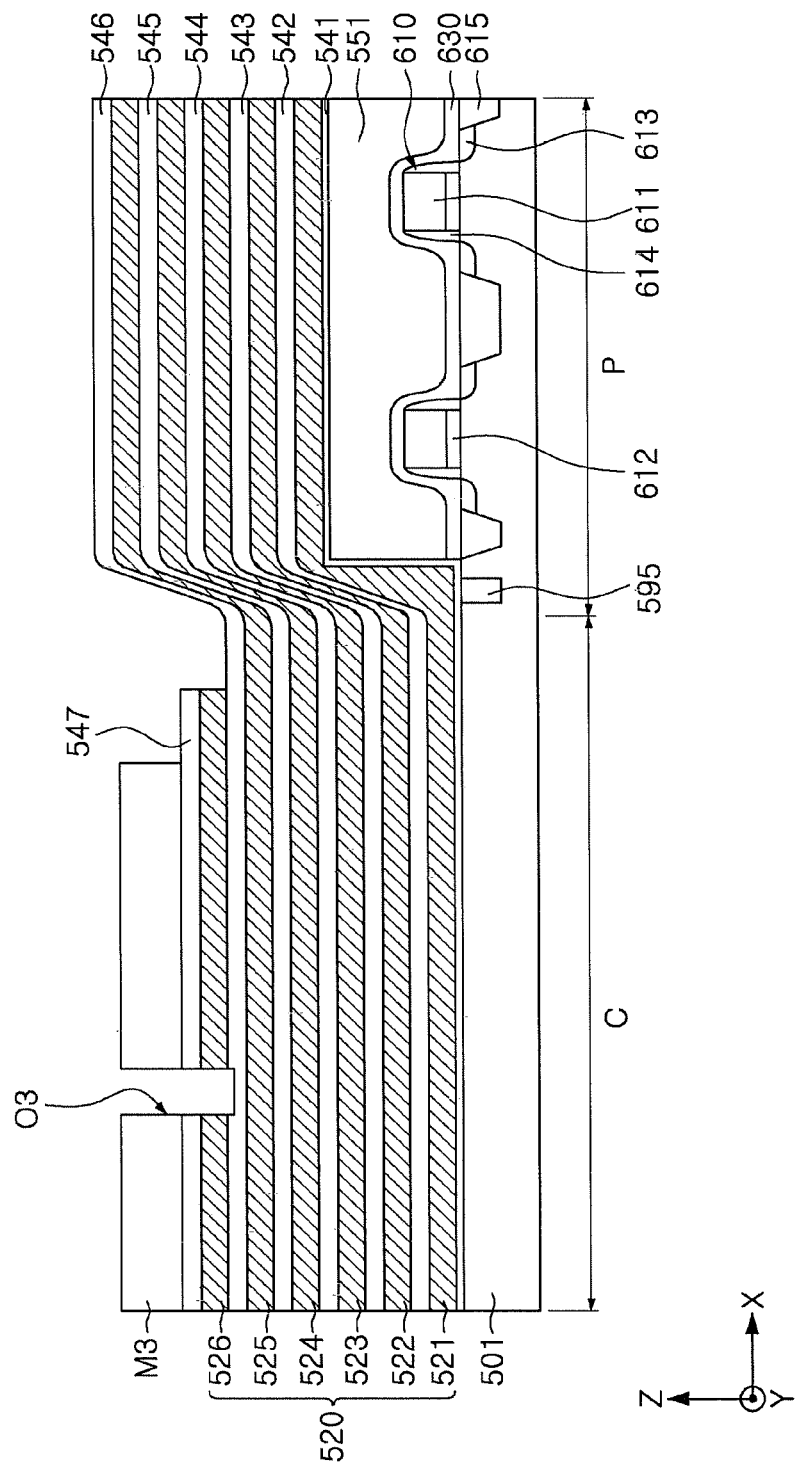

Referring to FIGS. 29A and 29B, a plurality of sacrificial layers 521 to 526 collectively represented by a sacrificial layer 520 and the plurality of insulating layers 541 to 547 collectively represented by the insulating layer 540 may be alternately stacked on the substrate 501. FIG. 29B is a cross-sectional view taken along line V-V' of the plan view of FIG. 29A. The peripheral circuit region P may include the plurality of peripheral circuit devices 610 and the first interlayer insulating layer 551 covering the peripheral circuit devices 610.

Each of the peripheral circuit devices 610 may be provided as a planar transistor, and may include the active regions 613, the planar gate electrode layer 612, and the gate spacers 614. The active regions 613 may have the device isolation film 615 disposed therebetween, and each of the peripheral circuit devices 610 may have the cover layer 630 provided thereon. According to some embodiments, the cover layer 630 may include a material having a predetermined etch selectivity ratio with the first interlayer insulating layer 551. The cover layer 630 may prevent the active regions 613 from being excessively recessed when the peripheral contact plugs 620 are formed.

According to some embodiments illustrated in FIGS. 29A and 29B, the sacrificial layer 520 and the insulating layer 540 may have the same shape as that of the example embodiments illustrated in FIGS. 16A and 16B. According to some embodiments illustrated in FIGS. 16A and 16B, the mask pattern PM1 for trimming may be formed on the uppermost insulating layer 147, but according to the example embodiments illustrated in FIGS. 29A and 29B, a mask layer M3 for etching may be formed on the uppermost insulating layer 547.

The mask layer M3 may have open regions O3. The open regions O3 may have the same shape as those of portions from which the uppermost sacrificial layer 526 and the uppermost insulating layer 547 are removed. The mask layer M3 may also allow a portion of the uppermost insulating layer 547 to be exposed. In more detail, the mask layer M3 may allow the portion of the uppermost insulating layer 547 to be exposed, and the open regions O3 may allow portions of the second insulating layer 546 to be exposed.

Figure 30A:
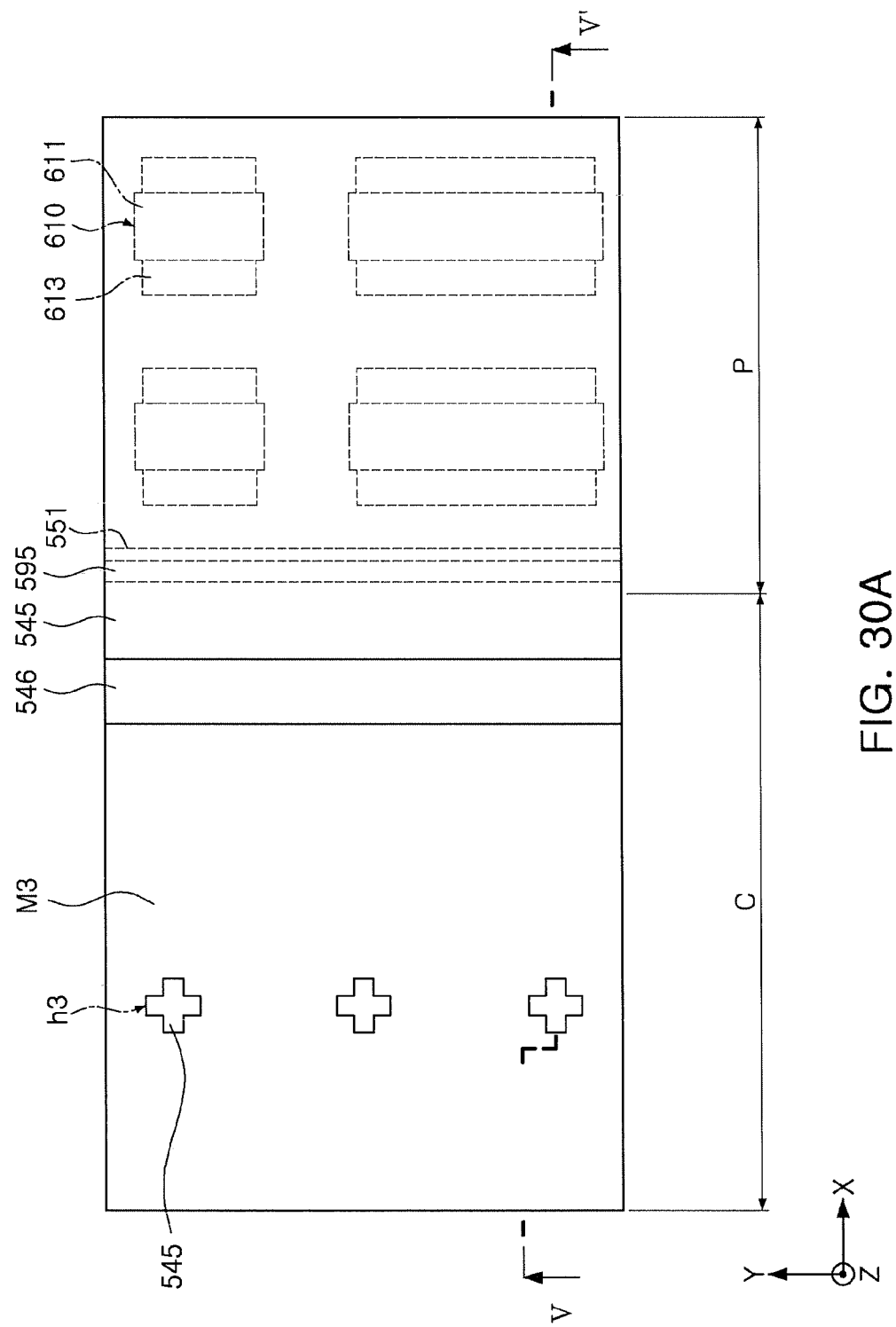
Figure 30B:
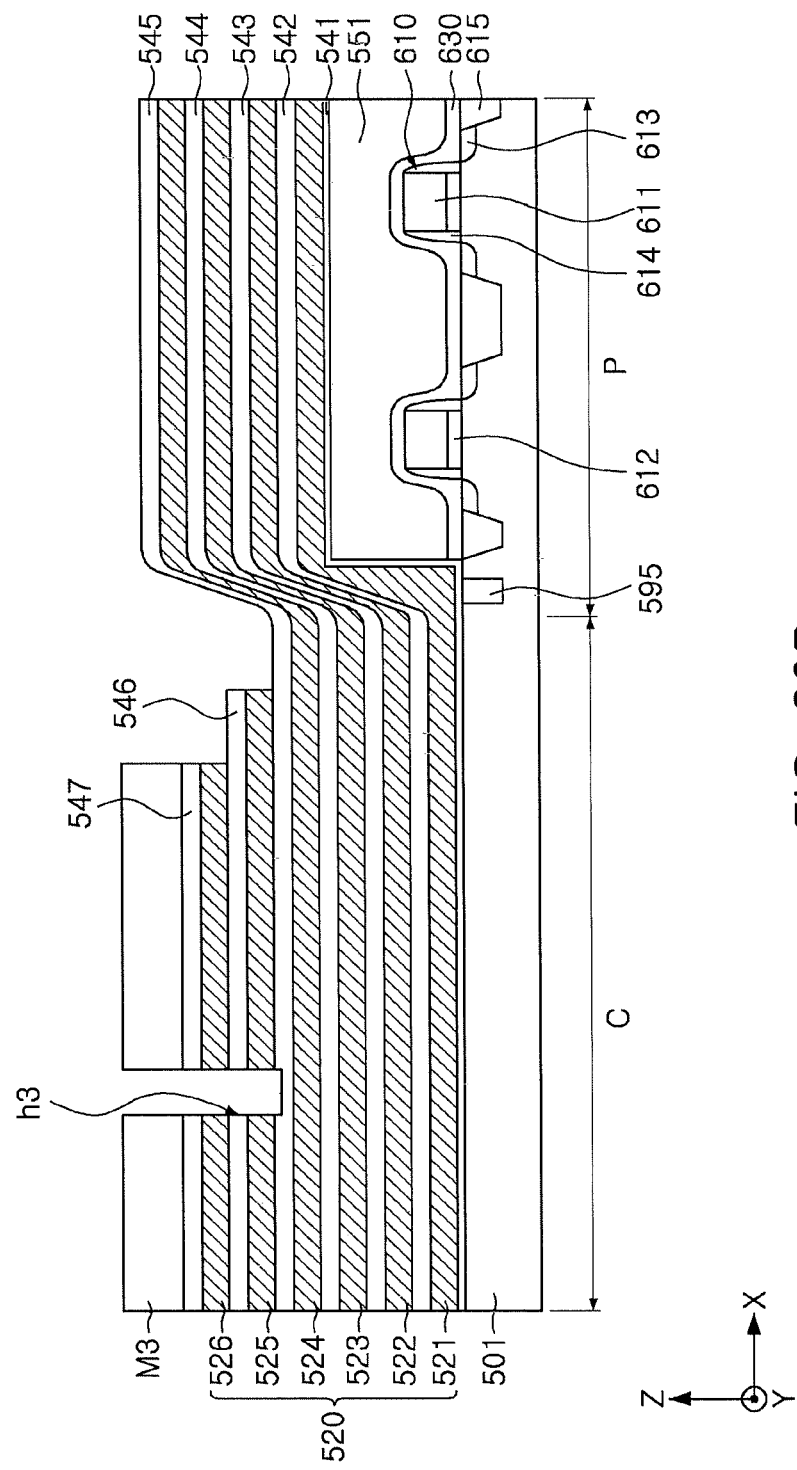
Figure 31A:
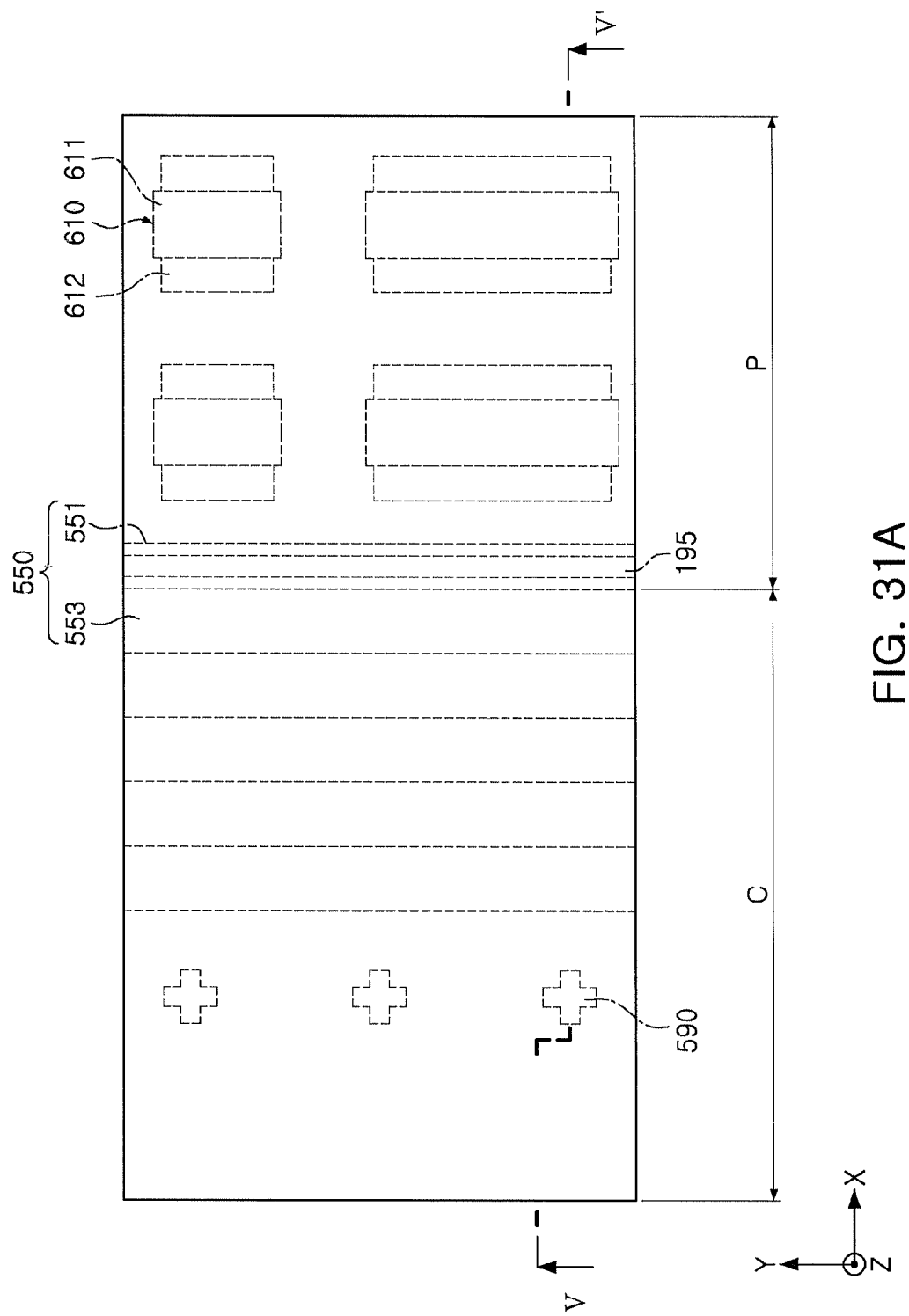
Figure 31B:
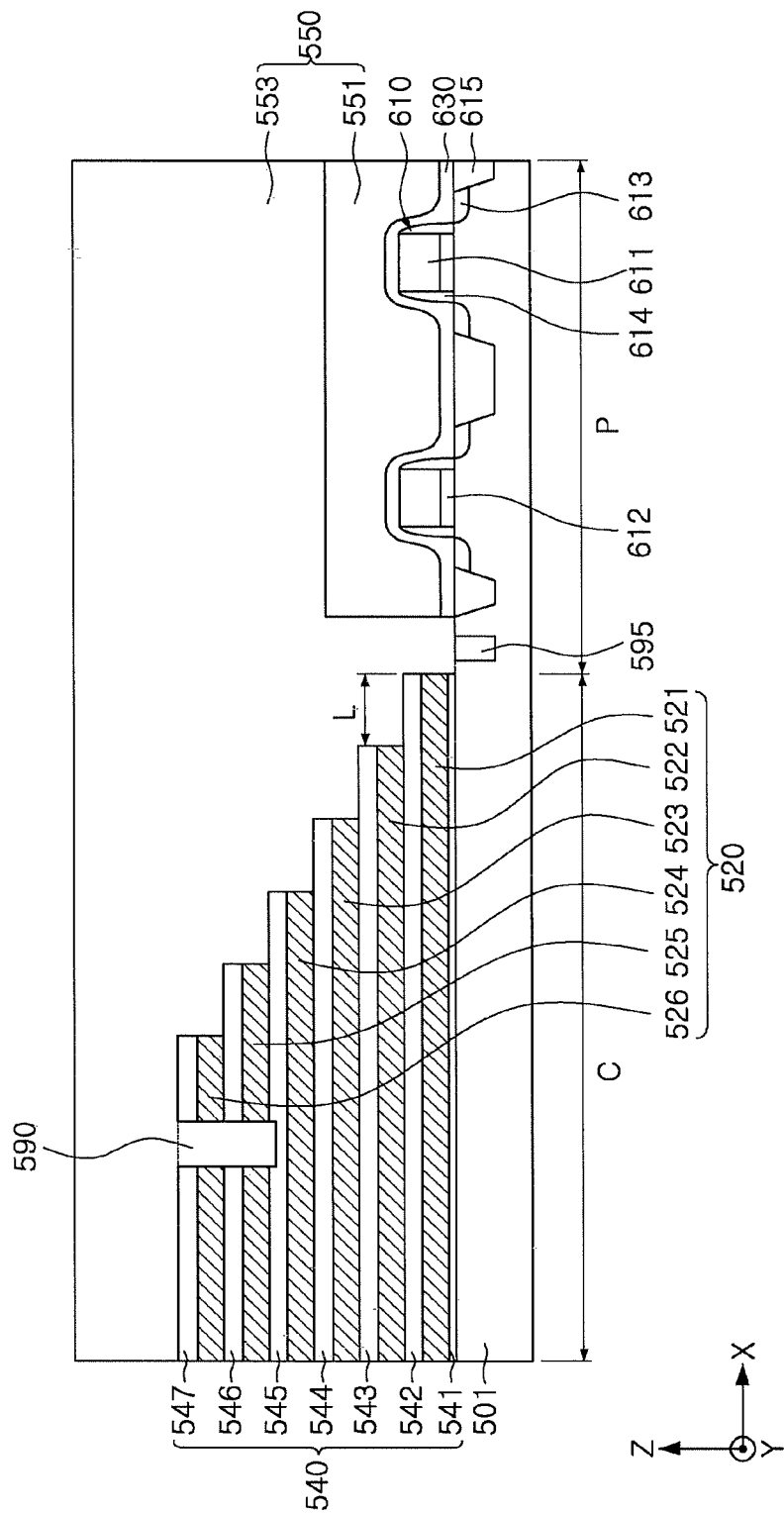

Referring to FIGS. 30A and 30B, an etching process may be performed using the mask layer M3. Trenches h3 may allow portions of the second insulating layer 546 and the second sacrificial layer 525 to be removed. Meanwhile, an etching process performed in the vicinity of the mask layer M3 may allow a stepped structure as illustrated in FIG. 30B to be formed. After the formation of the stepped structure, the mask layer M3 may be removed, a mask pattern that can be trimmed may be formed, and similar processes as described with reference to FIGS. 16A through 19B may be performed so that the pad regions as illustrated in FIGS. 31A and 31B may be formed.

According to some embodiments illustrated with reference to FIGS. 29A through 31B, the trenches h3 may have relatively greater thicknesses than those of the trenches h1 and h2 according to some embodiments described above. Therefore, as illustrated in FIG. 30B, the vertical insulating layer 590 may also have a greater thickness than those of the vertical insulating layers 190 and 390 according to the example embodiments described above. According to an example embodiment, the vertical insulating layer 590 may have a thickness allowing two or more sacrificial layers 525 and 526 to be penetrated.

According to some embodiments illustrated in FIGS. 29A through 31B, the trenches h3 may be separately formed by two processes. In more detail, the sacrificial layer 520 and the insulating layer 540 may be stacked on the substrate 501, and the structure as illustrated in FIGS. 29A and 29B may be formed using an etching process using the mask layer M3 for opening regions corresponding to the trenches h3. After the formation of the structure, as illustrated in FIGS. 29A through 30B, the mask layer M3 having the open regions O3 may be repeatedly formed, and the etching process may be performed. The thicknesses of the trenches h3 formed by the two processes as described above may be substantially the same as a sum of thicknesses of two sacrificial layers 525 and 526 and two insulating layers 546 and 547 together etched in the process of forming the trenches h3.

Figure 32:
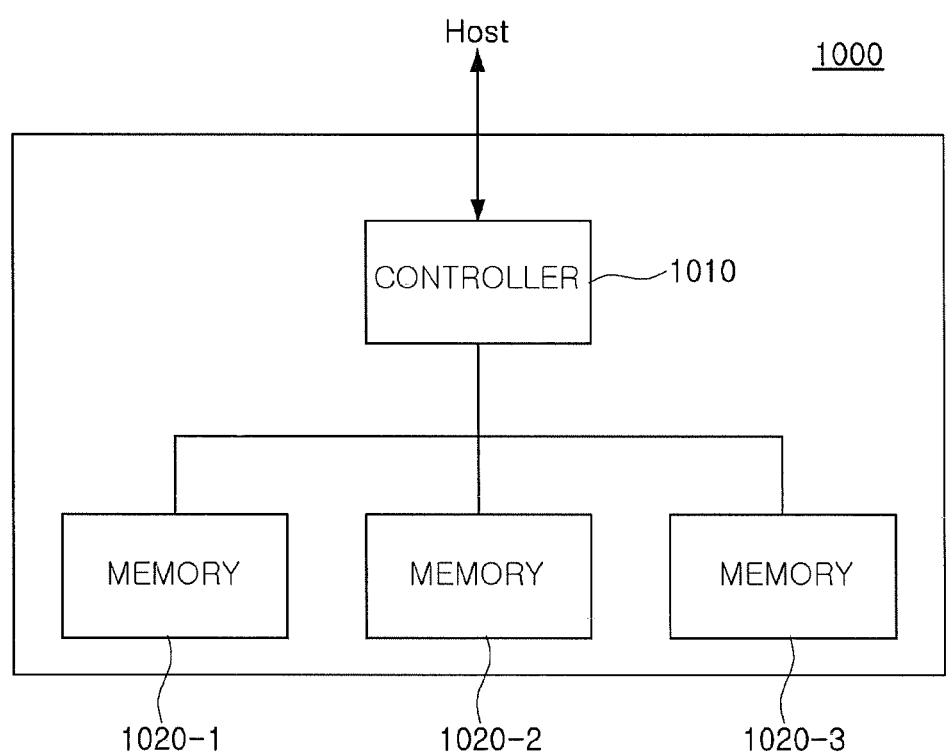
FIGS. 32 and 33 are block diagrams of an electronic device including a memory device according to some embodiments of the present inventive concept, respectively.
Figure 33:
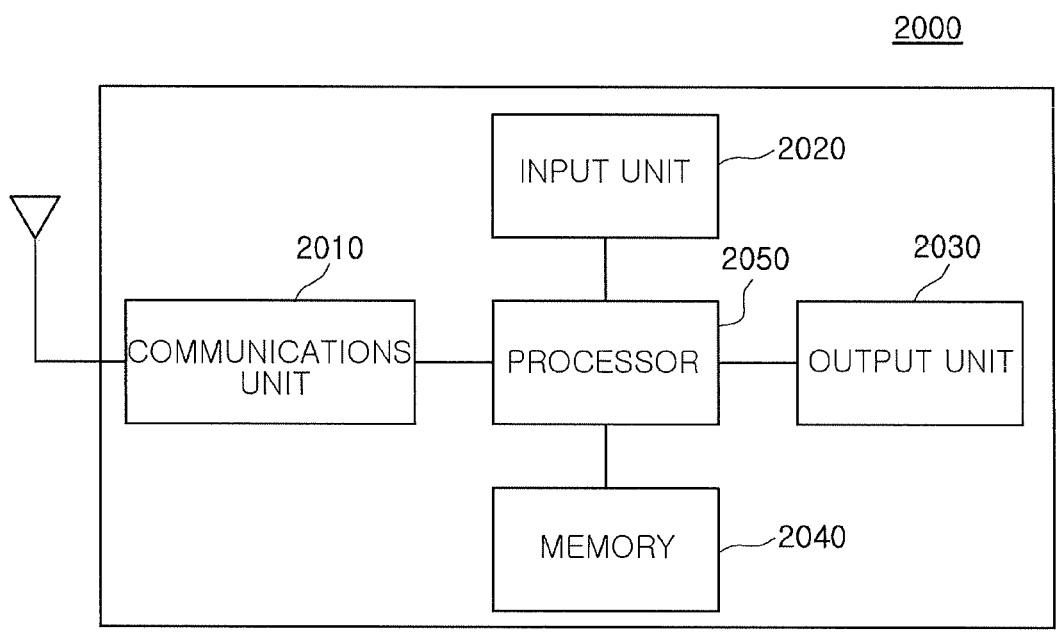

FIGS. 32 and 33 are block diagrams of an electronic device including a memory device according to some embodiments of the present inventive concept, respectively.

Referring to FIG. 32, a storage device 1000 according to some embodiments may include a controller 1010 communicating with a host and memories 1020-1, 1020-2, and 1020-3 storing data. The respective memories 1020-1, 1020-2, and 1020-3 may include the memory devices 100, 300, and 500 according to various example embodiments described above.

The host communicating with the controller 1010 may be various types of electronic devices equipped with the storage device 1000, such as a smartphone, a digital camera, a desktop PC, a laptop PC, a portable media player, and the like. The controller 1010 may receive a data write or read request transmitted from the host to generate a command (CMD) for storing or retrieving data to/from the memories 1020-1, 1020-2, and 1020-3.

As illustrated in FIG. 32, at least one of the memories 1020-1, 1020-2, and 1020-3 may be connected to the controller 1010 in parallel within the storage device 1000. By connecting the plurality of memories 1020-1, 1020-2, and 1020-3 to the controller 1010 in parallel, the storage device 1000 having a large capacity may be implemented, such as a solid state drive (SSD).

Referring to FIG. 33, an electronic device 2000 according to some embodiments may include a communications unit 2010, an input unit 2020, an output unit 2030, a memory 2040, and a processor 2050.

The communication unit 2010 may include a wired/wireless communications module such as a wireless Internet module, a local communications module, a global positioning system (GPS) module, and/or a mobile communications module. The wired/wireless communications module included in the communications unit 2010 may be connected to an external communications network based on various communications standards to transmit and receive data.

The input unit 2020 may include a mechanical switch, a touchscreen, a voice recognition module, and the like, as a module provided for a user to control operations of the electronic device 2000. In addition, the input unit 2020 may also include a mouse or a finger mouse device operating based on a trackball or a laser pointer, and may further include various sensor modules which enable a user to input data.

The output unit 2030 may output information processed by the electronic device 2000 in an audio and/or video format, and the memory 2040 may store a program for processing or control of the processor 2050, or data. The memory 2040 may include at least one of the memory devices 100, 300, and 500 according to various embodiments described above, and the processor 2050 may send a command to the memory 2040 depending on required operations to store data in or retrieve data from the memory 2040.

The memory 2040 may be embedded in the electronic device 2000, or may communicate with the processor 2050 through an additional interface. When the memory 2040 communicates with the processor 2050 through the additional interface, the processor 2050 may store data in or retrieve data from the memory 2040 through various interface standards such as secure digital (SD), secure digital high capacity (SDHC), secure digital extended capacity (SDXC), micro SD, universal serial bus (USB), etc.

The processor 2050 may control operations of each component included in the electronic device 2000. The processor 2050 may perform control and processing associated with a voice call, a video call, data communications, and the like, or may conduct control and processing for multimedia reproduction and management. The processor 2050 may also process an input entered by a user through the input unit 2020 and output a result thereof through the output unit 2030. Furthermore, the processor 2050 may store or retrieve data required to control operations of the electronic device 2000 to/from the memory 2040 as described above.

As set forth above, according to some embodiments of the present inventive concept, a memory device may have a trench opening formed therein before forming a pad region connected to a contact plug, and may measure a location of the pad region based on the trench opening during a process of forming the pad region. Resultantly, a short circuit or the like between gate electrode layers that may occur in a process of forming the contact plug may be solved, thereby providing a memory device having high reliability. The trench opening may be filled with an insulating material when an interlayer insulating layer is formed, thereby remaining in the memory device as a vertical insulating layer.

While example embodiments have been shown and described above, it will be apparent to those skilled in the art that modifications and variations could be made without departing from the scope of the present inventive concept as defined by the appended claims.

What is claimed is:

1. A memory device, comprising:
a substrate including a first region and a second region adjacent to the first region;
a plurality of gate electrode layers and a plurality of insulating layers stacked alternately on the substrate;
a plurality of channel regions penetrating the plurality of gate electrode layers and the plurality of insulating layers in the first region;
a plurality of cell contact plugs in the second region, each of the plurality of cell contact plugs being connected to at least one of the plurality of gate electrode layers; and
a vertical insulating layer disposed adjacent to a boundary between the first region and the second region and penetrating an uppermost gate electrode layer among the plurality of gate electrode layers.

2. The memory device of claim 1, wherein the vertical insulating layer is extended from an insulating layer under the uppermost gate electrode layer.

3. The memory device of claim 1, wherein the first region and the second region are adjacent in a first direction parallel to an upper surface of the substrate, and
the vertical insulating layer is in contact with the uppermost gate electrode layer in the first direction.

4. The memory device of claim 1, further comprising:
an interlayer insulating layer disposed on the plurality of gate electrode layers.

5. The memory device of claim 4, wherein an upper surface of the vertical insulating layer is in contact with the interlayer insulating layer and a lower surface of the vertical insulating layer is in contact with an insulating layer under the uppermost gate electrode layer.

6. The memory device of claim 4, wherein the interlayer insulating layer and the vertical insulating layer comprise the same material.

7. The memory device of claim 6, wherein the interlayer insulating layer and the vertical insulating layer comprise silicon oxide.

8. The memory device of claim 1, further comprising:
a plurality of isolation insulating layers dividing the plurality of gate electrode layers and the plurality of insulating layers into a plurality of unit regions.

9. The memory device of claim 8, wherein a width of each of the plurality of unit regions is greater than a width of the vertical insulating layer.

10. The memory device of claim 8, wherein the vertical insulating layer comprises a plurality of vertical insulating layers, and each of the plurality of unit regions comprises at least one of the plurality of vertical insulating layers.

11. The memory device of claim 1, further comprising:
a gate insulating film disposed between the plurality of gate electrode layers and the plurality of channel regions,
the gate insulating film includes a plurality of layers.

12. The memory device of claim 11, wherein at least one of the plurality of layers included in the gate insulating film is in contact with the vertical insulating layer.

13. The memory device of claim 12, wherein side surfaces of the vertical insulating layer are in contact with the at least one of the plurality of layers.

14. The memory device of claim 1, further comprising:
a dummy trench disposed adjacent to an end of the second region and including an insulating material.

15. The memory device of claim 14, wherein the dummy trench is extended in a second direction parallel to an upper surface of the substrate, and
a width of the dummy trench is greater than a width of the vertical insulating layer in the second direction.

16. A memory device, comprising:
a plurality of channel regions extending in a direction that is perpendicular to an upper surface of a substrate;
a plurality of gate electrode layers and a plurality of insulating layers stacked on the substrate to be adjacent at least a portion of the plurality of channel regions;
a plurality of cell contact plugs extending in the direction and being connected to the plurality of gate electrode layers; and
a vertical insulating layer being contact with an uppermost insulating layer among the plurality of insulating layers between the plurality of channel regions and the plurality of cell contact plugs, and disposed at the same level with an uppermost gate electrode layer among the plurality of gate electrode layers.

17. The memory device of claim 16, further comprising:
a plurality of isolation insulating layers dividing the plurality of gate electrode layers and the plurality of insulating layers into a plurality of unit regions,
wherein the vertical insulating layer extends in a first direction parallel to the upper surface of the substrate, between a pair of the plurality of isolation insulating layers closest to each other in the first direction, among the plurality of isolation insulating layers.

* * * * *